United States Patent
Yeon et al.

(10) Patent No.: US 11,756,967 B2
(45) Date of Patent: Sep. 12, 2023

(54) DISPLAY DEVICE HAVING ETCH STOPPERS WITH THROUGH HOLES

(71) Applicant: Samsung Display Co., LTD., Yongin-si (KR)

(72) Inventors: Eun Kyung Yeon, Suwon-si (KR); Jung Hun Noh, Yongin-si (KR); Yi Joon Ahn, Seoul (KR); Jae Been Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 264 days.

(21) Appl. No.: 17/060,630

(22) Filed: Oct. 1, 2020

(65) Prior Publication Data

US 2021/0296373 A1 Sep. 23, 2021

(30) Foreign Application Priority Data

Mar. 18, 2020 (KR) ........................ 10-2020-0033223

(51) Int. Cl.
*H01L 27/12* (2006.01)
*H01L 25/16* (2023.01)
*H10K 59/131* (2023.01)

(52) U.S. Cl.
CPC ........ *H01L 27/1262* (2013.01); *H01L 25/167* (2013.01); *H10K 59/131* (2023.02)

(58) Field of Classification Search
CPC ............... H01L 27/1262; H01L 25/167; H01L 27/3276; H01L 27/1218; H01L 27/124;
(Continued)

(56) References Cited

U.S. PATENT DOCUMENTS 10,454,048 B2 10/2019 Jeong
2017/0141091 A1 5/2017 Bibl et al.
(Continued)

FOREIGN PATENT DOCUMENTS

CN 109638061 4/2019
CN 110911424 A * 3/2020 ......... H01L 27/1218
(Continued)

*Primary Examiner* — Nduka E Ojeh
*Assistant Examiner* — Laura M Dykes
(74) *Attorney, Agent, or Firm* — KILE PARK REED & HOUTTEMAN PLLC

(57) ABSTRACT

A display device includes a first substrate having a display area and a non-display area adjacent to the display area, the first substrate including a substrate through-hole penetrating the first substrate in a thickness direction, an etching stopper disposed on a first surface of the first substrate, the etching stopper including a stopper through-hole that overlaps the substrate through-hole and penetrates the etching stopper in the thickness direction, a data line disposed on the etching stopper, a substrate connection electrode that fills the substrate through-hole and the stopper through-hole, the substrate connection electrode being disposed in the display area and electrically connected to the data line, and a first pad disposed on a second surface of the first substrate opposite to the first surface and overlapping the substrate connection electrode. The first pad is electrically connected to the substrate connection electrode.

14 Claims, 49 Drawing Sheets

(58) Field of Classification Search
CPC ... H01L 25/0753; H01L 33/62; H10K 59/131; H10K 59/123; H10K 59/1315; H10K 59/122; H10K 59/12; H10K 2102/302; H10K 71/00
USPC .......................................................... 257/40
See application file for complete search history.

(56) References Cited

U.S. PATENT DOCUMENTS

| | | | | |
|---|---|---|---|---|
| 2020/0286921 A1* | 9/2020 | Liu | ...................... | H01L 23/5226 |
| 2020/0312886 A1* | 10/2020 | Yuan | ........................ | H01L 51/56 |
| 2021/0035874 A1* | 2/2021 | Kudo | .................... | H01L 23/145 |
| 2021/0159303 A1* | 5/2021 | Li | ....................... | H01L 51/0097 |
| 2021/0210522 A1* | 7/2021 | Liu | ..................... | H01L 27/1248 |

FOREIGN PATENT DOCUMENTS

| | | | |
|---|---|---|---|
| JP | 2013182853 A | * | 9/2013 |
| JP | 2019-152706 | | 9/2019 |

* cited by examiner

FIG. 1
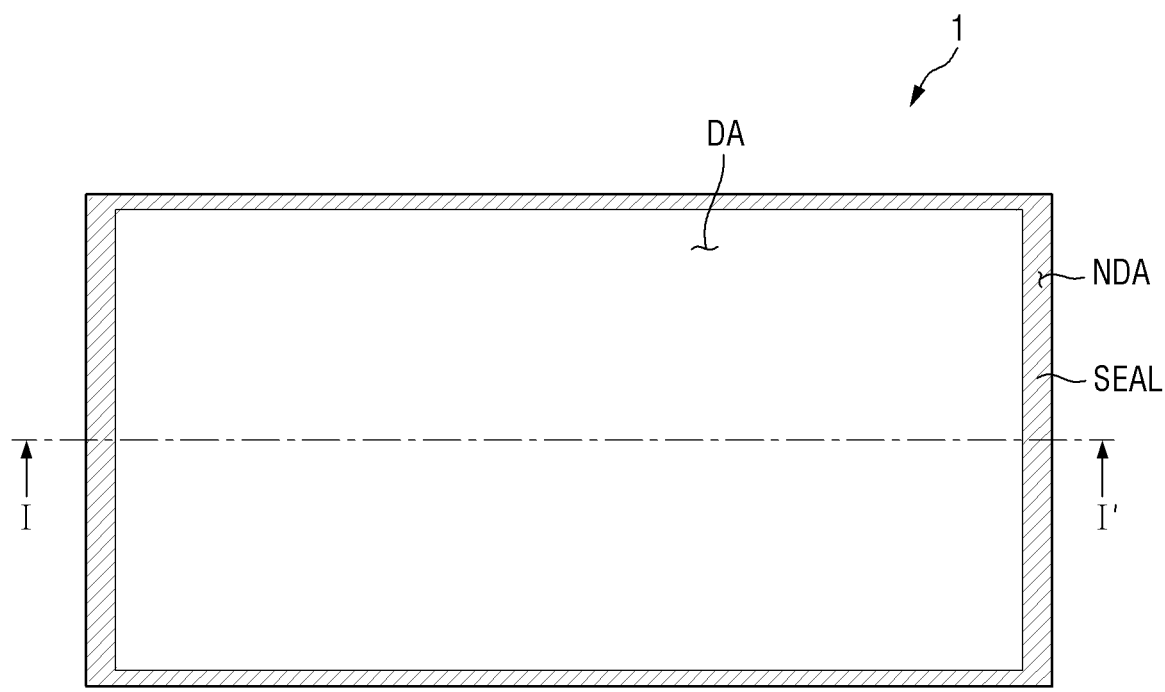
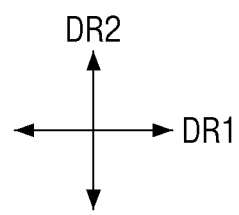

FIG. 6
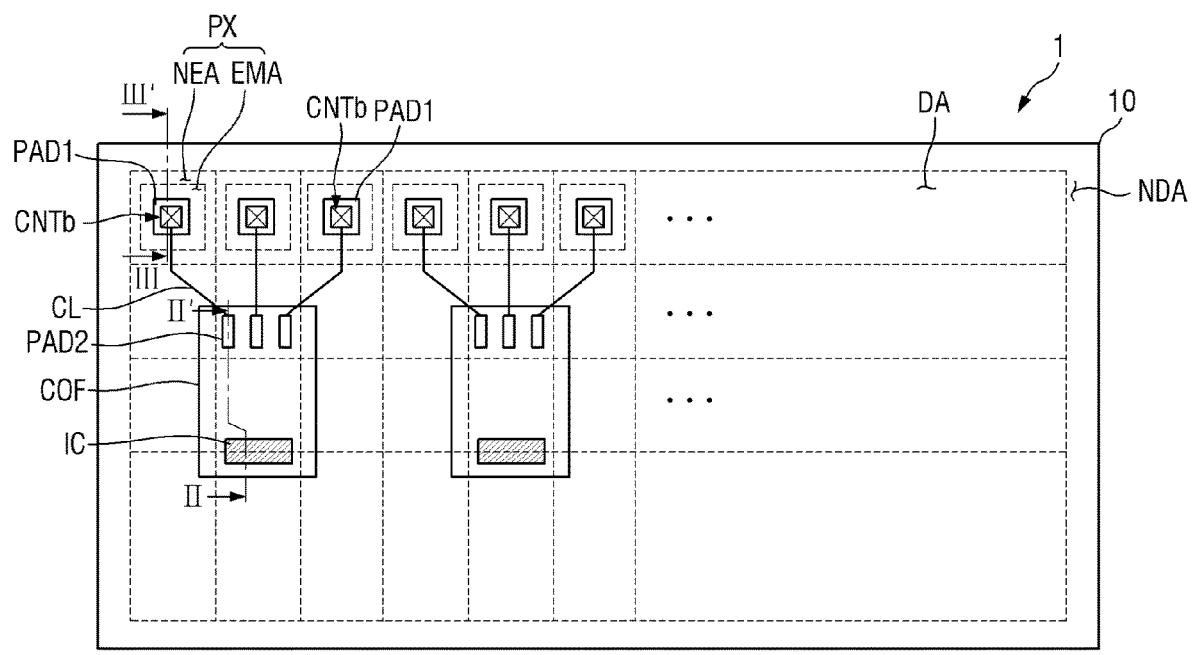
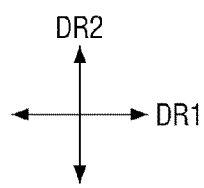

DISPLAY DEVICE HAVING ETCH STOPPERS WITH THROUGH HOLES

CROSS REFERENCE TO RELATED APPLICATION(S)

This application claims priority to and benefits of Korean Patent Application No. 10-2020-0033223 under 35 U.S.C. § 119, filed in the Korean Intellectual Property Office on Mar. 18, 2020, the entire contents of which are incorporated herein by reference.

BACKGROUND

1. Technical Field

The disclosure relates to a display device, and a method of fabricating a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and may include a display panel such as an organic light-emitting display panel or a liquid-crystal display panel. Among them, a light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device in which driving circuits may be disposed on the back surface of a base substrate.

It should be noted that objects of the disclosure are not limited to the above-mentioned object. Other objects of the invention will be apparent to those skilled in the art from the following descriptions.

According to an embodiment of the disclosure, driving circuits may be disposed on the back surface of a base substrate, so that it may be possible to reduce the dead space.

According to an embodiment, a display device may include a first substrate having a display area and a non-display area adjacent to the display area, the first substrate including a substrate through-hole penetrating the first substrate in a thickness direction, an etching stopper disposed on a first surface of the first substrate, the etching stopper including a stopper through-hole that overlaps the substrate through-hole and penetrates the etching stopper in the thickness direction, a data line disposed on the etching stopper, a substrate connection electrode that fills the substrate through-hole and the stopper through-hole, the substrate connection electrode being disposed in the display area and electrically connected to the data line, and a first pad disposed on a second surface of the first substrate opposite to the first surface and overlapping the substrate connection electrode. The first pad may be electrically connected to the substrate connection electrode.

The first surface of the first substrate may be in contact with the etching stopper, and the substrate through-hole may be surrounded by an extension line of the second surface of the first substrate, an extension line of the first surface of the first substrate, and side surfaces of the first substrate.

The etching stopper may include a first surface that may be in contact with the first surface of the first substrate, and a second surface that may be opposite to the first surface of the etching stopper. The stopper through-hole may be surrounded by an extension line of the first surface of the etching stopper, an extension line of the second surface of the etching stopper, and side surfaces of the etching stopper. An average slope of the side surfaces of the etching stopper may be greater than an average slope of the side surfaces of the first substrate.

The stopper through-hole may overlap the first surface of the first substrate in the thickness direction.

The display device may further include a buffer layer disposed on the second surface of the etching stopper and disposed between the etching stopper and the data line. A roughness of a surface of the buffer layer that contacts the substrate connection electrode may be greater than a roughness of a surface of the buffer layer that does not contact the substrate connection electrode.

The display device may further include a buffer layer disposed on the second surface of the etching stopper and disposed between the etching stopper and the data line, and an etching residue disposed on a surface of the buffer layer that contacts the substrate connection electrode, wherein the etching residue and the etching stopper may include a same material.

The display device may further include a buffer layer disposed between the etching stopper and the data line, and a first gate insulating layer disposed between the buffer layer and the data line, wherein the data line may be electrically connected to the substrate connection electrode through a data connection electrode penetrating the first gate insulating layer and the buffer layer in the thickness direction.

The display device may further include a connection line disposed on the second surface of the first substrate, wherein the connection line may be electrically connected to the first pad, and may include a chip-on-film disposed on the second surface of the first substrate and mounted with a driving chip, and a second pad disposed on the second surface of the first substrate, wherein the second pad may be electrically connected to the connection line, and the chip-on-film may be electrically connected to the second pad.

The display area may include pixels, each of the pixels including an emission area and a non-emission area disposed adjacent to the emission area, an outer bank may be disposed on the data line and may be disposed in the non-emission area, a light-emitting element may be disposed in the emission area, the emission area may be adjacent to the outer bank, and the substrate connection electrode may overlap the emission area.

The display device may further include a buffer layer disposed between the etching stopper and the data line, a first gate insulating layer disposed between the buffer layer and the data line, a gate connection electrode disposed between the first gate insulating layer and the data line, and a first protective layer disposed between the gate connection electrode and the data line. The data line may be electrically connected to the gate connection electrode through a data connection electrode penetrating the first protective layer, and the gate connection electrode may be electrically connected to the substrate connection electrode through a gate connection electrode penetrating the first gate insulating layer and the buffer layer.

According to another embodiment, a method of fabricating a display device may include forming a plurality of modified areas by irradiating a first mother substrate with a laser, the first mother substrate including a first surface and a second surface opposite to the first surface, forming an etching stopper on the first surface of the first mother substrate to cover the plurality of modified areas, disposing a plurality of upper display modules on the etching stopper such that each of the plurality of upper display modules overlaps a corresponding one of the plurality of modified areas, and disposing an encapsulation element over the plurality of upper display modules.

The method may further include masking areas except for the second surface of the first mother substrate with a wet etching mask after the encapsulation element is disposed.

The method may further include forming a substrate through-hole penetrating the first surface from the second surface of the first mother substrate by etching at each of the plurality of modified areas after the masking.

The etching may include wet etching.

The method may further include removing the wet etching mask, after the forming the substrate through-hole, and performing cell cutting for each of the plurality of upper display modules.

The method may further include forming a stopper through-hole penetrating the etching stopper in a portion overlapping the substrate through-hole, after the cell cutting.

The method may further include forming a substrate connection electrode to fill the substrate through-hole and the stopper through-hole, after the forming the stopper through-hole, and forming a first pad, after the forming the substrate connection electrode. The first pad may overlap the substrate connection electrode and may be disposed on the second surface of the first substrate cut from the first mother substrate.

The forming of the etching stopper on the first surface of the first mother substrate may include forming the etching stopper as an integral stopper.

The forming of the etching stopper on the first surface of the first mother substrate may include forming a plurality of etching stoppers, each of the etching stoppers may overlap a corresponding one of the plurality of modified areas, and each of the etching stoppers may be separated from one another.

The method may further include performing cell cutting on each of the plurality of upper display modules, after the disposing the encapsulation element, and masking areas except for the second surface of the first substrate with a wet etching mask, after the performing the cell cutting.

The method may further include forming a substrate through-hole penetrating the first surface from the second surface of the first substrate by etching at each of the plurality of modified areas, after the masking. The etching may include wet etching.

The method may further include forming a stopper through-hole penetrating the etching stopper in a portion overlapping the substrate through-hole, after the masking, forming a substrate connection electrode to fill the substrate through-hole and the stopper through-hole after the forming the stopper through-hole, and forming a first pad overlapping the substrate connection electrode and disposed on the second surface of the first substrate, after the forming the substrate connection electrode.

It should be noted that objects of the disclosure are not limited to the above-mentioned object. Other objects of the invention will be apparent to those skilled in the art from the following descriptions.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which:

FIG. 1 is a schematic plan view of a display device according to an embodiment of the disclosure.

FIG. 6 is a schematic plan view of a display device according to an embodiment of the disclosure when viewed from the bottom.

DETAILED DESCRIPTION OF THE EMBODIMENTS

Figure 2:
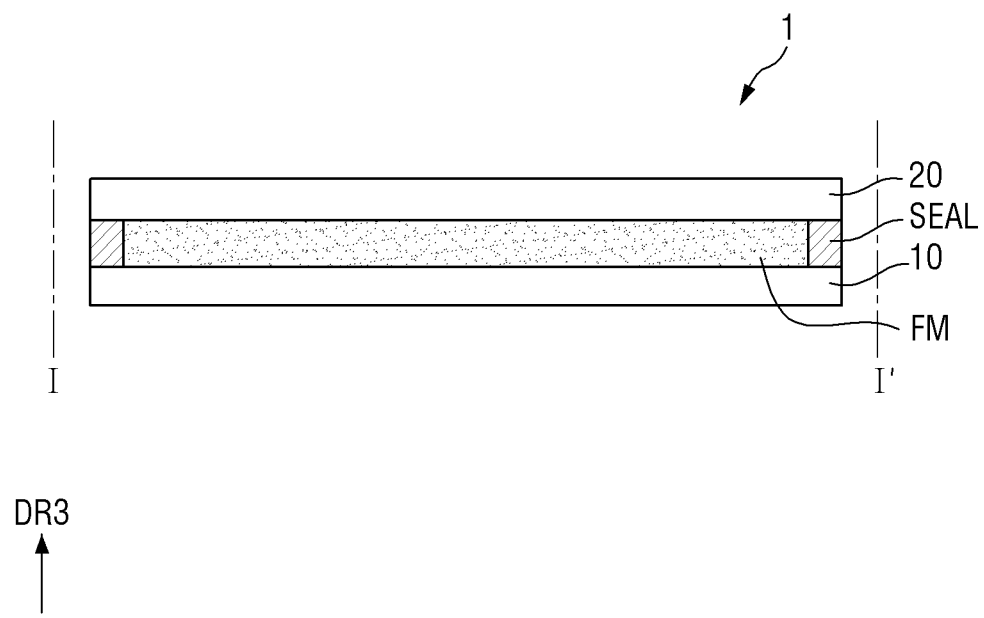
FIG. 2 is a schematic cross-sectional view taken along line I-I' in FIG. 1.

Specific structural and functional descriptions of embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims, including any equivalents.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there may be no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," "has" and/or "having", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The term "overlap" may include layer, stack, face or facing, extending over, extending under, covering or partly covering or any other suitable term as would be appreciated and understood by those of ordinary skill in the art. The expression "do not overlap" may include "apart from" or "set aside from" or "offset from" and any other suitable equivalents as would be appreciated and understood by those of ordinary skill in the art.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures may be schematic in nature and their shapes may not be intended to illustrate the precise shape of a region and are not intended to limit the scope of the claims.

Hereinafter, embodiments of the invention will be described with reference to the attached drawings.

FIG. 1 is a schematic plan view of a display device according to an embodiment of the disclosure. FIG. 2 is a schematic cross-sectional view taken along line I-I' in FIG. 1.

A display device 1 shown in FIGS. 1 and 2 may be employed in a variety of electronic devices including small-and-medium sized electronic devices such as a tablet PC, a smartphone, a vehicle navigation unit, a camera, a center information display (CID) installed in vehicles, a wrist-type electronic device, a personal digital assistant (PMP), a portable multimedia player (PMP) and a game machine, and medium-and-large electronic devices such as a television, an electric billboard, a monitor, a personal computer and a laptop computer. It should be understood that the above-listed electronic devices are merely illustrative and the display device 10 may be employed in a variety of other electronic devices without departing from the scope of the disclosure.

In some embodiments, the display device 1 may have a rectangular shape when viewed from the top. The display device 1 may include two first sides extended in the first direction DR1, and two second sides extended in the second direction DR2 intersecting the first direction DR1. Although the corners where the first sides and the second sides of the display device 1 meet may form a right angle, this is merely illustrative. The display device 1 may have rounded corners. In some embodiments, the first sides may be longer than the second sides, but the disclosure is not limited thereto. The shape of the display device 1 when viewed from the top is not limited to that shown in the drawings. The display device 70 may have a circular shape or other shapes.

The display device 1 may include a display area DA where images may be displayed, and a non-display area NDA where no image may be displayed. In some embodiments, the non-display area NDA may be disposed around the display area DA to surround it.

According to an embodiment of the disclosure, the display device 1 may include a first display substrate 10, a second display substrate 20 facing the first display substrate 10, and may further include a sealing member SEAL coupling the first display substrate 10 with the second display substrate 20, and a filling material FM between the first display substrate 10 and the second display substrate 20. The sealing member SEAL may be disposed in the non-display area NDA, and may not overlap the display area DA.

The first display substrate 10 may include elements and circuits for displaying images, e.g., a pixel circuit such as a switching element, an outer bank for defining an emission area and a non-emission area (to be described later) in the display area DA, and a self-light-emitting element. In an embodiment, the self light-emitting element may include at least one of an organic light-emitting diode, a quantum-dot light-emitting diode, and an inorganic-based micro light-emitting diode (e.g., Micro LED), and an inorganic-based nano light-emitting diode (e.g., Nano LED).

The second display substrate 20 may be located on the first display substrate 10 and may face the first display substrate 10. The second display substrate 20 may include a color conversion pattern that converts the color of incident light. In some embodiments, the color conversion pattern may include a color filter and/or a color control layer.

The sealing member SEAL may be disposed between the first display substrate 10 and the second display substrate 20 in the non-display area NDA. The sealing member SEAL may be disposed in the non-display area NDA along the edges of the first display substrate 10 and the second display substrate 20 to surround the display area DA when viewed from the top. The first display substrate 10 and the second display substrate 20 may be coupled to each other through the sealing member SEAL. In some embodiments, the sealing member SEAL may be made of an organic material. For example, the sealing member SEAL may be made of, but is not limited to, an epoxy resin.

The filling material FM may be disposed in the space between the first display substrate 10 and the second display substrate 20 surrounded by the sealing member SEAL. The space between the first display substrate 10 and the second display substrate 20 may be filled with the filling material FM. The filling material FM may be made of a material that transmits light. In some embodiments, the filling material FM may be made of an organic material. For example, the filling material FM may be made of, but is not limited to, a silicon-based organic material, an epoxy-based organic material, etc., or a combination thereof. In some implementations, the filling material FM may be eliminated.

Figure 3:
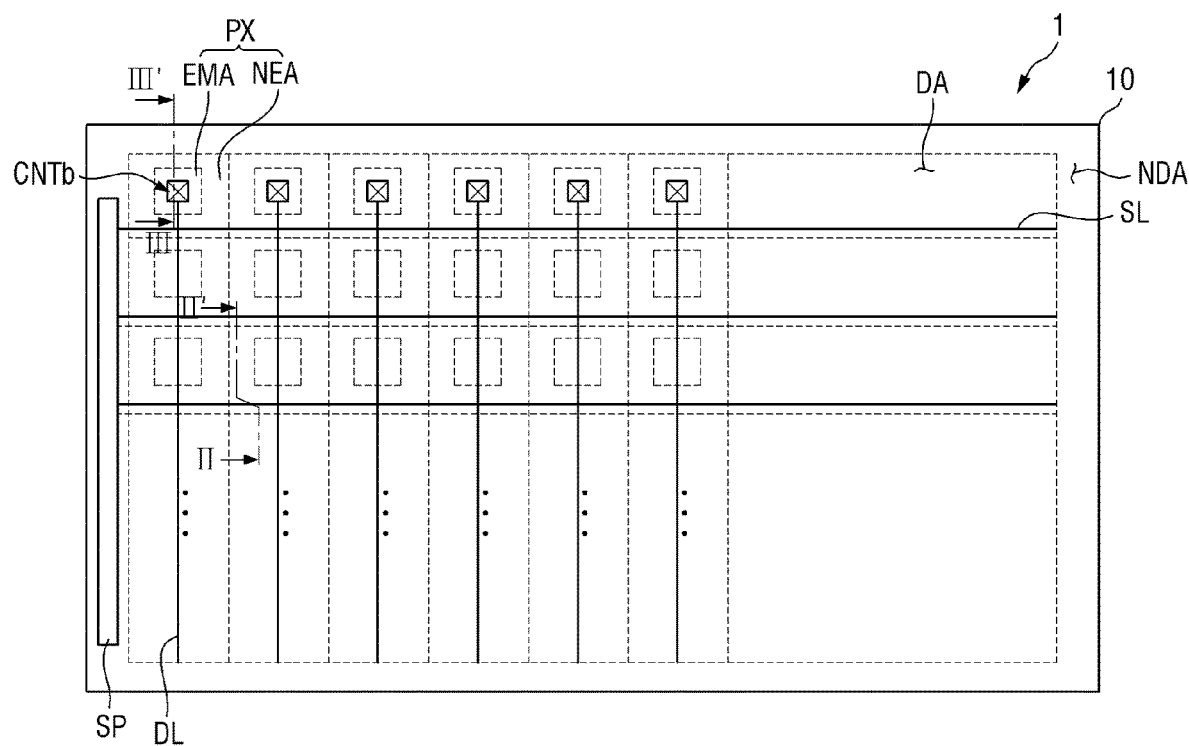
FIG. 3 is a schematic plan view of a display device according to an embodiment of the disclosure when viewed from the top.

FIG. 3 is a schematic plan view of a display device according to an embodiment of the disclosure when viewed from the top.

Referring to FIG. 3, pixels PX may be disposed in the display area DA. The pixels PX may be arranged in a matrix along the first direction DR1 and the second direction DR2. The pixels PX arranged along the first direction DR1 may form a pixel row. There may be more than one pixel rows. The pixel rows may be arranged along the second direction DR2. Likewise, the pixels PX arranged along the second direction DR2 may form a pixel column. There may be more than one pixel column. The pixel columns may be arranged along the first direction DR1.

A scan driver SP may be disposed in the non-display area NDA. The scan driver SP may include at least one thin-film transistor. The scan driver SP may be electrically connected to a scan line SL. There may be more than one scan drivers SP. Scan drivers SP may be located in a non-display area NDA on one side (or right side) of the display area DA and the other side (or left side) of the display area DA in the first direction DR1, respectively. In some embodiments, there may be only one scan driver SP. The scan driver SP may be disposed in the non-display area NDA on one side or the other side of the display area DA in the first direction DR1. In some embodiments, there may be two scan drivers SP. The two scan driver SP may be disposed in the non-display area NDA on one side and the other side of the display area DA in the first direction DR1, respectively.

The scan line SL may be extended along the pixel row. There may be more than one scan lines SL. The scan lines may be arranged along the second direction DR2. The scan lines SL arranged along the second direction DR2 may be electrically connected to the pixel rows, respectively.

A data line DL may be extended along the pixel column. There may be more than one data lines DL. The data lines DL may be arranged along the first direction DR1. The data lines DL arranged along the first direction DR1 may be electrically connected to the pixel columns, respectively.

The data line DL may be electrically connected to a substrate connection electrode CNTb. There may be more than one substrate connection electrode CNTb. The substrate connection electrodes CNTb may be associated with the data lines DL, respectively. Although the substrate connection electrodes CNTb may be arranged along the first direction DR1 in the example shown in FIG. 3, the arrangement of the substrate connection electrodes CNTb is not limited thereto. For example, the substrate connection electrodes CNTb may be arranged in a zigzag pattern instead of being arranged along the first direction DR1.

The data line DL may be electrically connected to a first pad PAD1 (see FIGS. 6 and 7) through a data connection electrode CNTa (see FIG. 7), an etching stopper ES (see FIG. 7), and a substrate connection electrode CNTb, as described below.

Each of the pixels PX may include an emission area EMA and a non-emission area NEA around the emission area EMA. The non-emission area NEA and the emission area EMA may be distinguished by an outer bank 45 (see FIG. 5) and a light-emitting element 30 (see FIG. 5), as described above. The outer bank 45 may be disposed in the non-emission area NEA, and the light-emitting element 30 may be disposed in the emission area EMA. The outer bank 45 may not be disposed in the emission area EMA, and the light-emitting element 30 may not be disposed in the non-emission area NEA. The substrate connection electrode CNTb and the data connection electrode CNTa may be disposed in the emission area EMA.

Figure 4:
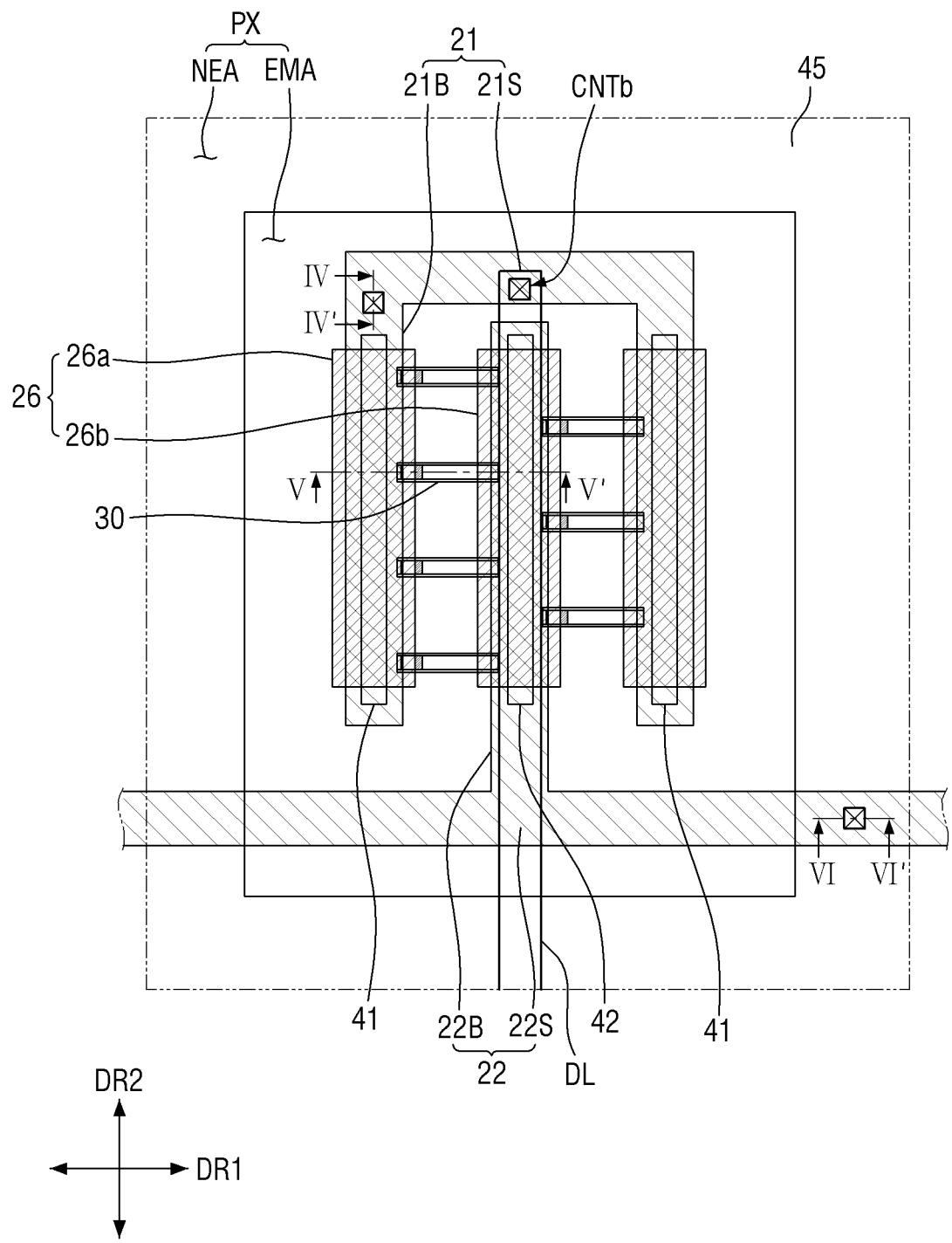
FIG. 4 is an enlarged schematic plan view of a pixel of FIG. 3.
Figure 5:
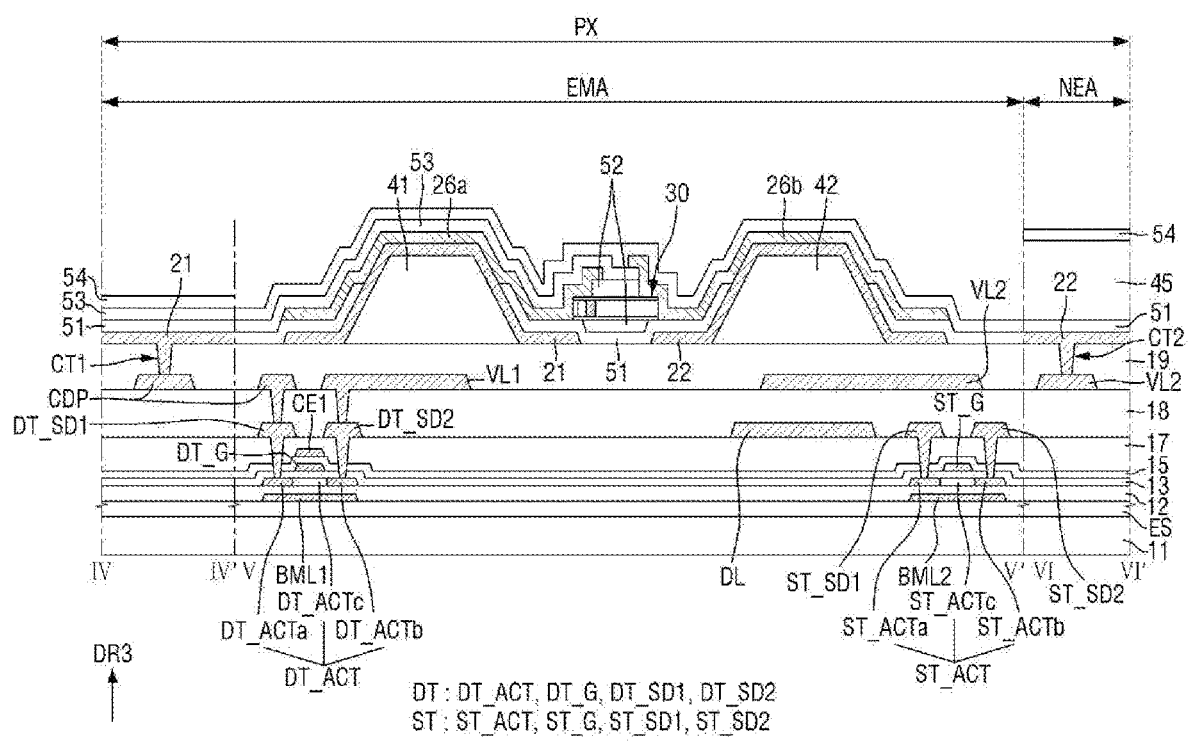
FIG. 5 is a schematic cross-sectional view taken along lines IV-IV', V-V' and VI-VI' of FIG. 4.

FIG. 4 is an enlarged schematic plan view of a pixel of FIG. 3. FIG. 5 is a schematic cross-sectional view taken along lines IV-IV', V-V' and VI-VI' of FIG. 4.

Referring to FIG. 4, among the pixels, one pixel PX may emit light of a first color, another pixel PX may emit light of a second color, and yet another pixel PX may emit light of a third color. The first color may be red, the second color may be green, and the third color may be blue. It is, however, to be understood that the disclosure is not limited thereto. All of the pixels PX may emit light of the same color.

Each of the pixels PX of the display device 1 may include an area defined as the emission area EMA. The emission area EMA may be defined as an area in which the light-emitting element 30 included in the display device 1 is disposed to emit light of a specific wavelength band. The light-emitting element 30 includes an active layer, and the active layer may emit light of a specific wavelength band without directivity. The light emitted from the active layer of the light-emitting element 30 may exit on the both sides of the light-emitting element 30. The emission area EMA may include an area in which the light-emitting element 30 is disposed, and may include an area adjacent to the light-emitting element 30 where lights emitted from the light-emitting element 30 exit.

It is, however, to be understood that the disclosure is not limited thereto. The emission area EMA may also include an area in which light emitted from the light-emitting element 30 is reflected or refracted by other elements to exit. The light-emitting elements 30 may be disposed in the pixels PX, respectively, and the emission area EMA may include the area where the light-emitting elements may be disposed and adjacent areas.

Although not shown in the drawings, each of the pixels PX of the display device 1 may include the non-emission area NEA defined as the other area than the emission area EMA. In the non-emission area NEA, the light-emitting element 30 may not be disposed and the light emitted from the light-emitting element 30 may not reach, and thus no light exits therefrom. The outer bank 45 may be disposed in the non-emission area NEA.

Referring to FIG. 5 in connection with FIG. 4, the display device 1 may include a first substrate 11 or a first base substrate, and a circuit element layer and a display element layer disposed on the first substrate 11. The display device 1 may further include an etching stopper ES disposed on the first substrate 11. A semiconductor layer, conductive layers, and insulating layers may be disposed on the first substrate 11, and these may form the circuit element layer and the display element layer. The conductive layers may include a first gate conductive layer, a second gate conductive layer, a first data conductive layer and a second data conductive layer disposed under a first planarization layer 19 to form the circuit element layer, and electrodes 21 and 22 and contact electrodes 26 disposed on the first planarization layer 19 to form the display element layer. The insulating layers may include a buffer layer 12, a first gate insulating layer 13, a first protective layer 15, a first interlayer dielectric layer 17, a second interlayer dielectric layer 18, and a first planarization layer 19, a first insulating layer 51, a second insulating layer 52, a third insulating layer 53, a fourth insulating layer 54, etc.

Specifically, the first substrate 11 may be an insulating substrate. The first substrate 11 may be made of an insulating material such as glass, quartz, a polymer resin, or a combination thereof. The first substrate 11 may be either a rigid substrate or a flexible substrate that can be bent, folded, or rolled.

The etching stopper ES may be disposed on the first substrate 11. The first substrate 11 may include a first surface on which the etching stopper ES may be disposed, and a second surface opposite to the first surface. The etching stopper ES may be disposed on the first surface of the first substrate 11. The etching stopper ES may be disposed directly on the first surface of the first substrate 11.

The etching stopper ES may include an organic material. In some embodiments, the etching stopper ES may include an inorganic material.

The etching stopper ES can prevent an etching solution from diffusing to the first surface of the first substrate during the process of forming the substrate through-hole to be described later.

Light-blocking layers BML1 and BML2 may be disposed on the etching stopper ES. The light-blocking layers BML1 and BML2 may include a first light-blocking layer BML1 and a second light-blocking layer BML2. The first light-blocking layer BML1 and the second light-blocking layer BML2 at least overlap a first active material layer DT_ACT of a driving transistor DT and a second active material layer ST_ACT of a switching transistor ST, respectively. The light-blocking layers BML1 and BML2 may include a material that blocks light, thereby preventing light from being incident on the first and second active material layers DT_ACT and ST_ACT. For example, the first and second light-blocking layers BML1 and BML2 may be made of an opaque metal material that blocks light transmission. It is, however, to be understood that the disclosure is not limited thereto. In some implementations, the light-blocking layers BML1 and BML2 may be eliminated.

The buffer layer 12 may be disposed on the light-blocking layers BML1 and BML2. The buffer layer 12 may be formed on the first substrate 11 to protect the thin-film transistors DT and ST of the pixels from moisture permeating through the first substrate 11 that may be susceptible to moisture permeation, to provide a flat surface. The buffer layer 12 may be formed of inorganic layers stacked on one another alternately. For example, the buffer layer 12 may be made up of multiple layers in which inorganic layers including at least one of a silicon oxide (SiOx), a silicon nitride (SiNx) and silicon oxynitride (SiON) may be stacked on one another alternately.

The semiconductor layer may be disposed on the buffer layer 12. The semiconductor layer may include the first active material layer DT_ACT of the driving transistor DT and the second active material layer ST_ACT of the switching transistor ST. These may be disposed to partially overlap with gate electrodes DT_G and ST_G of the first gate conductive layer and the light-emitting element 30, which will be described later.

According to an embodiment of the disclosure, the semiconductor layer may include polycrystalline silicon, monocrystalline silicon, an oxide semiconductor, etc., or a combination thereof. The polycrystalline silicon may be formed by crystallizing amorphous silicon. In case that the semiconductor layer includes polycrystalline silicon, the first active material layer DT_ACT may include a first doped region DT_ACTa, a second doped region DT_ACTb, and a first channel region DT_ACTc. The first channel region DT_ACTc may be disposed between the first doped region DT_ACTa and the second doped region DT_ACTb. The second active material layer ST_ACT may include a third doped region ST_ACTa, a fourth doped region ST_ACTb, and a second channel region ST_ACTc. The second channel region ST_ACTc may be disposed between the third doped region ST_ACTa and the fourth doped region ST_ACTb. The first doped region DT_ACTa, the second doped region DT_ACTb, the third doped region ST_ACTa and the fourth doped region ST_ACTb may be formed by doping some regions of the first active material layer DT_ACT and the second active material layer ST_ACT with impurities.

In another embodiment, the first active material layer DT_ACT and the second active material layer ST_ACT may include an oxide semiconductor. The doped regions of the first active material layer DT_ACT and the second active material layer ST_ACT may have conductivity. The oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), etc. It is, however, to be understood that the disclosure is not limited thereto.

The first gate insulating layer 13 may be disposed on the semiconductor layer and the buffer layer 12. The first gate insulating layer 13 may include a semiconductor layer, and may be disposed on the buffer layer 12. The first gate insulating layer 13 may serve as a gate insulating layer of the driving transistor DT and the switching transistor ST. The first gate insulating layer 13 may be formed of an inorganic layer including an inorganic material, such as silicon oxide (SiOx), silicon nitride (SiNx) and silicon oxynitride (SiON), or may be formed of a stack of the materials.

The first gate conductive layer may be disposed on the first gate insulating layer 13. The first gate conductive layer may include a first gate electrode DT_G of the driving transistor DT and a second gate electrode ST_G of the switching transistor ST. The first gate electrode DT_G may be disposed to overlap the first channel region DT_ACTc of the first active material layer DT_ACT in the thickness direction, and the second gate electrode ST_G may be disposed to overlap the second channel region ST_ACTc of the second active material layer ST_ACT in the thickness direction.

The first gate conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first protective layer 15 may be disposed on the first gate conductive layer. The first protective layer 15 may be disposed to cover the first gate conductive layer to serve to protect it. The first protective layer 15 may be formed of an inorganic layer including an inorganic material, such as silicon oxide (SiOx), silicon nitride (SiNx) and silicon oxynitride (SiON), or may be formed of a stack of the materials.

The second gate conductive layer may be disposed on the first protective layer 15. The second gate conductive layer may include a first capacitive electrode CE1 of a storage capacitor disposed that at least partially overlaps the first gate electrode DT_G in the thickness direction. The first capacitive electrode CE1 overlaps the first gate electrode DT_G in the thickness direction with the first protective layer 15 therebetween, and a storage capacitor may be formed between them. The second gate conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first interlayer dielectric layer 17 may be disposed on the second gate conductive layer. The first interlayer dielectric layer 17 may serve as an insulating layer between the second gate conductive layer and other layers disposed thereon. The first interlayer dielectric layer 17 may be formed of an inorganic layer including an inorganic material, such as silicon oxide (SiOx), silicon nitride (SiNx) and silicon oxynitride (SiON), or may be formed of a stack of the materials.

The first data conductive layer may be disposed on the first interlayer dielectric layer 17. The first gate conductive layer may include a first source/drain electrode DT_SD1 and a second source/drain electrode DT_SD2 of the driving transistor DT, and a first source/drain electrode ST_SD1 and a second source/drain electrodes ST_SD2 of the switching transistor ST.

The first source/drain electrode DT_SD1 and the second source/drain electrode DT_SD2 of the driving transistor DT may come in contact with the first doped region DT_ACTa and the second doped region DT_ACTb of the first active material layer DT_ACT, respectively, through contact holes penetrating through the first interlayer insulating layer 17 and the first gate insulating layer 13. The first source/drain electrode ST_SD1 and the second source/drain electrode ST_SD2 of the switching transistor ST may come in contact with the second doped region ST_ACTa and the fourth doped region ST_ACTb of the second active material layer ST_ACT, respectively, through contact holes penetrating through the first interlayer insulating layer 17 and the first gate insulating layer 13. The first source/drain electrode DT_SD1 of the driving transistor DT and the first source/drain electrode ST_SD1 of the switching transistor ST may be electrically connected to the first light-blocking layer BML1 and the second light-blocking layer BML2, respectively, through other contact holes. In case that one of the first source/drain electrode DT_SD1 and the second source/drain electrode DT_SD2 of the driving transistor DT may be a source electrode, the other may be a drain electrode. In case that one of the first source/drain electrode ST_SD1 and the second source/drain electrode ST_SD2 of the switching transistor ST may be a source electrode, the other may be a drain electrode. It is, however, to be understood that the disclosure is not limited thereto. In case that one of the first source/drain electrode DT_SD1 and the second source/drain electrode DT_SD2 is a drain electrode, the other may be a source electrode. In case that one of the first source/drain electrode ST_SD1 and the second source/drain electrode ST_SD2 is a drain electrode, the other may be a source electrode.

The first data conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The second interlayer dielectric layer 18 may be disposed on the first data conductive layer. The second interlayer dielectric layer 18 may cover the first data conductive layer and may be disposed entirely on the first interlayer dielectric layer 17 to protect the first data conductive layer. The second interlayer dielectric layer 18 may be formed of an inorganic layer including an inorganic material, such as silicon oxide (SiOx), silicon nitride (SiNx) and silicon oxynitride (SiON), or may be formed of a stack of the materials.

The second data conductive layer may be disposed on the second interlayer dielectric layer 18. The second data conductive layer may include a first voltage line VL1, a second voltage line VL2, and a first conductive pattern CDP. A high-level voltage (or a first supply voltage) may be applied to the first voltage line VL1 to be supplied to the driving transistor DT, and a low-level voltage (or a second supply voltage) may be applied to the second voltage line VL2 to be supplied to a second electrode 22. An alignment signal necessary for aligning the light-emitting elements 30 during the process of fabricating the display device 1 may be applied to the second voltage line VL2.

The first conductive pattern CDP may be electrically connected to the first source/drain electrode DT_SD1 of the driving transistor DT through a contact hole formed in the second interlayer dielectric layer 18. The first conductive pattern CDP may also come in contact with a first electrode 21 to be described later. The driving transistor DT may transfer the first supply voltage applied from the first voltage line VL1 to the first electrode 21 through the first conductive pattern CDP. Although the second data conductive layer includes one second voltage line VL2 and one first voltage line VL1 in the example shown in the drawings, the disclosure is not limited thereto. The second data conductive layer may include more than one first voltage lines VL1 and second voltage lines VL2.

The second data conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first planarization layer 19 may be disposed on the second data conductive layer. The first planarization layer 19 may include an organic insulating material, e.g., an organic material such as polyimide (PI), to provide a flat surface.

Inner banks 41 and 42, the electrodes 21 and 22, the outer bank 45, the contact electrodes 26 and the light-emitting element 30 may be disposed on the first planarization layer 19. Insulating layers 51, 52, 53 and 54 may be further disposed on the first planarization layer 19.

The inner banks 41 and 42 may be disposed directly on the first planarization layer 19. The inner banks 41 and 42 may include a first inner bank 41 and a second inner bank 42 disposed adjacent to the center of each of the pixels PX.

The first inner bank 41 and the second inner bank 42 may be spaced apart from each other in the first direction DR1 and face each other. As the inner banks 41 and 42 may be spaced apart from each other, there may be an area in which the light-emitting elements 30 may be disposed. The first inner bank 41 and the second inner bank 42 may be extended in the second direction DR2 and may be terminated at the border of each of the pixels PX so that they may not be extended to an adjacent pixels PX in the second direction DR2. Accordingly, the first inner bank 41 and the second inner bank 42 may be disposed in each of the pixels PX to form a pattern on the whole surface of the display device 1. Although FIGS. 4 and 5 show only one first inner bank 41 and one second inner bank 42, but the disclosure is not limited thereto. More than one inner banks 41 and 42 may be further disposed depending on the number of electrodes 21 and 22 to be described later.

The first inner bank 41 and the second inner bank 42 may have a structure that may at least partially protrude from the upper surface of the first planarization layer 19. The protruding portions of each of the first inner bank 41 and the second inner bank 42 may have inclined side surfaces. The light emitted from the light-emitting element 30 may travel toward the inclined side surfaces of the inner bank 41 and 42. As will be described later, the electrodes 21 and 22 disposed on the inner banks 41 and 42, respectively, may include a material having a high reflectivity, and the light emitted from the light-emitting element 30 may be reflected off the electrodes 21 and 22 disposed on the side surfaces of the inner banks 41 and 42, so that the light may exit toward the upper side of the first planarization layer 19. For example, the inner banks 41 and 42 may provide the area in which the light-emitting element 30 is disposed and may also serve as reflective partition walls that reflect light emitted from the light-emitting elements 30 upward. In an embodiment, the inner banks 41 and 42 may include, but are not limited to, an organic insulating material such as polyimide (PI).

The electrodes 21 and 22 may be disposed on the inner banks 41 and 42 and the first planarization layer 19. The electrodes 21 and 22 may be electrically connected to the light-emitting elements 30, and a predetermined voltage may be applied so that the light-emitting element 30 can emit light of a specific wavelength band. At least a part of the electrodes 21 and 22 may be utilized to form an electric field within the pixel PX to align the light-emitting element 30.

The electrodes 21 and 22 may include the first electrode 21 disposed on the first inner bank 41 and the second electrode 22 disposed on the second inner bank 42.

The first electrode 21 and the second electrode 22 may include electrode stems 21S (see FIG. 7) and 22S extended in the first direction DR1, respectively, and one or more electrode branches 21B and 22B branching off from the electrode stems 21S and 22S, respectively, and extended in the second direction DR2 intersecting the first direction D1.

The first electrode 21 may include the first electrode stem 21S extended in the first direction DR1, and at least one first electrode branch 21B branching off from the first electrode stem 21S and extended in the second direction DR2.

Both ends of the first electrode stem 21S may be terminated such that they may be spaced apart between the pixels PX, and may be located on substantially the same straight line as the first electrode stem 21S of the next pixel adjacent thereto in the same row, e.g., in the first direction DR1. Since the both ends of the first electrode stem 21S disposed in each of the pixels PX may be spaced apart between the pixels, different electric signals can be applied to the first electrode branches 21B, so that the first electrode branches 21B can be driven individually. The first electrode 21 may come in contact with the first conductive pattern CDP through a first contact hole CT1 penetrating through the first planarization layer 19, so that it may be electrically connected to the first source/drain electrode DT_SD1 of the driving transistor DT.

The first electrode branches 21B may branch off from at least a part of the first electrode stem 21S to be extended in the second direction D2 and may be terminated such that they may be spaced apart from the second electrode stem 22S that may be opposed to the first electrode stem 21S.

The second electrode 22 may include the second electrode stem 22S extended in the first direction DR1 and spaced apart from the first electrode stem 21S in the second direction D2, the second electrode branches 22B branching off from the second electrode stem 22S and extended in the second direction D2.

The second electrode stem 22S may be extended in the first direction DR1 and may be disposed beyond the boundary with another adjacent pixel PX. The second electrode stem 22S extended across the pixels PX may be extended to the outer portion of the display area DA or a portion extending in one direction from the non-display area NDA. The second electrode 22 may come in contact with the second voltage line VL2 through a second contact hole CT2 penetrating through the first planarization layer 19. As shown in the drawings, the second electrodes 22 of the pixels PX adjacent to one another in the first direction DR1 may be electrically connected to one second electrode stem 22S and may be electrically connected to the second voltage line VL2 through the second contact hole CT2. It is, however, to be understood that the disclosure is not limited thereto. In some implementations, the second contact hole CT2 may be formed in each of the pixels PX.

The second electrode branch 22B may be spaced apart from and facing the first electrode branch 21B and may be terminated while being spaced apart from the first electrode stem 21S. The second electrode branch 22B may be electrically connected to the second electrode stem 22S, and the end of the second electrode branch 22B may be spaced apart from the first electrode stem 21S in the pixel PX.

Although two first electrode branches 21B and one second electrode branch 22B may be disposed for each pixel PX in the drawings, the disclosure is not limited thereto. In some embodiments, a greater number of first electrode branches 21B and second electrode branches 22B may be disposed for each pixel PX. The first electrode 21 and the second electrode 22 disposed in each pixel PX may not necessarily have a shape extended in one direction but may be disposed in a variety of structures.

The first electrode 21 and the second electrode 22 may be disposed on the first inner bank 41 and the second inner bank 42, respectively, and they may be spaced apart from each other. The electrode branches 21B and 22B of the first electrode 21 and the second electrode 22 may be disposed on the first inner bank 41 and the second inner bank 42, respectively, and at least some regions thereof may be disposed directly on the planarization layer 19. At least one end of the light-emitting elements 30 disposed between the first inner bank 41 and the second inner bank 42 may be electrically connected to the first electrode 21 and the second electrode 22.

Each of the electrodes 21 and 22 may include a transparent conductive material. For example, each of the electrode layers 21 and 22 may include, but are not limited to, a material such as indium tin oxide (ITO), indium zinc oxide (IZO), indium tin zinc oxide (ITZO), or a combination thereof. In some embodiments, each of the electrodes 21 and 22 may include a conductive material having a high reflectivity. For example, each of the electrodes 21 and 22 may include a metal such as silver (Ag), copper (Cu), aluminum (Al), or a combination thereof as the material having a high reflectivity. In such case, light incident on each of the electrodes 21 and 22 may be reflected and exit toward the upper side of each of the pixels PX.

Each of the electrodes 21 and 22 may have a structure in which one or more layers of a transparent conductive material and a metal layer having high reflectivity may be stacked, or may be made up of a single layer. In an embodiment, each of the electrodes 21 and 22 may have a stack structure of ITO/silver (Ag)/ITO/IZO, or may be an alloy including aluminum (Al), nickel (Ni), lanthanum (La), etc. It is, however, to be understood that the disclosure is not limited thereto.

The electrodes 21 and 22 may be electrically connected to the light-emitting elements 30, and may receive a predetermined voltage so that the light-emitting elements 30 can emit light. For example, the electrodes 21 and 22 may be electrically connected to the light-emitting element 30 through a contact electrode 26 to be described later, and may transfer electrical signals applied thereto to the light-emitting element 30 through the contact electrode 26.

In an embodiment, the first electrode 21 may be disconnected from pixel to pixel PX, while the second electrode 22 may be a common electrode electrically connected across the pixels PX. One of the first electrode 21 and the second electrode 22 may be the anode electrode of the light-emitting element 30, while the other may be the cathode electrode of the light-emitting element 30. It is, however, to be understood that the disclosure is not limited thereto. For example, the first electrode 21 may be the cathode electrode while the second electrode 22 may be the anode electrode.

The electrodes 21 and 22 may be utilized to form an electric field within the pixel PX to align the light-emitting elements 30. The light-emitting elements 30 may be disposed between the first electrode 21 and the second electrode 22 by applying an alignment signal to the first electrode 21 and the second electrode 22. The light-emitting elements 30 dispersed in an ink may be sprayed onto the first electrode 21 and the second electrode 22 during an inkjet printing process. By applying an alignment signal between the first electrode 21 and the second electrode 22 to exert a dielectrophoretic force, the light-emitting elements 30 may be aligned therebetween.

The first insulating layer 51 may be disposed on the first planarization layer 19, the first electrode 21 and the second electrode 22. The first insulating layer 51 may be disposed to partially cover the first electrode 21 and the second electrode 22. The first insulating layer 51 may cover a portion (e.g., most) of the upper surface of each of the first electrode 21 and the second electrode 22 and may expose a part of each of the first electrode 21 and the second electrode 22. The first insulating layer 51 may be disposed to expose a part of the upper surfaces of the first electrode 21 and the second electrode 22, e.g., a part of the upper surface of the first electrode branch 21B disposed on the first inner bank 41 and the upper surface of the second electrode branch 22B disposed on the inner bank 42. The first insulating layer 51 may be formed substantially entirely on the first planarization layer 19, and may include an opening partially exposing the first electrode 21 and the second electrode 22.

In an embodiment, the first insulating layer 51 may have a step so that a part of the upper surface is recessed between the first electrode 21 and the second electrode 22. In some embodiments, the first insulating layer 51 may include an inorganic insulating material, and a part of the upper surface of the first insulating layer 51 disposed to cover the first electrode 21 and the second electrode 22 may be recessed due to the step of the elements disposed under it. The light-emitting elements 30 disposed on the first insulating layer 51 between the first electrode 21 and the second electrode 22 may form an empty space with the recessed upper surface of the first insulating layer 51. The light-emitting elements 30 may be partially spaced apart from the upper surface of the first insulating layer 51, and the space may be filled with the material of the second insulating layer 52 described later. It is, however, to be understood that the disclosure is not limited thereto. The first insulating layer 51 may form a flat upper surface so that the light-emitting element 30 is disposed thereon.

The first insulating layer 51 can protect the first electrode 21 and the second electrode 22 and insulate them from each other. It can prevent that the light-emitting element 30 disposed on the first insulating layer 51 is brought into contact with other elements and damaged. It is to be understood that the shape and structure of the first insulating layer 51 are not limited thereto.

The outer bank 45 may be disposed on the first insulating layer 51. In some embodiments, the outer bank 45 may include an area in which the inner banks 41 and 42 and the electrodes 21 and 22 are disposed on the first insulating layer 51, and may be disposed at the boundaries between the pixels PX and surround the area where light-emitting elements 30 are disposed. The outer bank 45 may be disposed in the non-emission area NEA. The outer bank 45 may be disposed to have a shape extended in the first direction DR1 and the second direction DR2 to form a lattice pattern throughout the entire surface of the display area DA.

According to an embodiment of the disclosure, the height of the outer bank 45 may be greater than the height of the inner banks 41 and 42. Unlike the inner banks 41 and 42, the outer bank 45 may separate adjacent pixels PX from each other and can prevent an ink for forming the light-emitting element 30 during an inkjet printing process of the process of fabricating the display device 1 from overflowing to the adjacent pixels PX. The outer bank 45 may separate the different pixels PX from one another so that the ink in which the light-emitting elements 30 are dispersed may not be mixed. The outer bank 45 may include, but is not limited to, polyimide (PI) like the inner banks 41 and 42.

The light-emitting element 30 may be disposed between the electrodes 21 and 22. For example, the light-emitting element 30 may be disposed between the electrode branches 21B and 22B. The light-emitting elements 30 may be spaced apart from one another and may be substantially parallel to one another. The spacing between the light-emitting elements 30 is not particularly limited herein. In some implementations, some of the light-emitting elements 30 may be disposed close to each other to form a group, and some other of the light-emitting elements 30 may be disposed close to each other to form another group that may be spaced apart from the group. In another embodiment, the light-emitting elements 30 may be arranged with non-uniform densities. In the embodiment, the light-emitting elements 30 have a shape extended in one direction. The direction in which the electrodes 21 and 22 are extended may be substantially perpendicular to the direction in which the light-emitting elements 30 are extended. It is, however, to be understood that the disclosure is not limited thereto. The light-emitting elements 30 may be oriented obliquely to the direction in which the electrodes 21 and 22 are extended, rather than being perpendicular to it.

The light-emitting elements 30 according to an embodiment of the disclosure may include an active layer including different materials to emit light of different wavelength bands to the outside. The display device 1 may include the light-emitting elements 30 that emit light of different wavelengths.

The light-emitting elements 30 may be disposed on the first insulating layer 51 between the inner banks 41 and 42 or between the electrodes 21 and 22. For example, the light-emitting elements 30 may be disposed on the first insulating layer 51 disposed between the inner banks 41 and 42. The light-emitting elements 30 may be arranged to partially overlap the electrodes 21 and 22 in the thickness direction. One end of each of the light-emitting elements 30 may overlap the first electrode 21 in the thickness direction and may be located on the first electrode 21, and the other end thereof may overlap the second electrode 22 in the thickness direction and may be located on the second electrode 22. It is, however, to be understood that the disclosure is not limited thereto. Although not shown in the drawings, at least some of the light-emitting elements 30 disposed in each pixel PX may be disposed an area other than the area formed between the inner banks 41 and 42, for example, in an area other than the area between the electrode branches 21B and 22B, or may be disposed between the inner banks 41 and 42 and the outer bank 45.

One end of each of the light-emitting elements 30 may come in contact with a first contact electrode 26a, and the other end thereof may come in contact with a second contact electrode 26b. According to an embodiment of the disclosure, no insulating layer may be formed on the ends of the light-emitting elements 30 on a side in the extension direction and thus a part of the semiconductor layer may be exposed, the exposed semiconductor layer may be in contact with the first contact electrode 26a and the second contact electrode 26b to be described below. It is, however, to be understood that the disclosure is not limited thereto. In some implementations, at least a part of the insulating layer 30 may be removed and accordingly the side surfaces of both ends of the semiconductor layers may be partially exposed.

The second insulating layer 52 may be partially disposed on the light-emitting elements 30 disposed between the first electrode 21 and the second electrode 22. The second insulating layer 52 may be disposed to partially surround the outer surface of the light-emitting elements 30. A portion of the second insulating layer 52 disposed on the light-emitting elements 30 may have a shape extended in the second direction DR2 between the first electrode 21 and the second electrode 22 when viewed from the top. For example, the second insulating layer 52 may form a stripe type or island type pattern in each pixel PX.

The second insulating layer 52 may be disposed on the light-emitting elements 30 and may expose one end and the opposite end of each of the light-emitting elements 30. The exposed ends of each of the light-emitting elements 30 may come in contact with the contact electrodes 26 to be described later. The shape of the second insulating layer 52 may be formed via a patterning process using the material of the second insulating layer 52 using a typical mask process. The mask for forming the second insulating layer 52 may have a width smaller than the length of the light-emitting elements 30. The material of the second insulating layer 52 may be patterned so that both ends of each of the light-emitting elements 30 are exposed. It is, however, to be understood that the disclosure is not limited thereto.

The contact electrodes 26 may be disposed on the first electrode 21, the second electrode 22, and the second insulating layer 52. The third insulating layer 53 may be disposed on one of the contact electrodes 26.

The contact electrodes 26 may have a shape extended in one direction. The contact electrodes 26 may come in contact with the light-emitting elements 30 and the electrodes 21 and 22, and the light-emitting elements 30 may receive electric signals from the electrodes 21 and 22 through the contact electrodes 26.

The contact electrodes 26 may include a first contact electrode 26a and a second contact electrode 26b. The first contact electrode 26a and the second contact electrode 26b may be disposed on the first electrode 21 and the second electrode 22, respectively. Each of the first contact electrode 26a and the second contact electrode 26b may have a shape extended in the second direction DR2. The first contact electrode 26a and the second contact electrode 26b may be spaced apart from each other in the first direction DR1, and they may form a stripe pattern in the emission area EMA of each pixel PX.

A part of the upper surface of each of the first electrode 21 and the second electrode 22 may be exposed, and the first contact electrode 26a and the second contact electrode 26b may come in contact with the exposed upper surface of each of the first electrode 21 and the second electrode 22. For example, the first contact electrode 26a may be in contact with a part of the first electrode 21 located on the first inner bank 41, while the second contact electrode 26b may be in contact with a part of the second electrode 22 located on the second inner bank 42. It is, however, to be understood that the disclosure is not limited thereto. In some implementations, the widths of the first contact electrode 26a and the second contact electrode 26b may be smaller than the widths of the first electrode 21 and the second electrode 22, to cover only the exposed portion of the upper surface.

According to an embodiment of the disclosure, the semiconductor layer may be exposed at the both ends of the light-emitting elements 30 on a side in the extension direction and thus the first contact electrode 26a and the second contact electrode 26b may be in contact with the light-emitting elements 30 at the exposed ends of the semiconductor layer. It is, however, to be understood that the disclosure is not limited thereto. In some implementations, the semiconductor layers may be exposed on both ends the light-emitting elements 30, and each of the contact electrodes 26 may be in contact with the exposed semiconductor layer. One end of each of the light-emitting elements 30 may be electrically connected to the first electrode 21 through the first contact electrode 26a, and the other end thereof may be electrically connected to the second electrode 22 through the second contact electrode 26b.

Although two first contact electrodes 26a and one second contact electrode 26b may be disposed in one pixel PX in the drawings, the disclosure is not limited thereto. The numbers of the first contact electrodes 26a and the second contact electrode 26b may vary depending on the number of the first electrode branch 21B and the second electrode branch 22B disposed in each pixel PX.

The contact electrodes 26 may include a conductive material. For example, the contact electrodes may include ITO, IZO, ITZO, aluminum (Al), etc., or a combination thereof. For example, the contact electrodes 26 may include a transparent conductive material, and light emitted from the light-emitting elements 30 may transmit the contact electrodes 26 to proceed toward the electrodes 21 and 22. Each of the electrodes 21 and 22 may include a material having high reflectivity, and the electrodes 21 and 22 placed on the inclined side surfaces of the inner banks 41 and 42 can reflect the incident light toward the upper side of the first substrate 11. It is, however, to be understood that the disclosure is not limited thereto.

The third insulating layer 53 may be disposed on the first contact electrode 26a. The third insulating layer 53 may electrically insulate the first contact electrode 26a from the second contact electrode 26b. The third insulating layer 53 may be disposed to cover the first contact electrode 26a and may not be disposed on the other end of the light-emitting elements 30 so that the light-emitting elements 30 comes in contact with the second contact electrode 26b. The third insulating layer 53 may be in contact with a part of each of the first contact electrode 26a and the second insulating layer 52 on the upper surface of the second insulating layer 52. The side surface of the third insulating layer 53 on the side where the second electrode 22 is disposed may be aligned with the side surface of the second insulating layer 52. The third insulating layer 53 may also be disposed in the non-emission area, for example, on the first insulating layer 51 disposed on the first planarization layer 19. It is, however, to be understood that the disclosure is not limited thereto.

The fourth insulating layer 54 may be disposed entirely on the first substrate 11. The fourth insulating layer 54 may serve to protect the elements disposed on the first substrate 11 against the external environment.

Each of the above-described first insulating layer 51, second insulating layer 52, third insulating layer 53 and fourth insulating layer 54 may include an inorganic insulating material or an organic insulating material. According to an embodiment of the disclosure, the first insulating layer 51, the second insulating layer 52, the third insulating layer 53 and the fourth insulating layer 54 may include an inorganic insulating material such as silicon oxide (SiOx), silicon nitride (SiNx), silicon oxynitride (SiOxNy), aluminum oxide ($Al_2O_3$), aluminum nitride (AlN), or a combination thereof. In another embodiment, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc., or a combination thereof. It is, however, to be understood that the disclosure is not limited thereto.

FIG. 6 is a schematic plan view of a display device according to an embodiment of the disclosure when viewed from the bottom.

Referring to FIG. 6, the data line DL may be electrically connected to the substrate connection electrode CNTb. The data line DL may be electrically connected to a first pad PAD1 (see FIGS. 6 and 7) through a data connection electrode CNTa (see FIG. 7), an etching stopper ES (see FIG. 7), and a substrate connection electrode CNTb.

The connection line CL may be disposed directly on the second surface of the first substrate 11. One end of the connection line CL may form the first pad PAD1, and the other end of the connection line CL may form the second pad PAD2. Although one end of the connection line CL may form the first pad PAD1, and the other end of the connection line CL may form the second pad PAD2 in FIG. 6, it can be said that the connection line CL may be electrically connected to each of the first pad PAD1 and the second pad PAD2. The second pads PAD2 may be associated with the connection lines CL, respectively. There may be second pads PAD2 disposed. The second pads PAD2 may be arranged along the first direction DR1. Some of the connection lines CL may be electrically connected to the first pads PAD1 and may include at least one bent portion extended downward in the second direction DR2.

For example, the connection lines CL may include extension extended from one end of the connection lines CL in the second direction DR2, and a fan-out wiring disposed between the bent portion and the second pad PAD2. Adjacent connection lines CL may become closer to each other in the fan-out wiring. One end of the fan-out wiring may be electrically connected to the extension of the connection line CL, and the other end of the fan-out wiring may be electrically connected to the second pad PAD2.

A chip-on-film COF may be disposed on adjacent second pads PAD2. The chip-on-film COF may be attached on adjacent second pads PAD2. More than one chip-on-films COF may be disposed. The chip-on-films COF may be arranged to be spaced apart from one another in the first direction DR1. Adjacent second pads PAD2 may form a pad group. There may be multiple pad groups. The pad groups may be arranged spaced apart from one another in the first direction DR1. The pad groups may be electrically connected to different chip-on-films COF, respectively. Driving chips IC may be mounted on the chip-on-films COF, respectively. The chip-on-films COF may be disposed in the display area DA of the display device 1. The chip-on-films COF may be disposed on the second surface of the first substrate 11 of the display device 1 and may be disposed in the display area DA, so that it may be possible to avoid the dead space which may occur as the chip-on-films COF are disposed.

Figure 7:
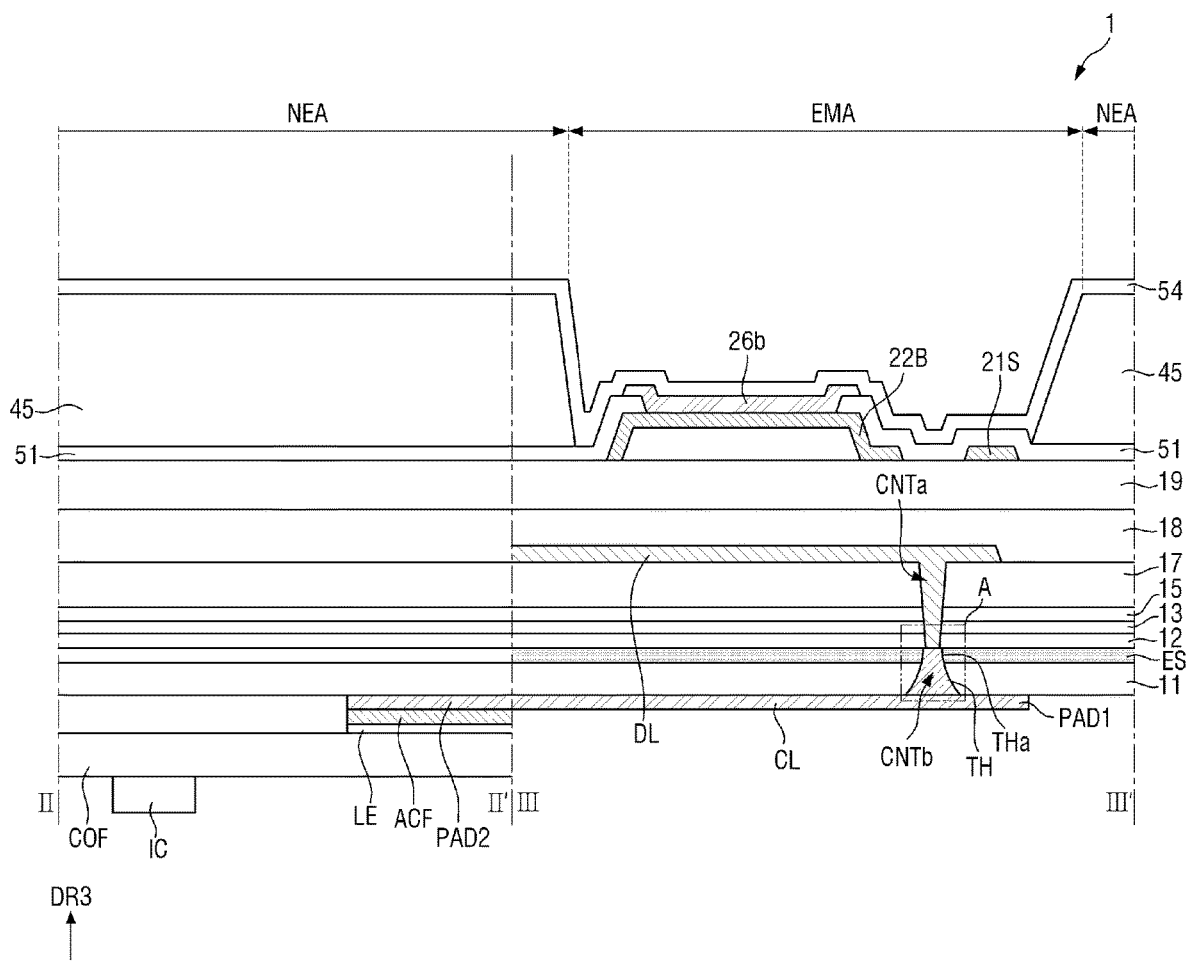
FIG. 7 is a schematic cross-sectional view taken along lines II-II' and III-III' of FIGS. 3 and 6.

FIG. 7 is a schematic cross-sectional view taken along lines II-II' and III-III' of FIGS. 3 and 6. The elements of FIG. 7 that may be identical to those of FIG. 5 will not be described again.

Referring to FIGS. 5 and 7, the etching stopper ES may be disposed on the first surface of the first substrate 11. The etching stopper ES may be disposed between the light-blocking layers BML1 and BML2 and the first surface of the first substrate 11. The etching stopper ES may be disposed directly on the first surface of the first substrate 11. The etching stopper ES may cover a substrate through-hole TH. The etching stopper ES may be disposed on the whole surface of the first substrate 11.

The data line DL may be disposed on the same layer as the first data conductive layer described above with reference to FIG. 5. The data line DL may be disposed on the same layer as the first source/drain electrode DT_SD1 and the second source/drain electrode DT_SD2 disposed on the first data conductive layer, and may include the same material.

The data line DL may be electrically connected to the data connection electrode CNTa penetrating through the first interlayer dielectric layer 17, the first protective layer 15, the first gate insulating layer 13, and the buffer layer 12. The data connection electrode CNTa may include the same material as the data line DL, but the disclosure is not limited thereto. They may include different materials. The data line DL may be electrically connected to the substrate connection electrode CNTb, which will be described later, through the data connection electrode CNTa.

The first substrate 11 may include the substrate through-hole TH. The substrate through-hole TH may completely penetrate through the first substrate 11 in the thickness direction from the first surface to the second surface of the first substrate 11. The substrate through-hole TH may be formed in the emission area EMA. It is, however, to be understood that the disclosure is not limited thereto. The substrate through-hole TH may be formed in the non-emission area NEA.

The etching stopper ES may include a stopper through-hole THa overlapping the substrate through-hole TH. The stopper through-hole THa may completely penetrate through the etching stopper ES in the thickness direction.

The substrate through-hole TH and the stopper through-hole THa may be filled with the substrate connection electrode CNTb. The substrate through-hole TH and the stopper through-hole THa may be completely filled with the substrate connection electrode CNTb. The substrate connection electrode CNTb may be in contact with the side surfaces of the substrate through-hole TH (or inner surfaces) of the first substrate 11 and the side surfaces of the stopper through-hole THa (or inner surfaces) of the etching stopper ES. The substrate connection electrode CNTb may include a conductive material. For example, the substrate connection electrode CNTb may include at least one of molybdenum (Mo), aluminum (Al), chromium (Cr), gold (Au), titanium (Ti), nickel (Ni), neodymium (Nd) and copper (Cu) or an alloy thereof. The substrate connection electrode CNTb may be made up of a single layer made of the above-described materials. In some embodiments, the substrate connection electrode CNTb may be made up of multiple layers made of the above-described materials. The substrate connection electrode CNTb may be electrically connected to the data connection electrode CNTa. The substrate connection electrode CNTb may be in contact with the data connection electrode CNTa. The substrate connection electrode CNTb may be electrically connected to the data connection electrode CNTa.

A connection line CL may be disposed on the other surface (or back surface) of the first substrate 11. The connection line CL may be disposed directly on the second surface of the first substrate 11. One end of the connection line CL may be electrically connected to the first pad PAD1, and the other end of the connection line CL may be electrically connected to the second pad PAD2. The first pad PAD1 may overlap the substrate connection electrode CNTb in the thickness direction and may be in direct contact with the substrate connection electrode CNTb. The first pad PAD1 may be electrically connected to the substrate connection electrode CNTb. The connection line CL, the first pad PAD1 and the second pad PAD2 may be disposed on the same layer and may include the same material. It is, however, to be understood that the disclosure is not limited thereto. The connection line CL, the first pad PAD1 and the second pad PAD2 may include different materials.

The connection line CL may include a conductive material. For example, the connection line CL may include at least one of molybdenum (Mo), aluminum (Al), chromium (Cr), gold (Au), titanium (Ti), nickel (Ni), neodymium (Nd) and copper (Cu) or an alloy thereof. The connection line CL may be made up of a single layer made of the above-described material. In some embodiments, the connection line CL may be made up of multiple layers made of the above-described materials.

A chip-on-film COF may be attached on the second pad PAD2. The chip-on-film COF may include a lead line LE. An anisotropic conductive film ACF may be disposed between the lead line LE and the second pad PAD2. The lead line LE may be electrically connected to the second pad PAD2 using an anisotropic conductive film ACF. A driving chip IC may be mounted on the chip-on-film COF. The driving chip IC may be mounted on the opposite surface to the surface of the chip-on-film COF on which the lead line LE is disposed, but the disclosure is not limited thereto. The lead line LE as well as the driving chip IC may be disposed on the same surface of the chip-on-film COF.

The driving chip IC may serve to apply a data signal to each data line DL. Data signals provided from the driving chip IC may be transferred to the data line DL through the second pad PAD2, the connection line CL, the first pad PAD1, the substrate connection electrode CNTb, the etching stopper ES and the data connection electrode CNTa.

In some embodiments, the chip-on-film COF may be eliminated. In such case, the driving chip IC may overlap the second pads PAD2 in the thickness direction. For example, the driving chip IC may be electrically connected to the second pads PAD2 through the anisotropic conductive film ACF. The driving chip IC may be electrically connected to the second pads PAD2.

Hereinafter, the shape of the substrate through-hole TH will be described with reference to FIG. 8.

Figure 8:
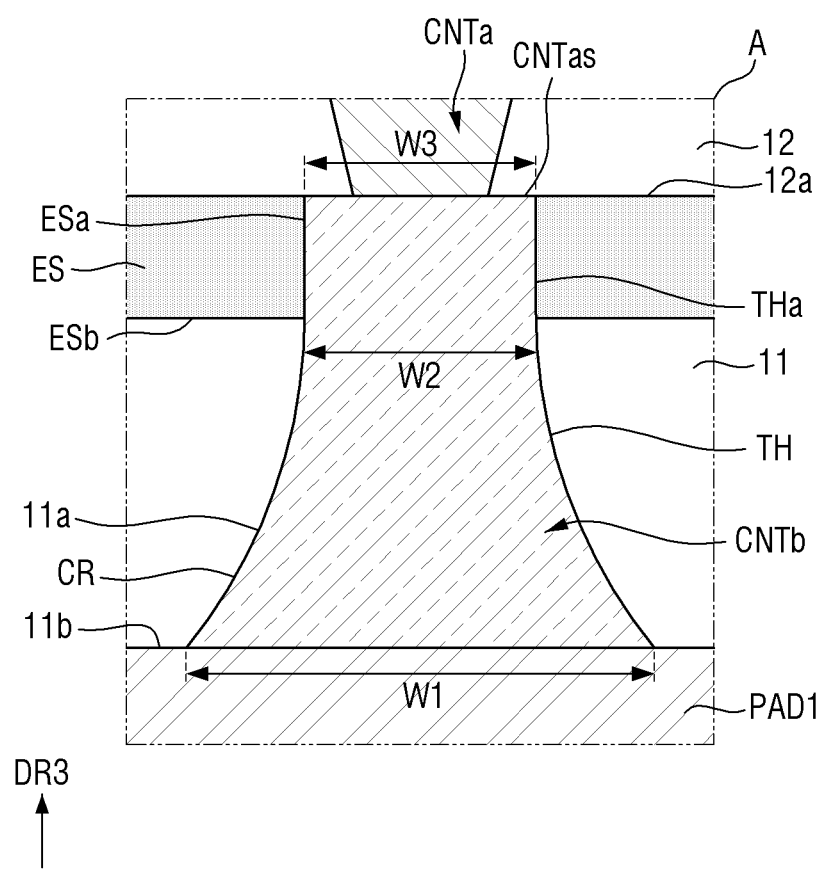
FIG. 8 is an enlarged schematic cross-sectional view of area A of FIG. 7.

FIG. 8 is an enlarged schematic cross-sectional view of area A of FIG. 7.

Referring to FIG. 8, the first substrate 11 may include a first surface and a second surface 11b. The first substrate 11 may further include side surfaces 11a in contact with the substrate through-hole TH. The etching stopper ES may include a first surface and a second surface ESb opposite to the first substrate. The etching stopper ES may further include a side surface ESa in contact with the stopper through-hole THa.

The substrate through-hole TH may be surrounded by an extension line of the first surface of the first substrate 11, an extension line of the second surface 11b of the first substrate 11, and the side surfaces 11a of the first substrate 11. The extension line of the first surface of the first substrate 11 may meet with the first surface of the adjacent first substrate 11. The extension line of the second surface 11b of the first substrate 11 may meet the second surface 11b of the adjacent first substrate 11. Each of the side surfaces 11a of the first substrate 11 may connect the point where the extension line of the first surface of the first substrate 11 meets the first surface of the first substrate 11 with the point where the extension line of the second surface 11b of the first substrate 11 meets the second surface 11b of the first substrate 11.

The width of the substrate through-hole TH may decrease toward the extension line of the first surface of the first substrate 11 from the extension line of the second surface 11b of the first substrate 11. The width of the substrate through-hole TH may include a second width W2 equal to the length of the extension line of the first surface of the first substrate 11, and a first width W1 equal to the length of the extension line of the second surface 11b of the first substrate 11. According to an embodiment of the disclosure, the second width W2 may be smaller than the first width W1.

The side surfaces 11a of the first substrate 11 forming the substrate through-hole TH may form curved surfaces CR.

The curved surfaces CR formed by the side surfaces 11a of the first substrate 11 may have a convex cross-sectional shape toward the substrate through-hole TH.

Moreover, the slope of each of the side surfaces 11a of the first substrate 11 may become sharp gradually from the point where the extension line of the second surface 11b of the first substrate 11 meets the second surface 11b of the first substrate 11 toward the point where the extension line of the first surface of the first substrate 11 meets the first surface of the first substrate 11.

The etching stopper ES may include a first surface and a second surface ESb in contact with the first surface of the first substrate 11. Moreover, the etching stopper ES may further include side surfaces ESa in contact with the stopper through-hole THa. The first surface of the etching stopper ES may be in contact with the first surface 12a of the buffer layer 12. The stopper through-hole THa may be surrounded by the extension line of the first surface of the etching stopper ES, the extension line of the second surface ESb of the etching stopper ES, and the side surfaces ESa of the etching stopper ES.

The average slope of the side surfaces ESa of the etching stopper ES may be greater than the average slope of the side surface 11a of the first substrate 11.

In the stopper through-hole THa, the width of the extension line of the first surface of the etching stopper ES or the upper width of the stopper through-hole THa may be equal to the width of the extension line of the second surface ESb of the etching stopper ES or the lower width of the stopper through-hole THa. For example, the width W3 of the stopper through-hole THa may be constant along the thickness direction. In such case, the direction in which the side surface ESa of the etching stopper ES is extended may be perpendicular to the direction in which the other surface ESb of the etching stopper ES is extended.

The width W3 of the extension line of the second surface ESb of the etching stopper ES may be substantially equal to the width W2 of the substrate through-hole TH. In such case, the side surfaces ESa of the etching stopper ES and the side surfaces 11a of the first substrate 11 may be continuously connected.

According to an embodiment of the disclosure, the substrate through-hole TH may be formed by laser irradiation and wet etching.

For example, a laser may be irradiated onto a location where the substrate through-hole TH is to be formed. The laser may be a femtosecond laser. Herein, the femtosecond laser may refer to a laser having a pulse width of about 200 to about 500 femtoseconds. It is, however, to be understood that the disclosure is not limited thereto. The laser LS may be light in a short wavelength range from a near infrared (IR) laser to an ultraviolet (UV) laser, or may be light in a multi-wavelength range including light in various wavelength ranges.

The laser may be irradiated from the second surface of the first substrate to the first surface in contact with the etching stopper ES. The focus of the laser may be formed at a variety of locations. According to an embodiment of the disclosure, the focus of the laser may be formed on, but is not limited to, the first surface of the first substrate 11.

In case that the laser is irradiated to the location where the substrate through-hole TH is to be formed, the structure of the location may be deformed. For example, the Si—O bond of the glass at the location that forms the first substrate may be broken. Accordingly, the etch selectivity at that location for the etch solution may be greater than the etch selectivity in the other locations where no laser is irradiated.

After laser irradiation, the whole surface of the first substrate may be etched. Wet etching may be employed as the etching. As the etching solution during the etching step, a basic solution such as potassium hydroxide (KOH) and sodium hydroxide (NaOH), or an acidic solution such as hydrofluoric acid (HF) may be used. The wet etching may be performed throughout the whole surface of the first substrate.

As described above, the etch selectivity for the etch solution at the location irradiated with the laser may be greater than the etch selectivity in the other locations where no laser is irradiated, and thus the substrate through-hole TH may be formed at the location irradiated with the laser as a result of the wet etching.

The etching selectivity of the first substrate for the etching solution during the etching process may be much greater than that of the etching stopper ES. Therefore, even if the etching solution comes into contact with the etching stopper ES during the etching process, the first surface of the etching stopper ES may not be substantially etched.

According to the embodiment of the disclosure, laser irradiation and wet etching may be performed together during the process of forming the substrate through-hole TH, and thus good processing quality, high speed and high aspect ratio (width relative to the thickness of the substrate through-hole TH) of the substrate through-hole TH can be achieved. Furthermore, compared to laser drilling using a laser to drill a substrate through-hole, physical damage to the substrate may be small and the strength of the substrate may be excellent.

Furthermore, the etching stopper ES may be disposed to cover the substrate through-hole TH, so that it may be possible to prevent the etching solution from diffusing to the first surface of the first substrate during the process of forming the substrate through-hole TH. In this manner, it may be possible to prevent corrosion and/or etching of the electrodes on the first substrate due to the etching solution.

Further, as described above, since the substrate connection electrode CNTb is disposed in the display area DA, the chip-on-film COF electrically connected to the substrate connection electrode CNTb may be disposed on the second surface of the first substrate 11 of the display device 1 and may be disposed in the display area DA. In this manner, it may be possible to reduce the dead space due to the chip-on-film (COF) and fan-out wiring.

Hereinafter, a method of fabricating a display device 1 according to an embodiment of the disclosure will be described. In the following description, the same or similar elements will be denoted by the same or similar reference numerals, and redundant descriptions will be omitted or briefly described.

Figure 9:
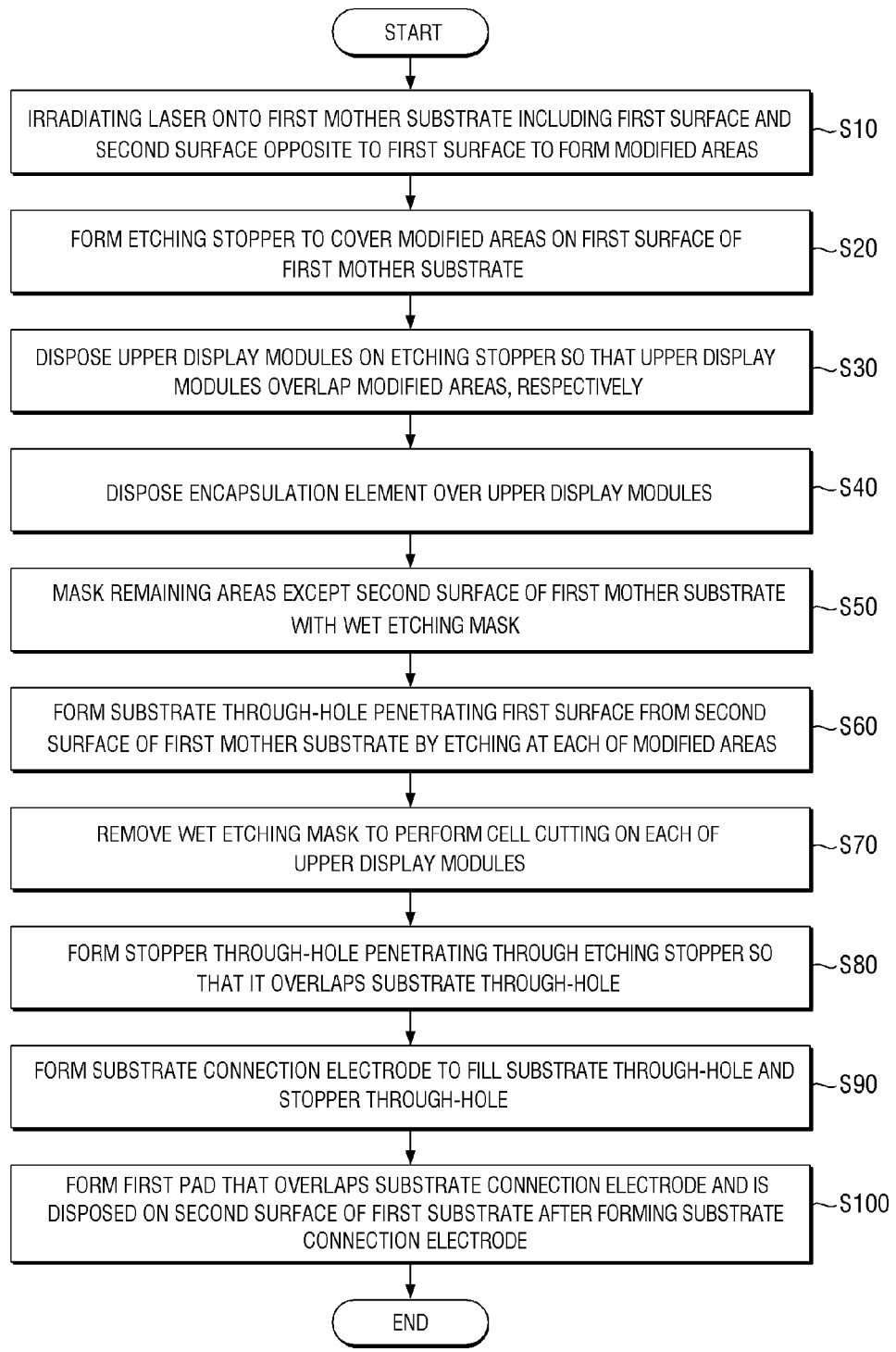
FIG. 9 is a flowchart illustrating a method for fabricating a display device according to an embodiment of the disclosure.
Figure 17:
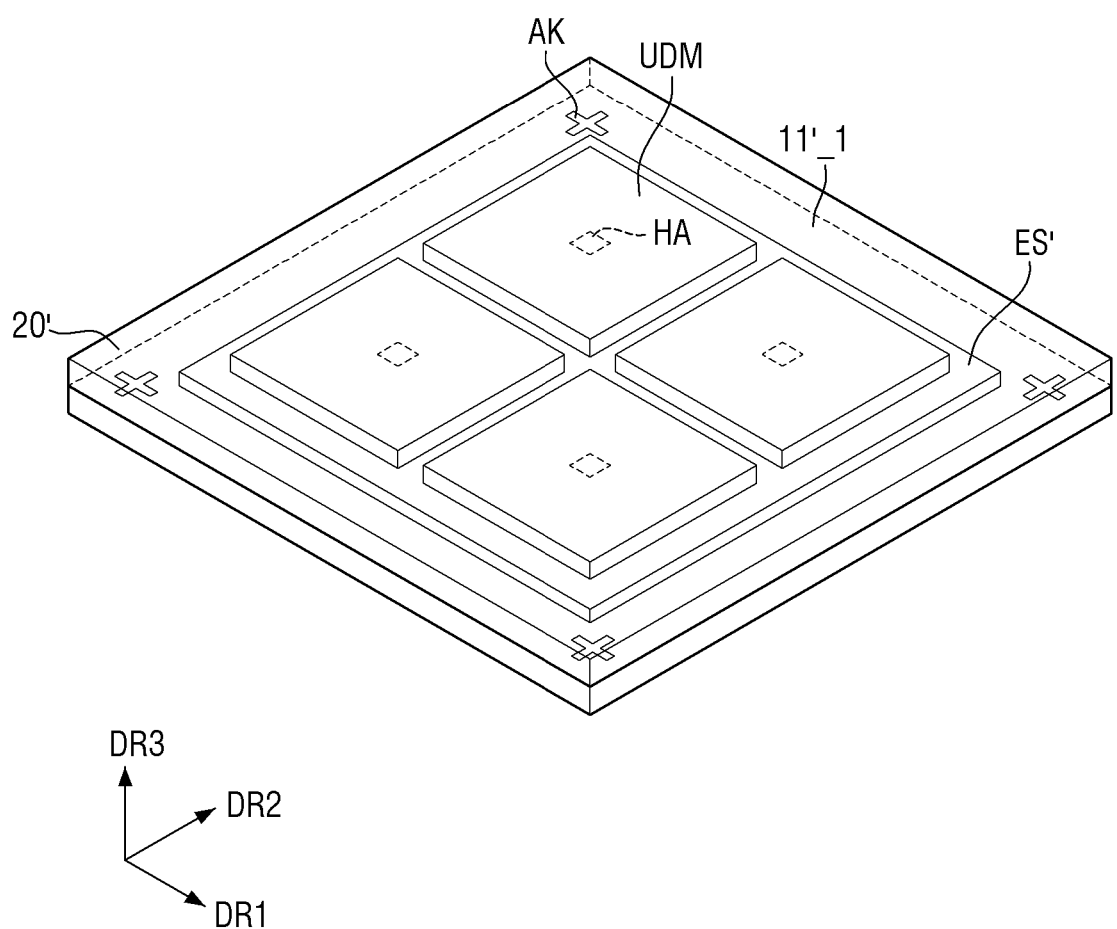
Figure 18:
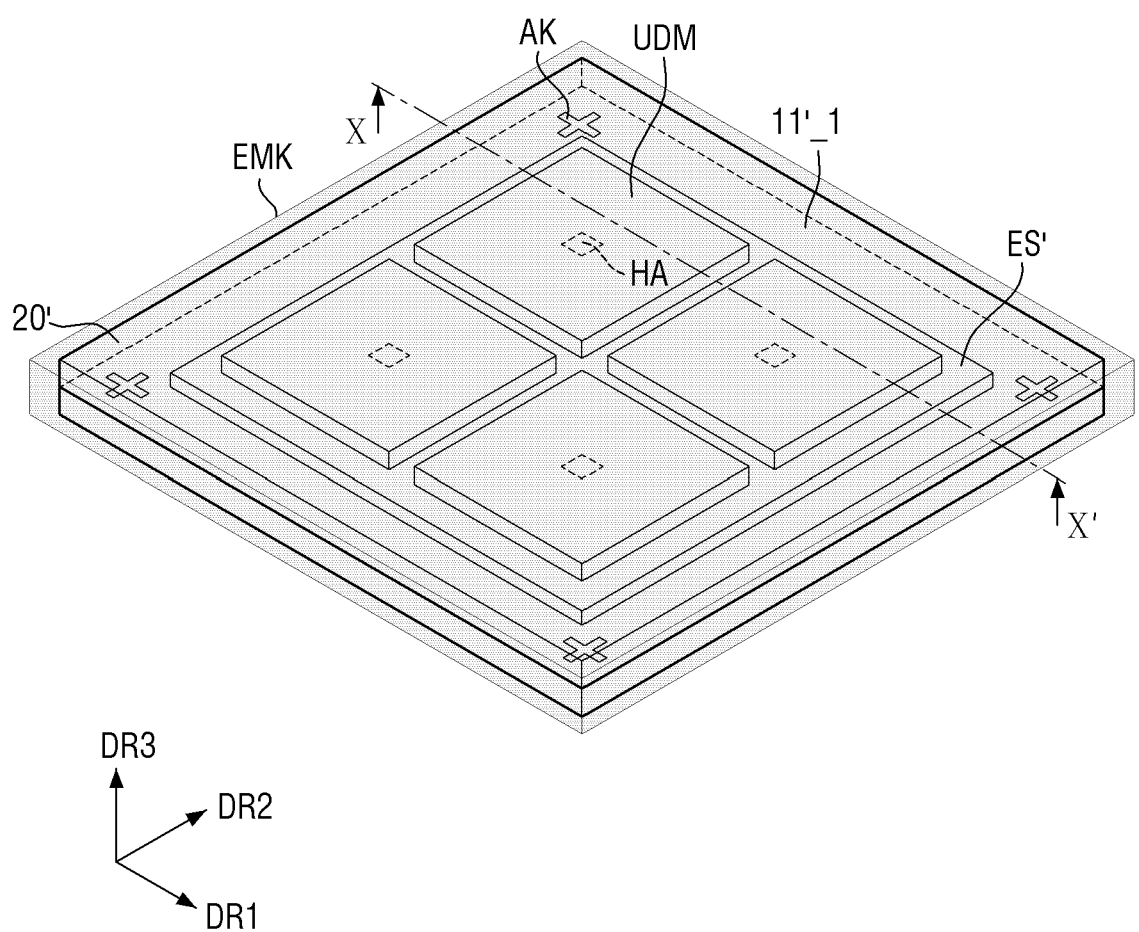
Figure 19:
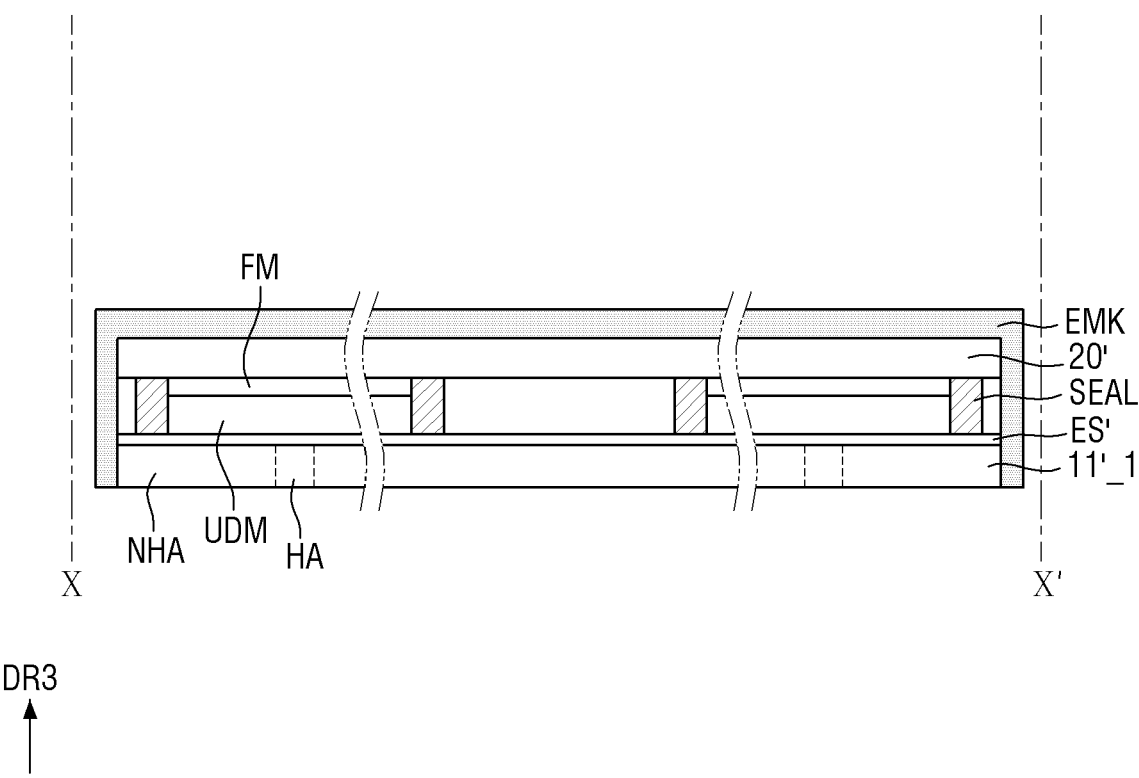
FIG. 19 is a schematic cross-sectional view taken along line X-X' of FIG. 18.

FIG. 9 is a flowchart illustrating a method for fabricating a display device according to an embodiment of the disclosure. FIGS. 10, 11, 13, 15, 17 and 18 are schematic perspective views showing processing steps of a method of fabricating a display device according to an embodiment of the disclosure. FIG. 12 is a schematic cross-sectional view taken along line VII-VII' of FIG. 11. FIG. 14 is a schematic cross-sectional view taken along line VIII-VIII of FIG. 13. FIG. 16 is a schematic cross-sectional view taken along line IX-IX' of FIG. 15. FIG. 19 is a schematic cross-sectional view taken along line X-X' of FIG. 18. FIGS. 20 to 24 are schematic cross-sectional views illustrating processing steps of a method of fabricating a display device according to an embodiment of the disclosure.

Figure 10:
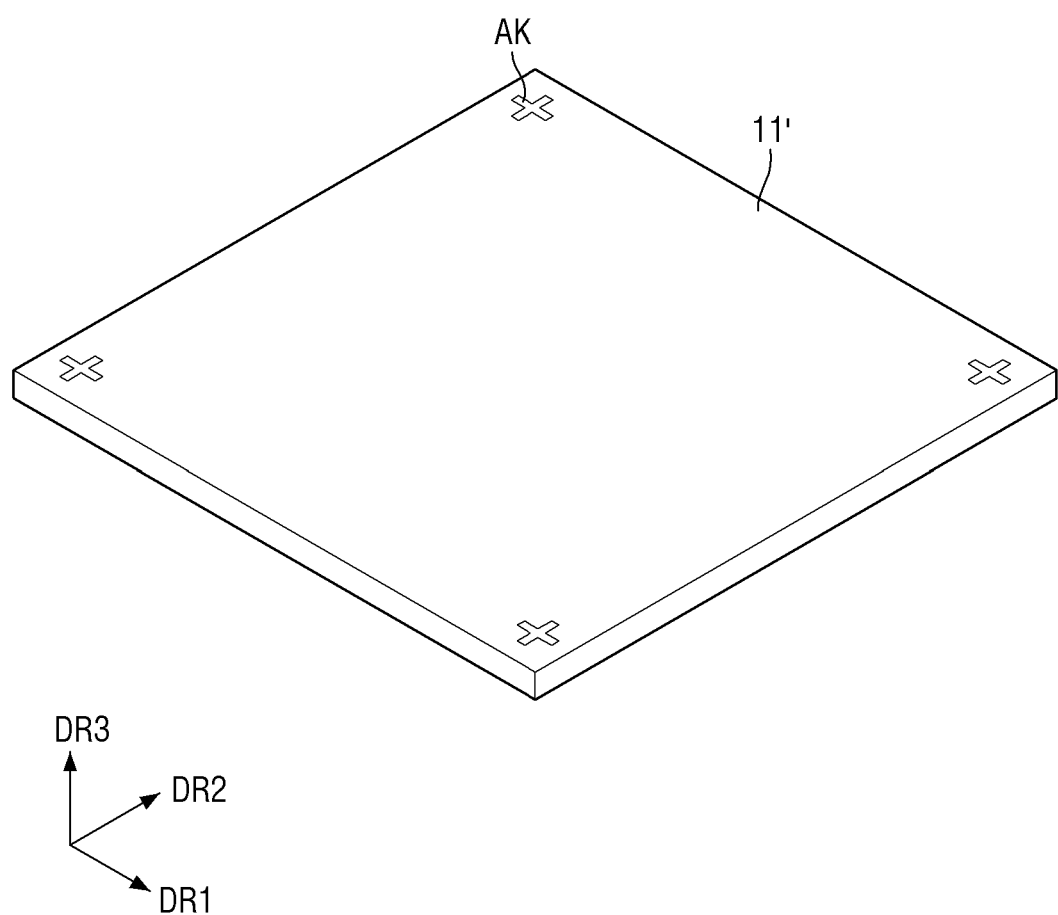
FIGS. 10, 11, 13, 15, 17 and 18 are schematic perspective views showing processing steps of a method of fabricating a display device according to an embodiment of the disclosure.

Initially, a first mother substrate 11' may be prepared with reference to FIGS. 9 and 10. The first mother substrate 11' may be an insulating substrate. The first mother substrate 11' may be made of an insulating material such as glass, quartz, a polymer resin, or a combination thereof. The first mother substrate 11' may be either a rigid substrate or a flexible substrate that can be bent, folded, or rolled. The first mother substrate 11' may be a mother substrate of the first substrate 11 described above with reference to FIGS. 5 and 7.

The first mother substrate 11' may have a rectangular shape or a square shape. The first mother substrate 11' may include first sides extended in the first direction DR1 and second sides extended in the second direction DR2.

Alignment marks AK may be formed around the corners where the first sides and the second sides of the first mother substrate 11' meet. The alignment marks AK may be formed by a laser or the like. In some embodiments, the alignment marks AK may be formed by an electron beam.

Figure 11:
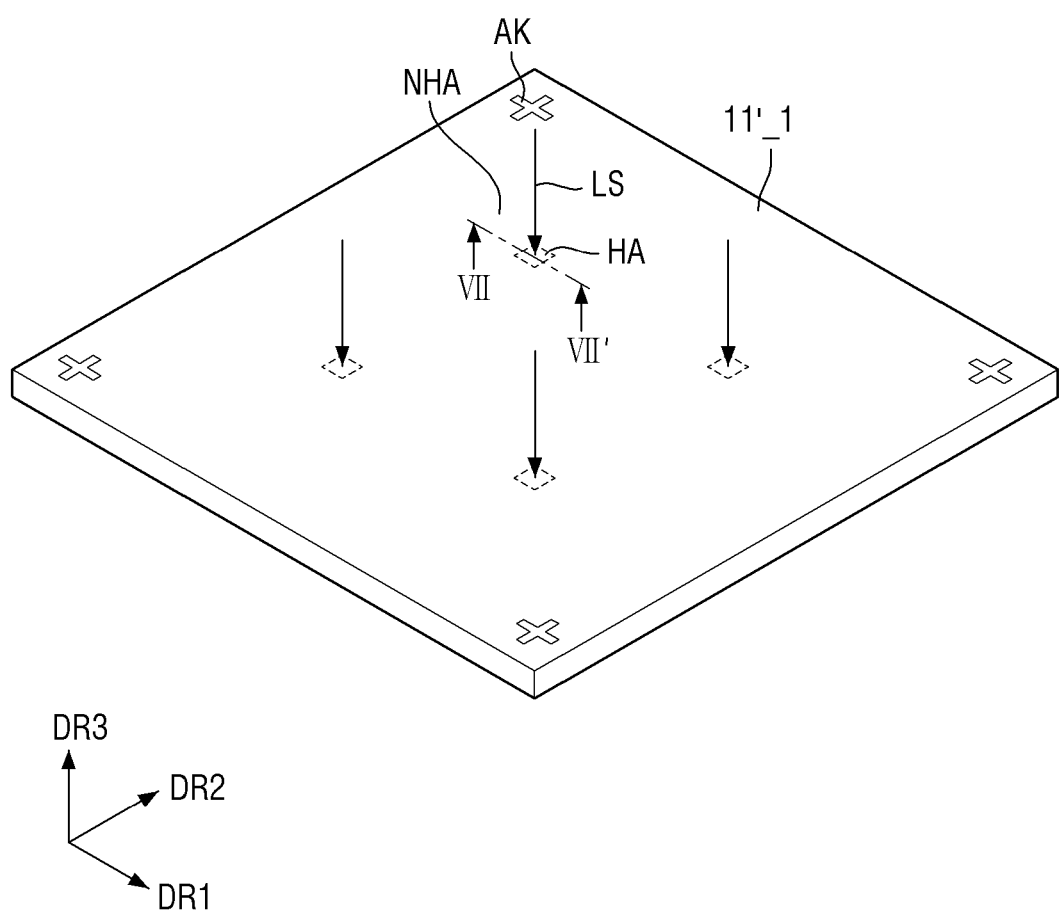
Figure 12:
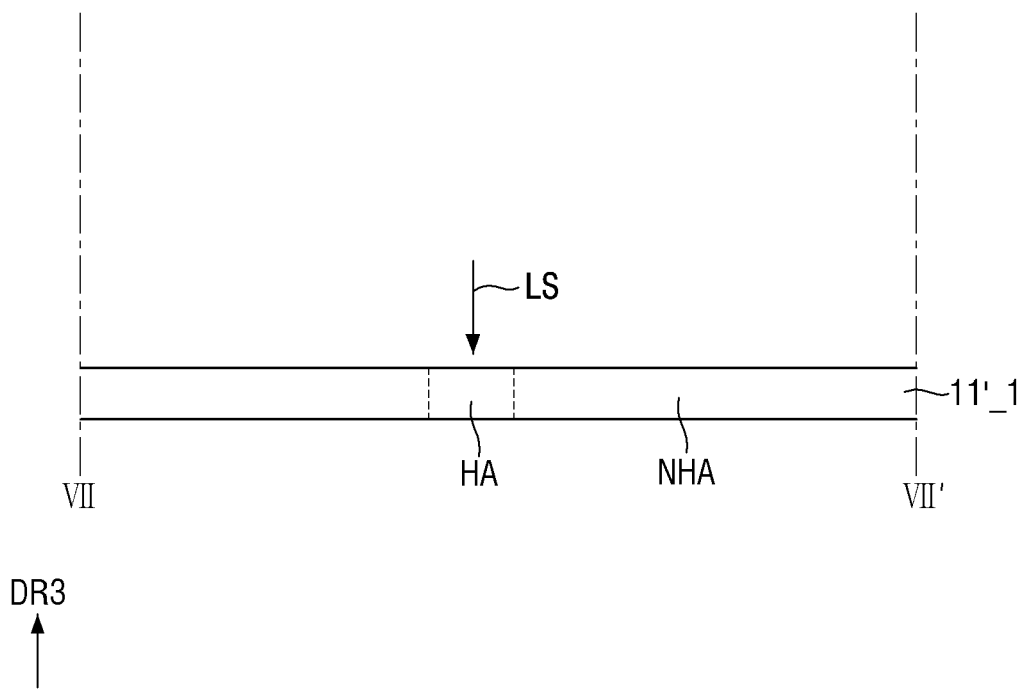
FIG. 12 is a schematic cross-sectional view taken along line VII-VII' of FIG. 11.

Referring to FIGS. 9, 11 and 12, the first mother substrate 11' including a first surface and a second surface opposite to the first surface may be irradiated with a laser LS, so that a first mother substrate 11_1' including modified areas HA may be formed (step S10). The areas other than the modified area HA may be defined as a non-modified area NHA. The modified areas HA may become the substrate through-holes TH, which will be described later.

The laser LS may be a femtosecond laser. Herein, the femtosecond laser may refer to a laser having a pulse width of about 200 to about 500 femtoseconds. It is, however, to be understood that the disclosure is not limited thereto. The laser LS may be light in a short wavelength range from a near infrared (IR) laser to an ultraviolet (UV) laser, or may be light in a multi-wavelength range including light in various wavelength ranges.

The laser LS may be irradiated from the first surface to the second surface of the first mother substrate 11'. The focus of the laser may be formed at a variety of locations. According to an embodiment of the disclosure, the focus of the laser may be formed on, but is not limited to, the second surface of the first mother substrate 11'.

The structure of the first mother substrate 11'_1 may be deformed at the modified areas HA. For example, the Si—O bond of the illustrated glass forming the first mother substrate 11'_1 at that location may be broken. Accordingly, the etch selectivity at that location for the etch solution may be greater than the etch selectivity in the other locations where no laser LS may be irradiated.

Subsequently, referring to FIGS. 9, 13 and 14, an etching stopper ES' may be formed on the first surface of the first mother substrate 11'_1 to cover the modified areas HA (step S20). The modified areas HA may overlap the etching stopper ES' in the thickness direction. The etching stopper ES' may include an organic material. In some embodiments, the etching stopper ES' may include an inorganic material.

Figure 15:
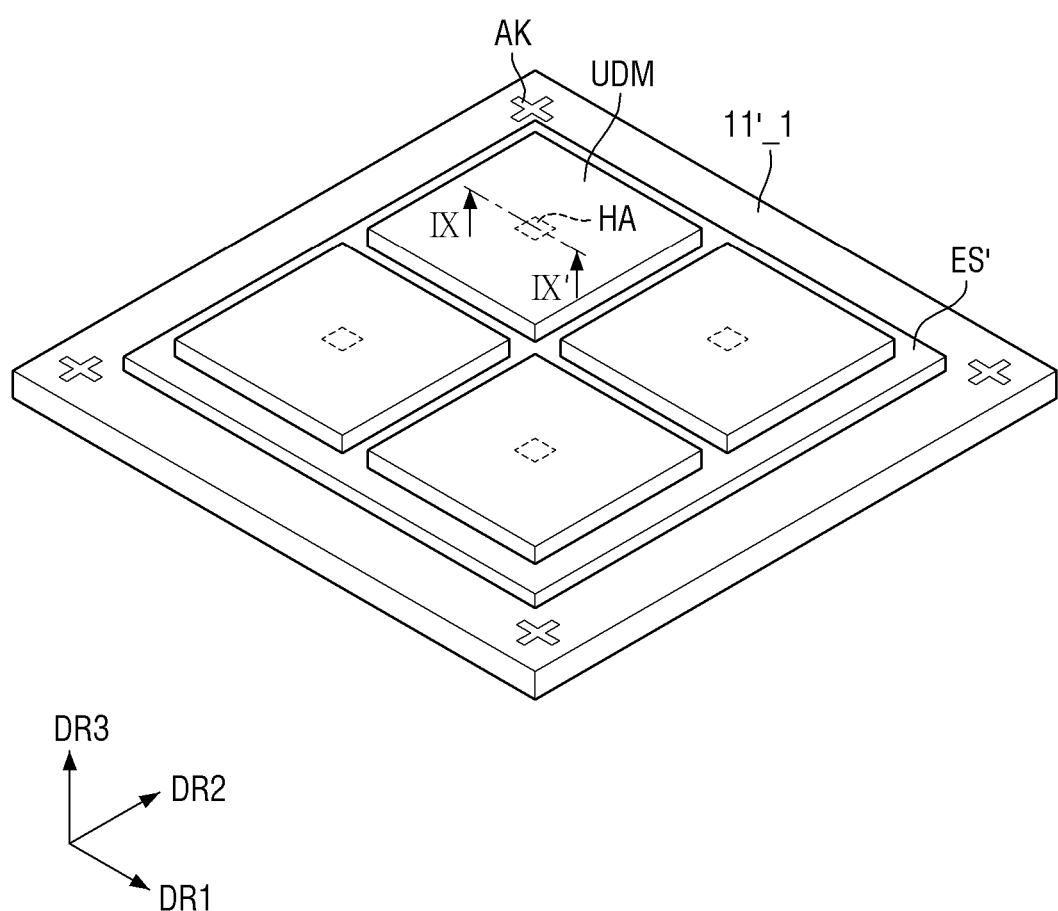
Figure 16:
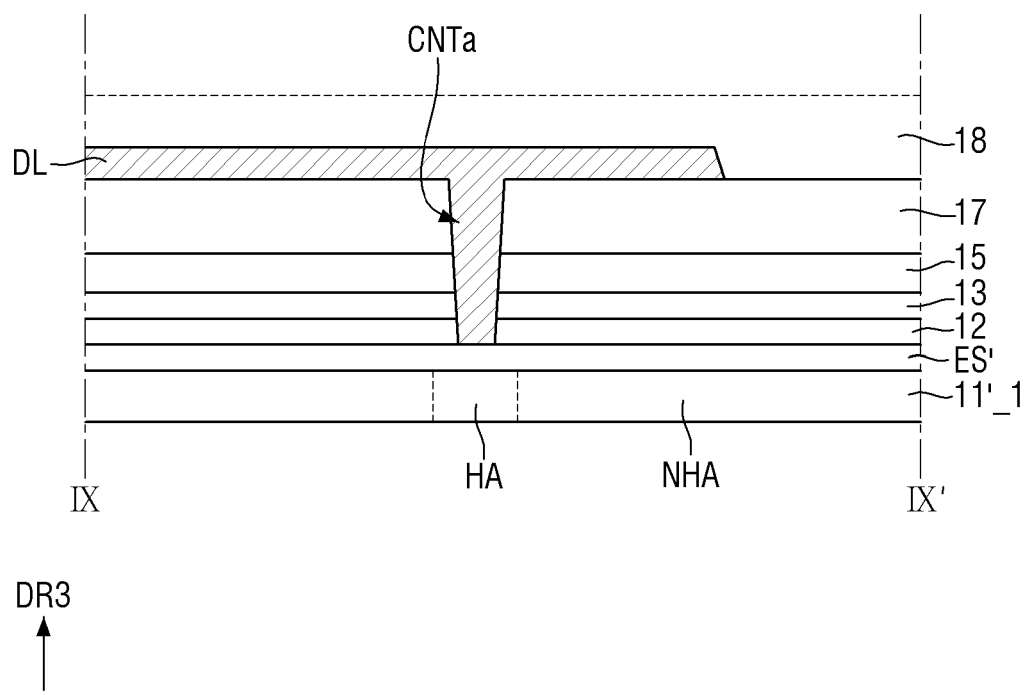
FIG. 16 is a schematic cross-sectional view taken along line IX-IX' of FIG. 15.

Referring to FIGS. 9, 15 and 16, upper display modules UDM may be disposed on the etching stopper ES' so that the upper display modules UDM overlap the modified areas HA, respectively (step S30). The upper display modules UDM may refer to the elements disposed on the etching stopper ES described above with reference to FIGS. 5 and 7.

Although the four upper display modules UDM may be disposed on the first mother substrate 11'_1 in the example shown in FIG. 15, the number of upper display modules UDM is not limited to four. The number of the upper display modules UDM may be one, two, three, five or more.

The upper display modules UDM may be physically separated from one another. The upper display modules UDM may be disposed relative to the alignment marks AK described above.

Referring to FIG. 16, as the upper display module UDM, a data line DL on the first interlayer dielectric layer 17, and a data connection electrode CNTa electrically connected to the data line DL and penetrating the interlayer dielectric layer 17, the first protective layer 15, the first gate insulating layer 13 and the buffer layer 12 are shown. The data connection electrode CNTa may be in contact with the etching stopper ES'.

Subsequently, referring to FIGS. 9 and 17, an encapsulation element may be disposed over the upper display modules UDM (step S40). The encapsulation element may include, for example, a second mother substrate 20'. The second mother substrate 20' may be a mother substrate of the second display substrate 20 described above with reference to FIG. 2.

The etching stopper ES' and the upper display modules UDM may be disposed between the second mother substrate 20' and the first mother substrate 11'_1. Furthermore, the second mother substrate 20' and the first mother substrate 11'_1 may be coupled with each other by a sealing member to be described later.

Subsequently, referring to FIGS. 9, 18 and 19, the remaining areas or other elements shown in FIG. 17 except for the second surface of the first mother substrate 11'_1 may be masked with a wet etching mask EMK (step S50). For example, the side surfaces of the first mother substrate 11'_1, the side surfaces of the second mother substrate 20', and the upper surface of the second mother substrate 20' may be masked with the wet etch mask EMK. The wet etching mask EMK may include a material that may be hardly etched with respect to a wet etching solution. Therefore, during the process of forming the substrate through-hole by etching, it may be possible to prevent the remaining areas or the elements except for the second surface of the first mother substrate 11'_1 from being brought into contact with the wet etching solution and etched.

The sealing member SEAL may be disposed on each of the side surfaces (first side surface and second side surface) of each of the upper display modules UDM. The sealing member SEAL may be disposed between the second mother substrate 20' and the first mother substrate 11'_1. The sealing member SEAL may be disposed between the etching stopper ES' and the second mother substrate 20'.

According to an embodiment of the disclosure, before the second mother substrate 20' may be formed, the sealing member SEAL may be formed on each of the side surfaces of each of the upper display modules UDM, and the space surrounded by the sealing member SEAL may be filled with a filling material FM. After the second mother substrate 20' is formed, the filling material FM may be disposed between the second mother substrate 20' and the upper display module UDM, and the filling material FM may be in contact with the second mother substrate 20' and the upper display module UDM.

Subsequently, referring to FIGS. 9 and 20, a substrate through-hole TH penetrating the first surface from the second surface of the first mother substrate 11'_1 may be formed by etching in each of the modified areas HA (step S60). The wet etching mask EMK may be removed (step S70).

Figure 20:
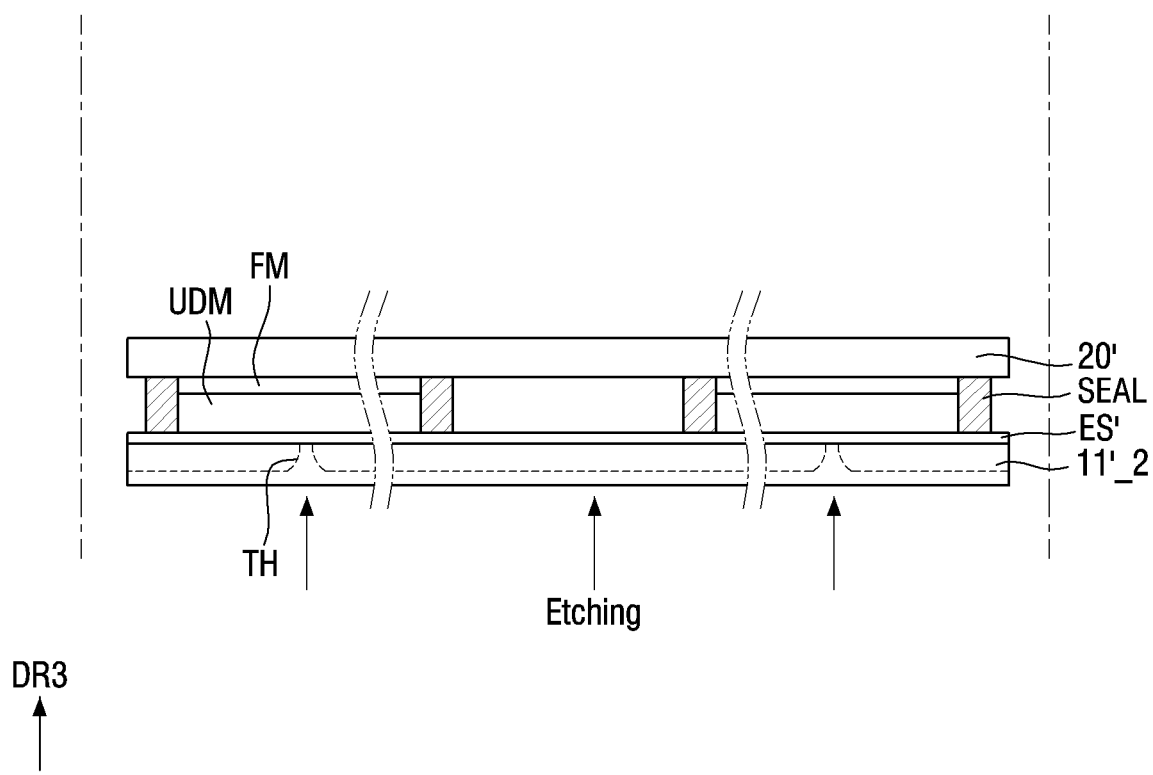
FIGS. 20 to 24 are schematic cross-sectional views illustrating processing steps of a method of fabricating a display device according to an embodiment of the disclosure.

The thickness of the first mother substrate 11'_2 according to the example of FIG. 20 may be smaller than the thickness of the first mother substrate 11'_1 according to the example of FIG. 19. This is because the overall thickness of the first mother substrate 11'_1 may be reduced by the etching.

Wet etching may be employed as the etching. As the etching solution during the etching step, a basic solution such as potassium hydroxide (KOH) and sodium hydroxide (NaOH), or an acidic solution such as hydrofluoric acid (HF) may be used. The wet etching may be performed throughout the whole surface of the first mother substrate 11'_1.

The first mother substrate 11'_1 may be etched from the second surface by the etching solution so that the thickness may be gradually reduced. As described above, the etch selectivity at the modified area HA (see FIG. 19) for the etching solution may be greater than the etch selectivity in the non-modified area NHA (see FIG. 19) for the etch solution. Therefore, as a result of the wet etching, the substrate through-hole TH may be formed at the modified area HA (see FIG. 19) as shown in FIGS. 20 and 7.

Figure 21:
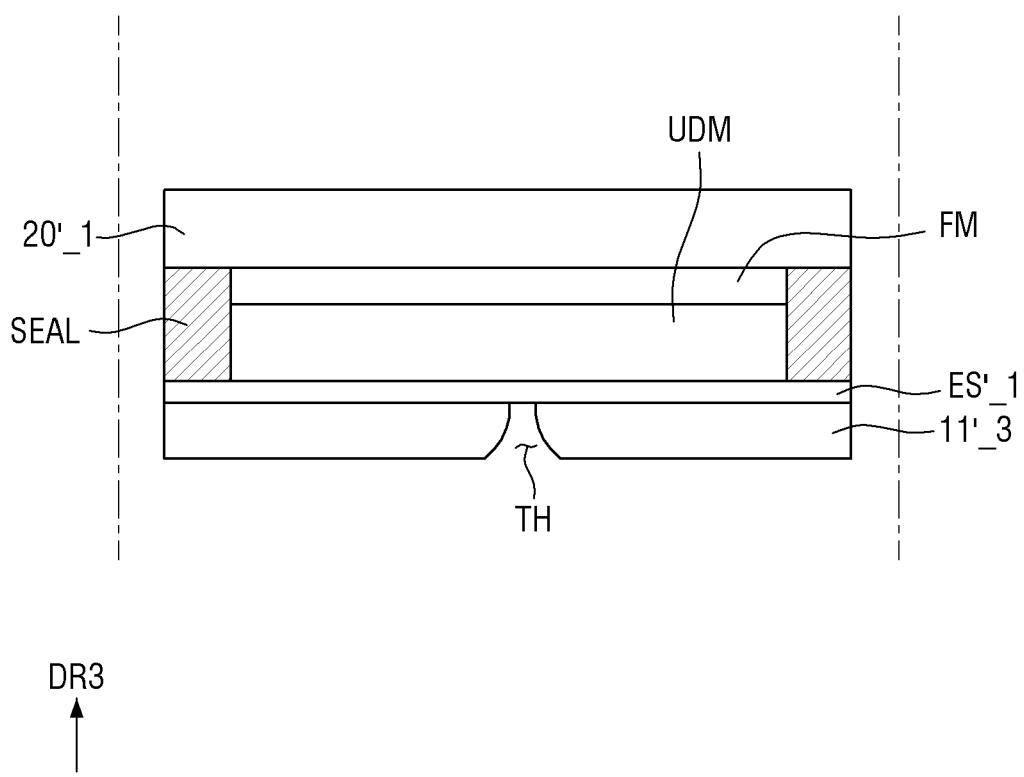

Subsequently, referring to FIGS. 9 and 21, cell cutting may be performed for each of the upper display modules UDM. As a result of the cell cutting S70, the side surfaces of the etching stopper ES'_1 may be exposed to the outside as shown in FIG. 21.

Figure 22:
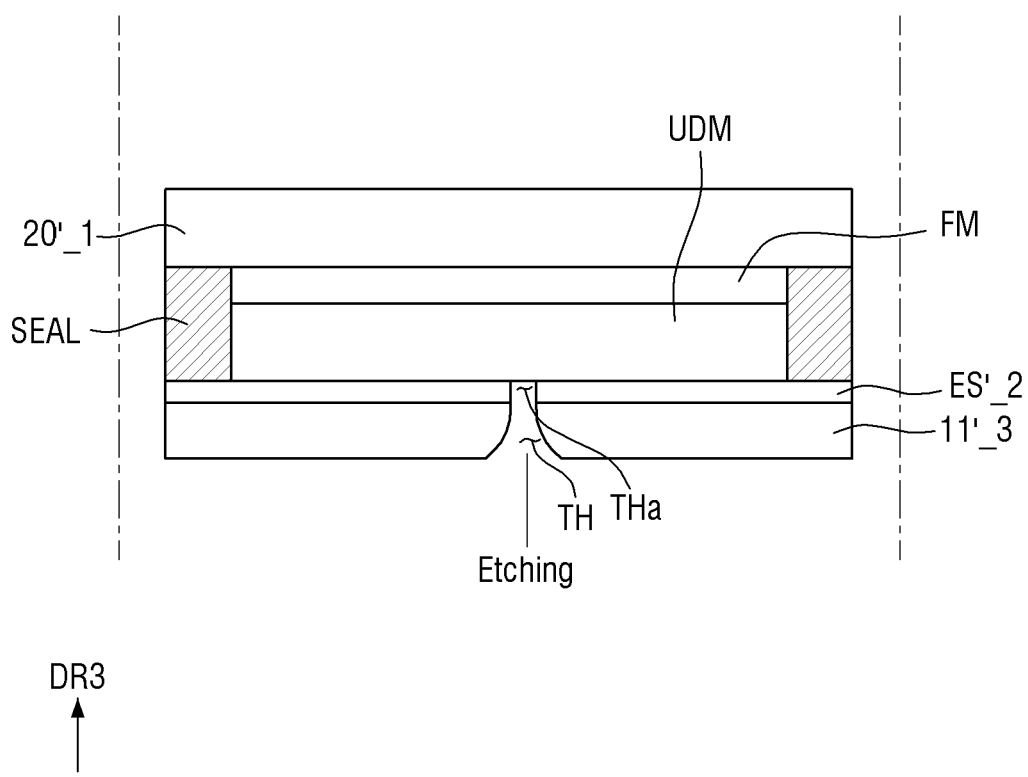

Subsequently, referring to FIGS. 9 and 22, the stopper through-hole THa completely penetrating the etching stopper ES'_1 may be formed in the etching stopper ES'_1 (see FIG. 21) so that may overlaps the substrate through-hole TH (step S80). As a result, as shown in FIG. 22, an etching stopper ES'_2 including the stopper through-hole THa may be formed.

The stopper through-hole THa may be formed by drying etching (step S80). Since the stopper through-hole THa is formed by dry etching while the substrate through-hole TH is formed by wet etching, the average slope of the side surfaces of the etching stopper ES'_2 ESa (see FIG. 8) may be greater than the average slope of the side surfaces of the first substrate 11'_3 11a (see FIG. 8).

Since the stopper through-hole THa is formed by dry etching, a high aspect ratio (width relative to the thickness of the stopper through-hole THa) can be achieved. In some embodiments, the stopper through-hole THa may be formed by wet etching as well.

Figure 23:
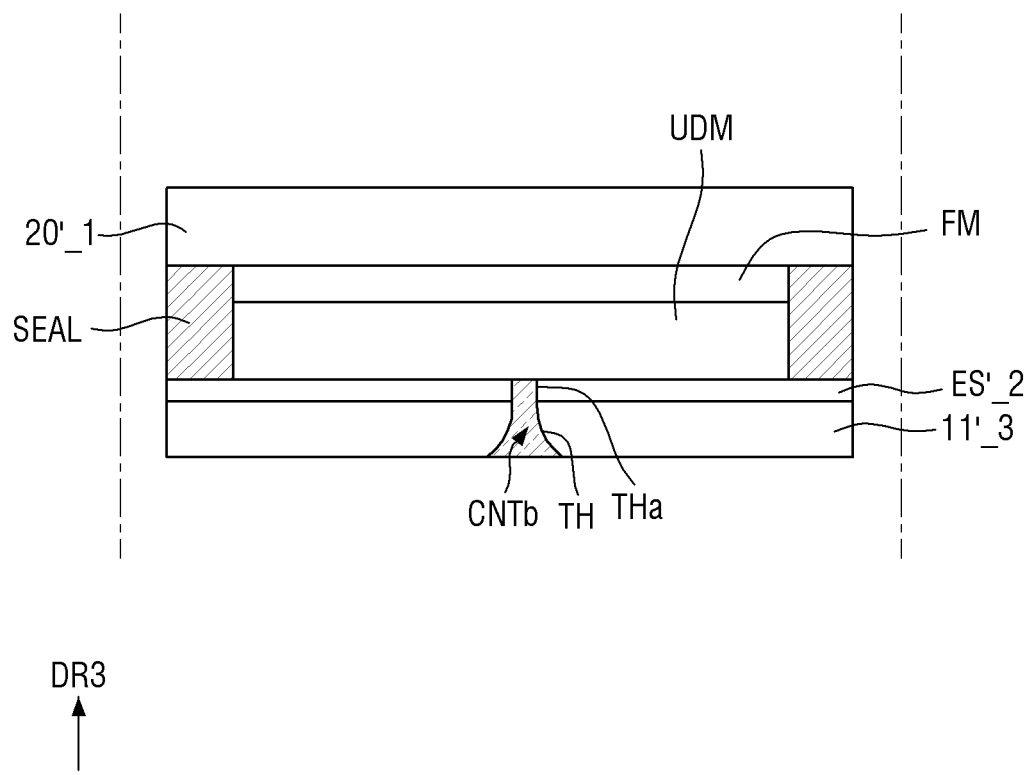

Subsequently, referring to FIGS. 9 and 23, the substrate through-hole TH and the stopper through-hole THa may be filled with a substrate connection electrode CNTb (step S90). The substrate connection electrode CNTb may be electrically connected to the data line DL (see FIG. 16) through the data connection electrode CNTa (see FIG. 16).

After the substrate connection electrode CNTb is formed (step S90), a planarization process may be further performed on the lower surface of the substrate connection electrode CNTb adjacent to the second surface of the first substrate 11'_3.

Figure 24:
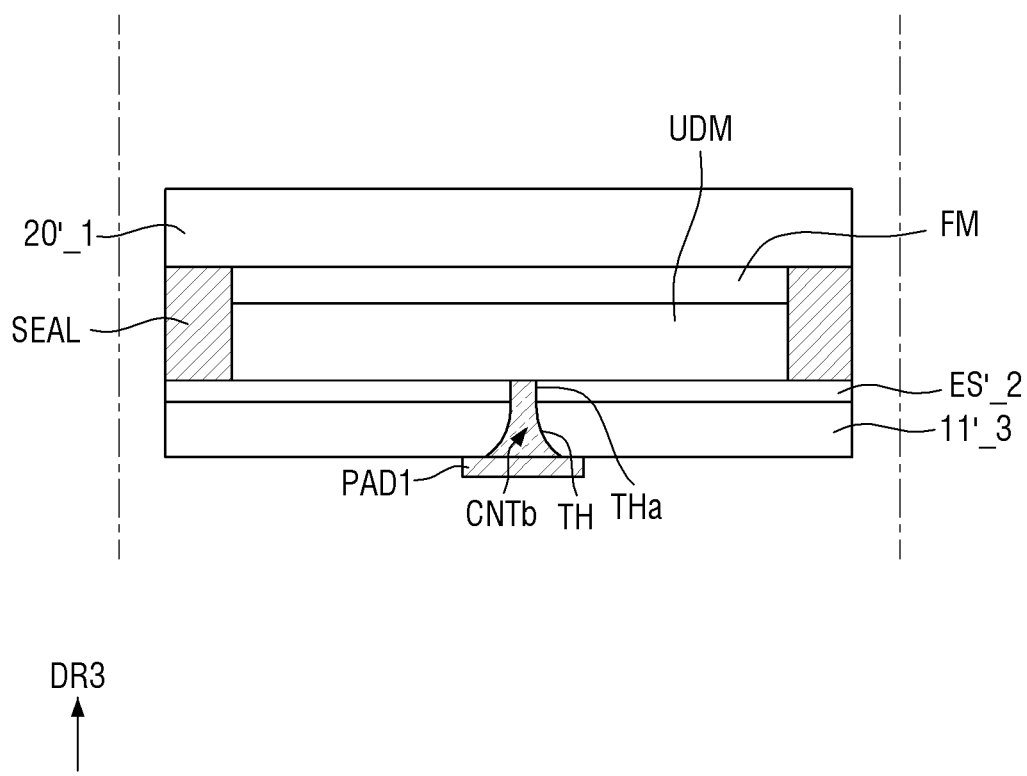
Figure 25:
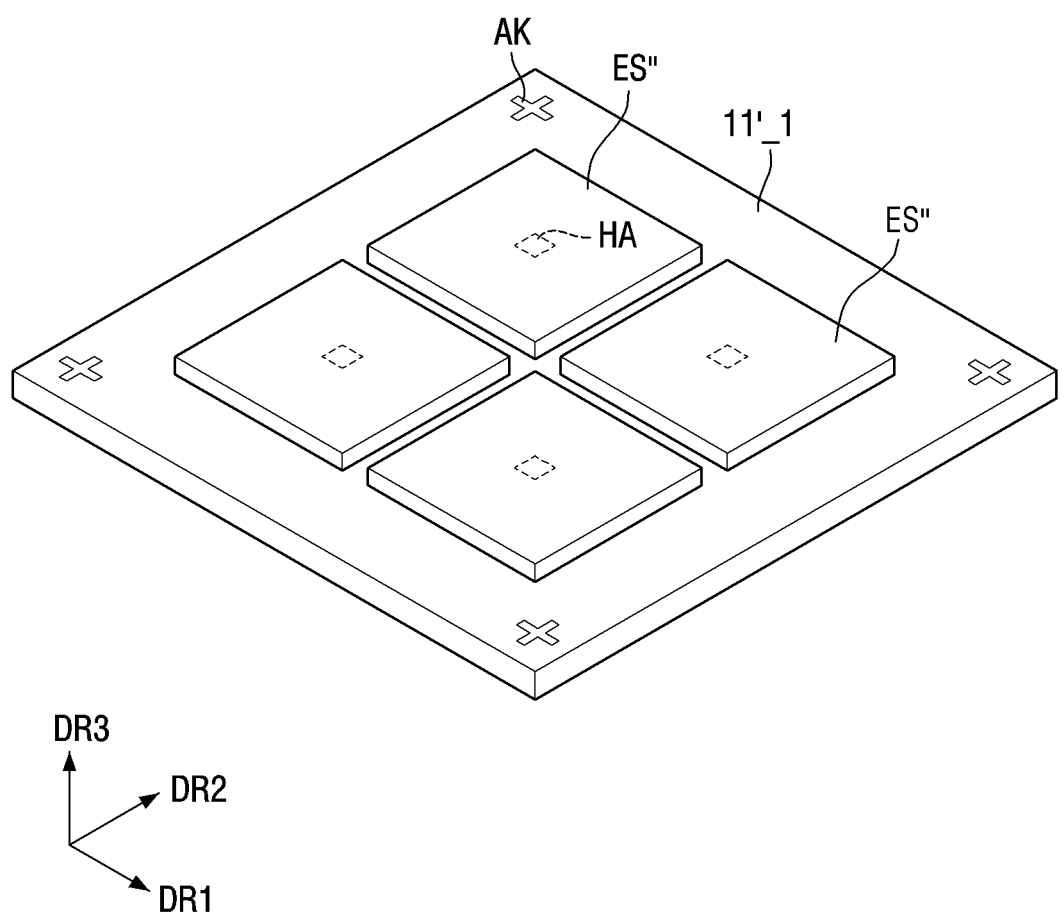
FIGS. 25 to 28 are schematic perspective views showing processing steps of a method of fabricating a display device according to another embodiment of the disclosure.

Subsequently, referring to FIGS. 9 and 24, after the substrate connection electrode CNTb is formed S90, a first pad PAD1 overlapping the substrate connection electrode CNTb and disposed on the second surface of the first substrate 11'_3 may be formed (step S100).

Subsequently, referring to FIG. 7, a first pad PAD1, a connection line CL, and a second pad PAD2 may be formed.

The first pad PAD1, the connection line CL and the second pad PAD2 may be disposed on the second surface (or back surface) of the first substrate 11'_3. One end of the connection line CL may be electrically connected to the first pad PAD1, and the other end of the connection line CL may be electrically connected to the second pad PAD2. The first pad PAD1 may overlap the substrate connection electrode CNTb in the thickness direction and may be in direct contact with the substrate connection electrode CNTb. The first pad PAD1 may be electrically connected to the substrate connection electrode CNTb. The connection line CL, the first pad PAD1 and the second pad PAD2 may be disposed on the same layer and may include the same material. It is, however, to be understood that the disclosure is not limited thereto. The connection line CL, the first pad PAD1 and the second pad PAD2 may include different materials. The connection line CL may include a conductive material. For example, the connection line CL may include at least one of molybdenum (Mo), aluminum (Al), chromium (Cr), gold (Au), titanium (Ti), nickel (Ni), neodymium (Nd) and copper (Cu) or an alloy thereof. The connection line CL may be made up of a single layer made of the above-described material. In some embodiments, the connection line CL may be made up of multiple layers made of the above-described materials.

Subsequently, the chip-on-film COF may be disposed on the second pad PAD2 by the anisotropic conductive film ACF. The lead line LE of the chip-on-film COF may be electrically connected to the second pad PAD2 by the anisotropic conductive film ACF.

According to the method of fabricating a display device according to the embodiment of the disclosure, laser irradiation and wet etching may be performed together during the process of forming the substrate through-hole TH, and thus good processing quality, high speed and high aspect ratio (width relative to the thickness of the substrate through-hole TH) of the substrate through-hole TH can be achieved.

Furthermore, the etching stopper ES may be disposed to cover the substrate through-hole TH, so that it may be possible to prevent the etching solution from diffusing to the first surface of the first mother substrate during the process of forming the substrate through-hole TH. In this manner, it may be possible to prevent corrosion and/or etching of the electrodes on the first mother substrate due to the etching solution.

Figure 27:
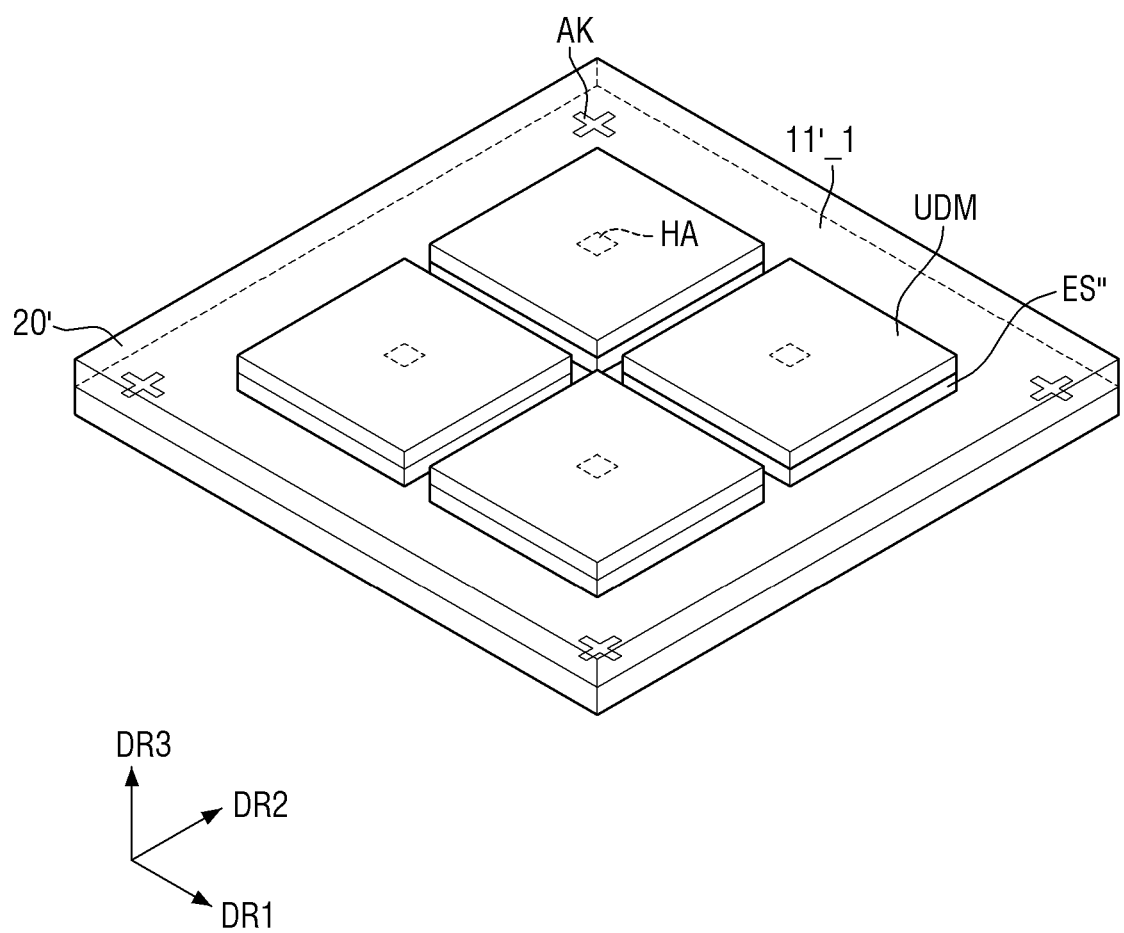
Figure 28:
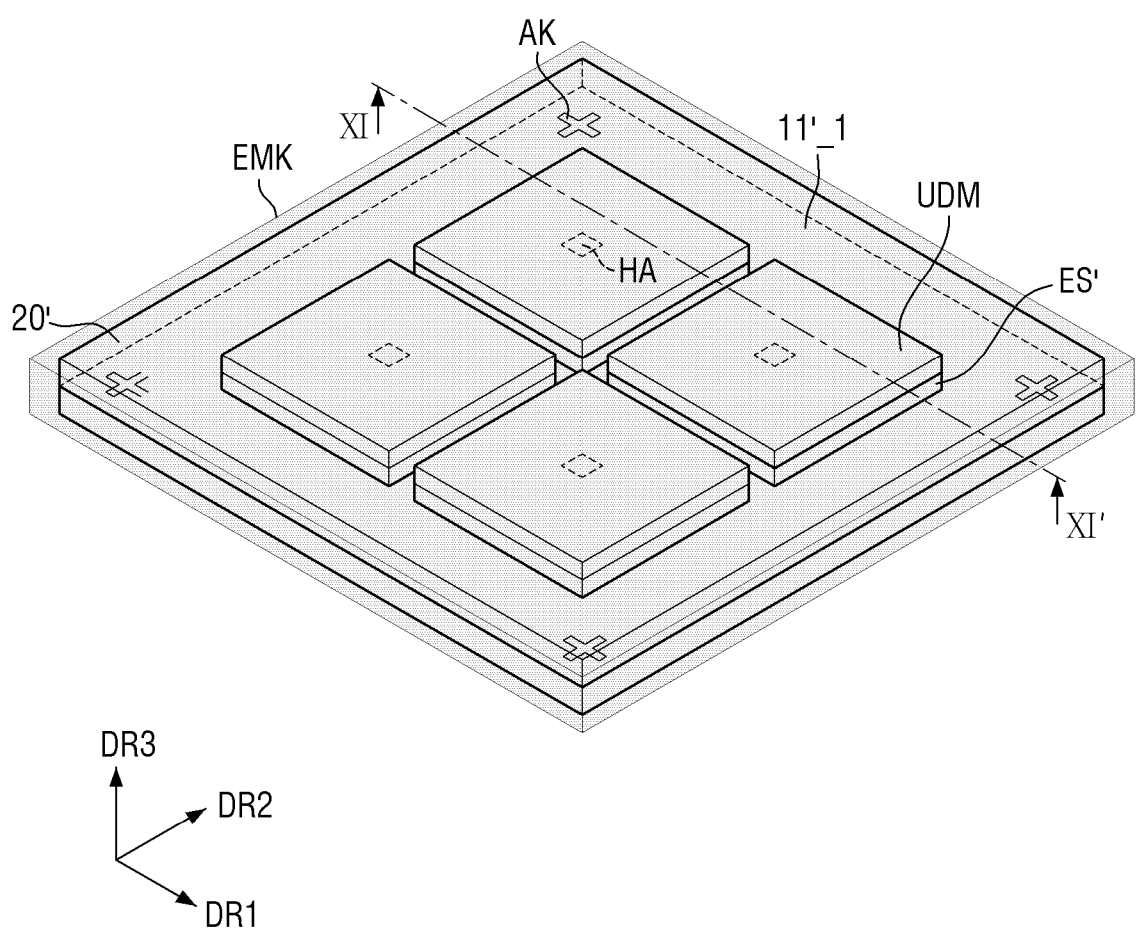
Figure 29:
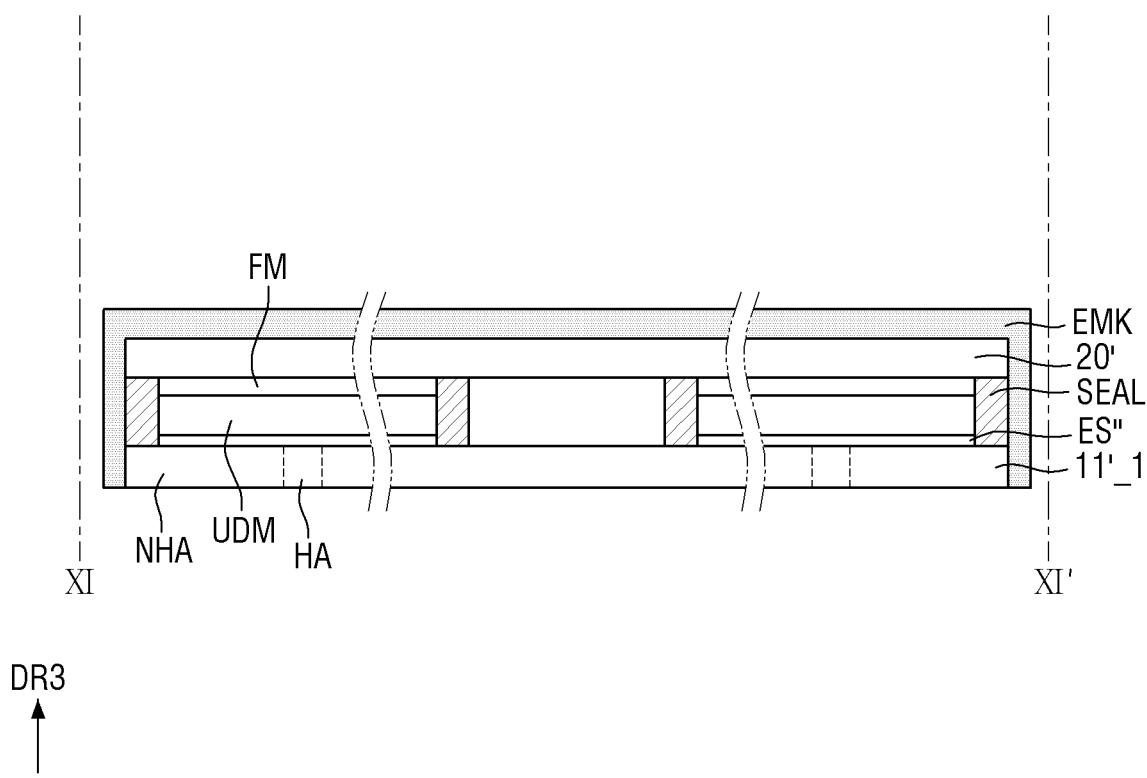
FIG. 29 is a schematic cross-sectional view taken along line XI-XI' of FIG. 28.
Figure 30:
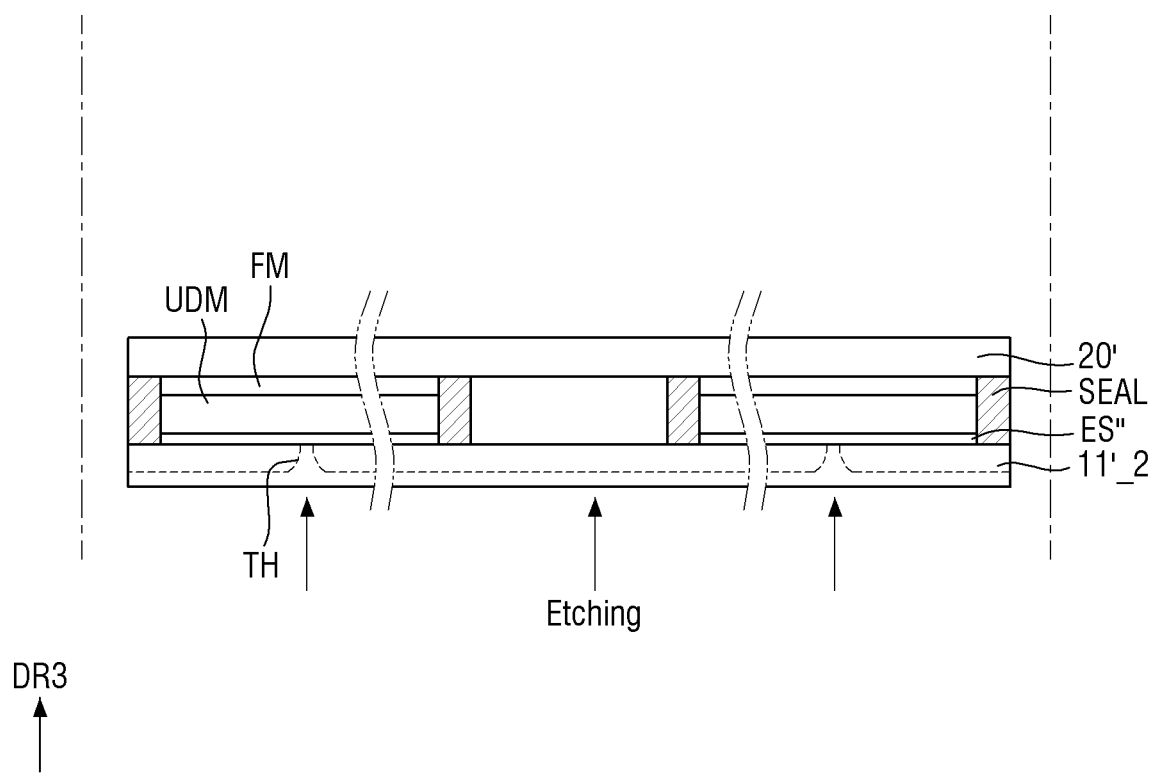
FIGS. 30 to 31 are schematic cross-sectional views illustrating processing steps of a method of fabricating a display device according to another embodiment of the disclosure.
Figure 31:
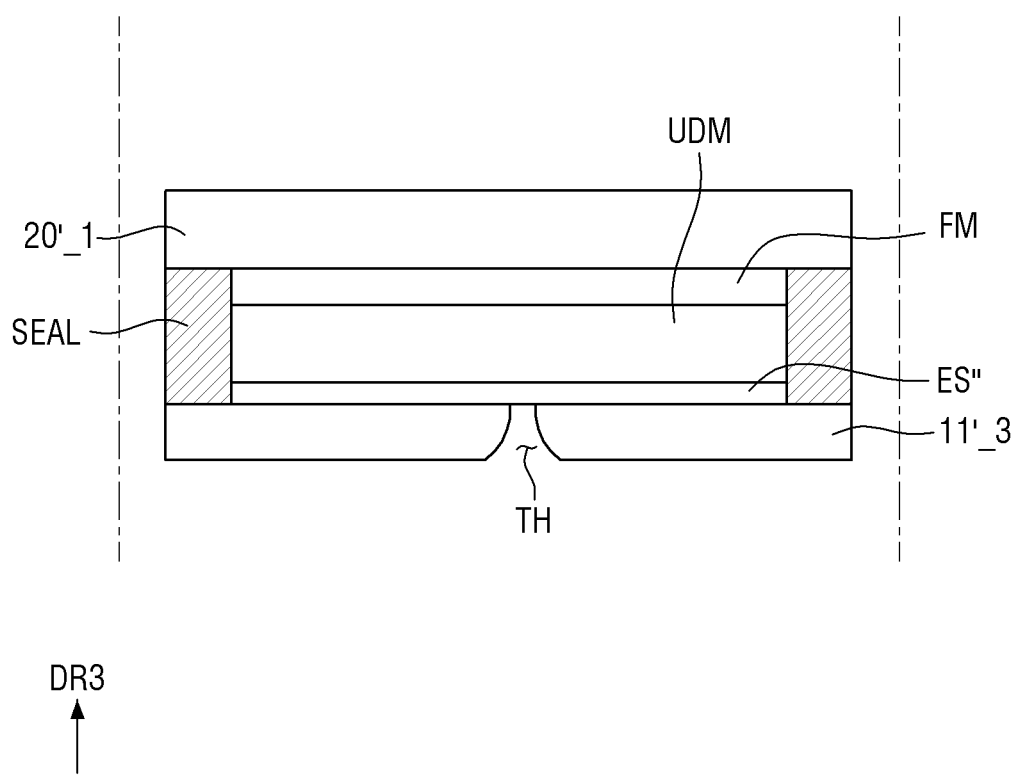

FIGS. 25 to 28 are schematic perspective views showing processing steps of a method of fabricating a display device according to another embodiment of the disclosure. FIG. 29 is a schematic cross-sectional view taken along line XI-XI' of FIG. 28. FIGS. 30 to 31 are schematic cross-sectional views illustrating processing steps of a method of fabricating a display device according to another embodiment of the disclosure.

Figure 13:
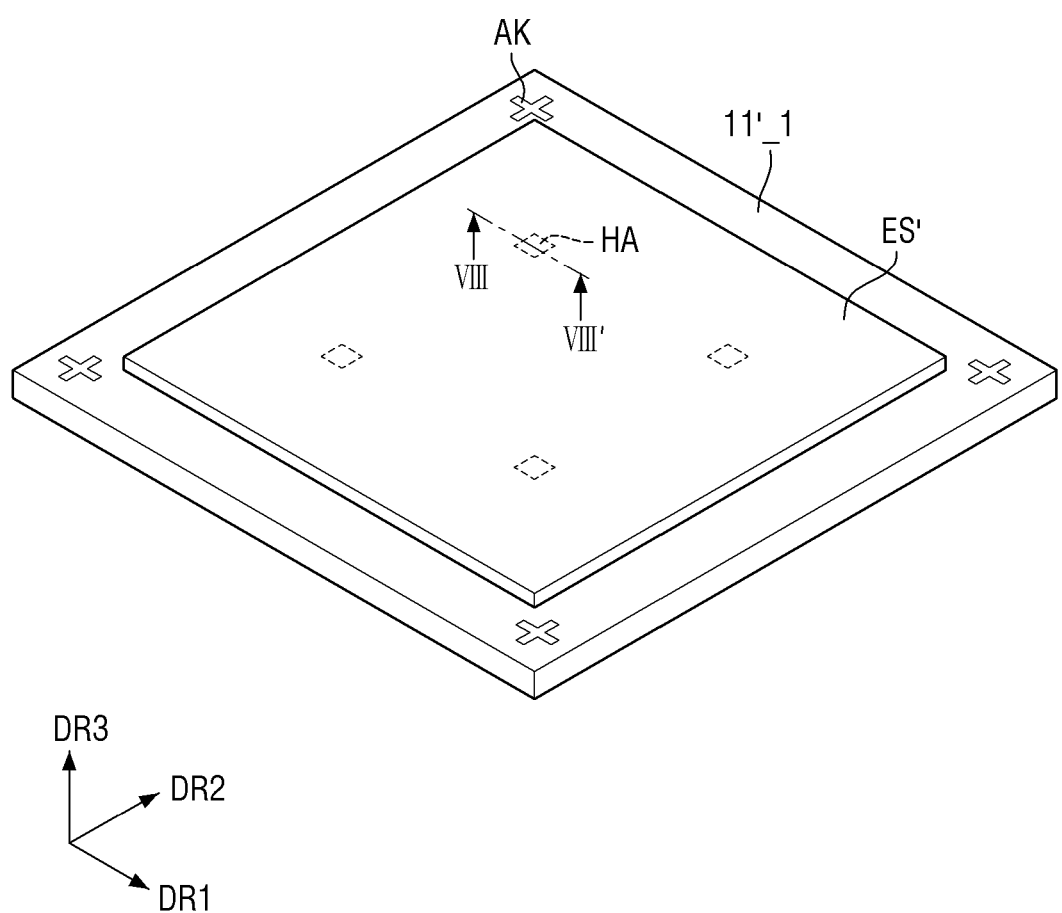
Figure 14:
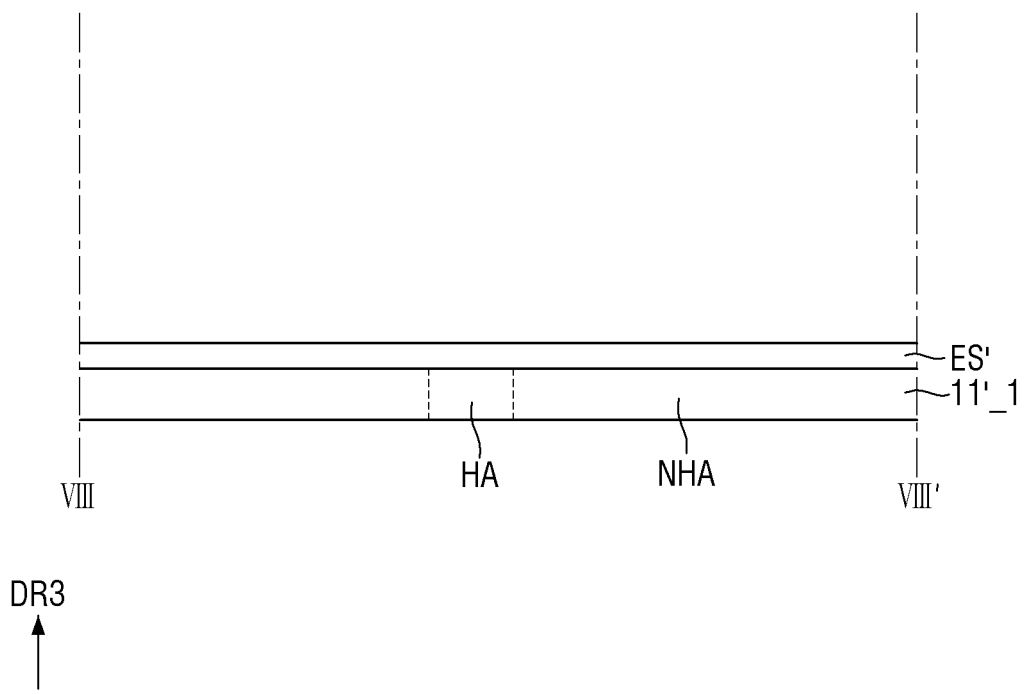
FIG. 14 is a schematic cross-sectional view taken along line VIII-VIII of FIG. 13.

The method according to the embodiment shown in FIGS. 25 to 31 may be different that of FIG. 13 in that multiple etching stoppers ES" may be formed on the first surface of the first mother substrate 11'_1 to cover modified areas HA, respectively, and that the etching stoppers ES" overlap the modified areas HA, respectively, and may be spaced apart from one another.

Figure 26:
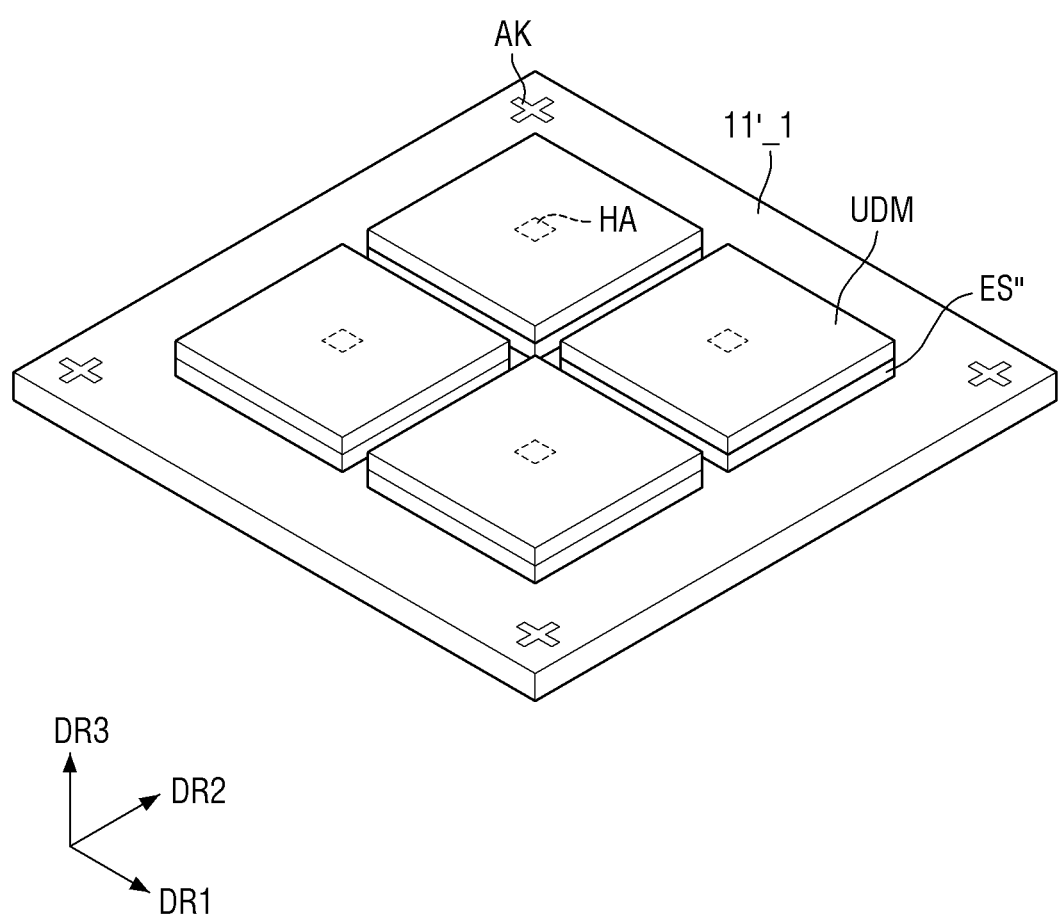

Referring to FIG. 26, each of the etching stoppers ES" may be disposed on the respective upper display modules UDM. The side surfaces of each of the etching stoppers ES" may be aligned with the side surfaces of the respective upper display modules UDM. It is, however, to be understood that the disclosure is not limited thereto. The side surfaces of the etching stoppers ES" may protrude from the side surfaces of the upper display modules UDM or the side surfaces of the upper display modules UDM may protrude from the side surfaces of the etching stoppers ES".

Referring to FIG. 27, an encapsulation element may be disposed over the upper display modules UDM. The encapsulation element may include, for example, a second mother substrate 20'. The second mother substrate 20' may be a mother substrate of the second display substrate 20 described above with reference to FIG. 2.

The etching stoppers ES" and the upper display modules UDM may be disposed between the second mother substrate 20' and the first mother substrate 11'_1. Furthermore, the second mother substrate 20' and the first mother substrate 11'_1 may be coupled with each other by a sealing member to be described later.

Subsequently, referring to FIGS. 28 and 29, the remaining areas or other elements shown in FIG. 27 except for the second surface of the first surface 11'_1 may be masked with a wet etching mask EMK. According to this embodiment of the disclosure, before the second mother substrate 20' is formed, the sealing member SEAL may be formed on each of the side surfaces of each of the upper display modules UDM, and the space surrounded by the sealing member SEAL may be filled with a filling material FM. The other elements may be identical to those described above; and, therefore, the redundant description will be omitted.

The sealing member SEAL may be disposed on each of the side surfaces (first side surface and second side surface) of each of the upper display modules UDM. The sealing member SEAL may be disposed directly between the second mother substrate 20' and the first mother substrate 11'_1. The sealing member SEAL may be in contact with the side surface of the etching stopper ES". It is, however, to be understood that the disclosure is not limited thereto.

Subsequently, referring to FIG. 30, a substrate through-hole TH may be formed. The substrate through-hole TH may be formed in substantially the same manner as the substrate through-hole TH described above with reference to FIG. 20; and, therefore, the redundant description will be omitted.

Subsequently, the wet etch mask EMK may be removed and the cell cutting may be carried out, as shown in FIG. 31. This process may be substantially identical to the removing the wet etching mask EMK and the cell cutting shown in FIGS. 20 and 21; and, therefore, the redundant description will be omitted.

Subsequently, a stopper through-hole THa that penetrates through the etching stopper may be formed in the etching stopper overlapping the substrate through-hole TH described above with reference to FIGS. 22, 23 and 24. A substrate connection electrode CNTb filling the substrate through-hole TH and the stopper through-hole THa may be formed (step S90), and a first pad PAD1 may be formed that overlaps the substrate connection electrode CNTb and may be disposed on the second surface of the first substrate (step S100). The processes may be identical to those described above; and, therefore, the redundant description will be omitted.

Hereinafter, a method of fabricating a display device according to another embodiment of the disclosure will be described.

Figure 32:
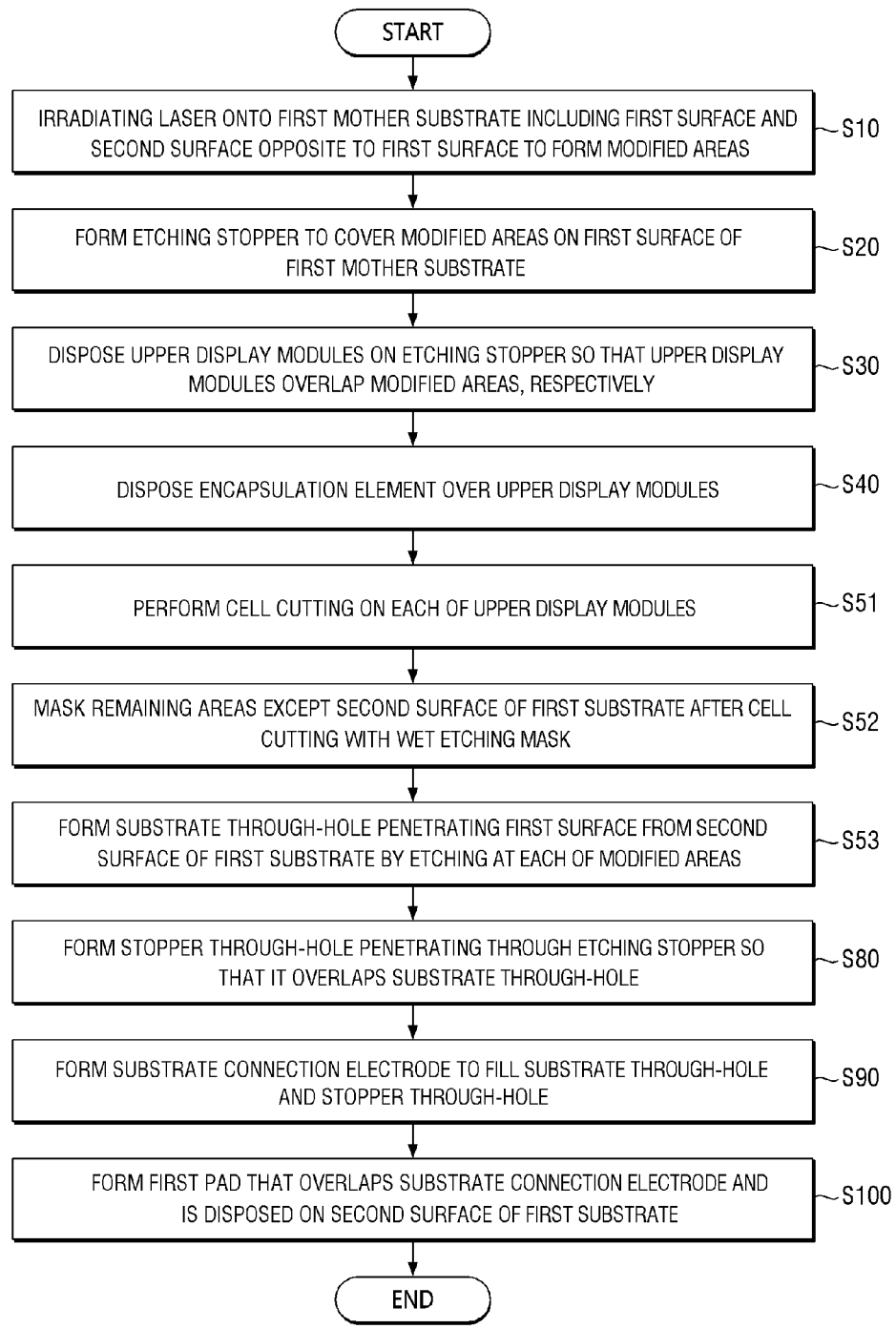
FIG. 32 is a flowchart illustrating a method for fabricating a display device according to yet another embodiment of the disclosure.
Figure 33:
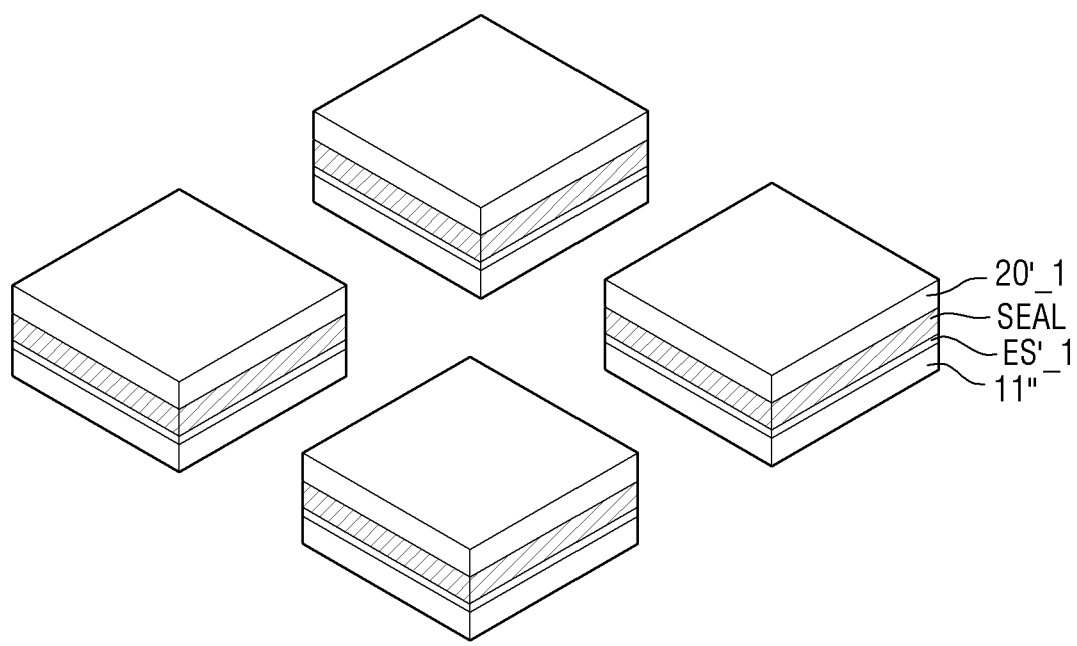
FIGS. 33 to 34 are schematic perspective views illustrating processing steps of a method of fabricating a display device according to yet another embodiment of the disclosure.
Figure 34:
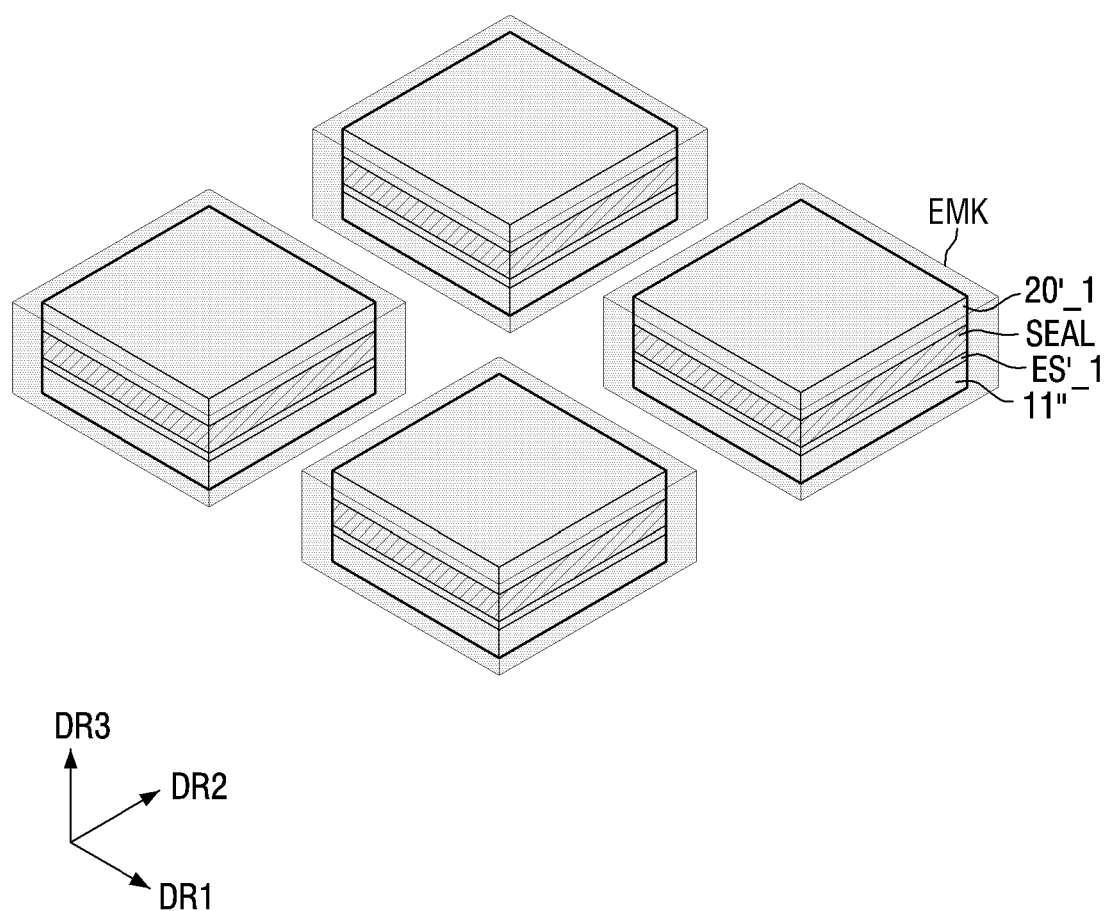

FIG. 32 is a flowchart illustrating a method for fabricating a display device according to yet another embodiment of the disclosure. FIGS. 33 to 34 are schematic perspective views illustrating processing steps of a method of fabricating a display device according to yet another embodiment of the disclosure. FIGS. 35 to 40 are schematic cross-sectional views illustrating processing steps of a method of fabricating a display device according to yet another embodiment of the disclosure.

The processes of forming the first mother substrate 11'_1 (S10), forming the etching stopper ES' (S20), disposing the upper display modules UDM (S30) and disposing the encapsulation element (S40) of the method of FIGS. 32 to 40 may be substantially identical to those of the method according to the above embodiment.

According to this embodiment of the disclosure, referring to FIG. 33, after the encapsulation element is disposed (S40), cell cutting (S51) may be performed for each upper display module.

Figure 35:
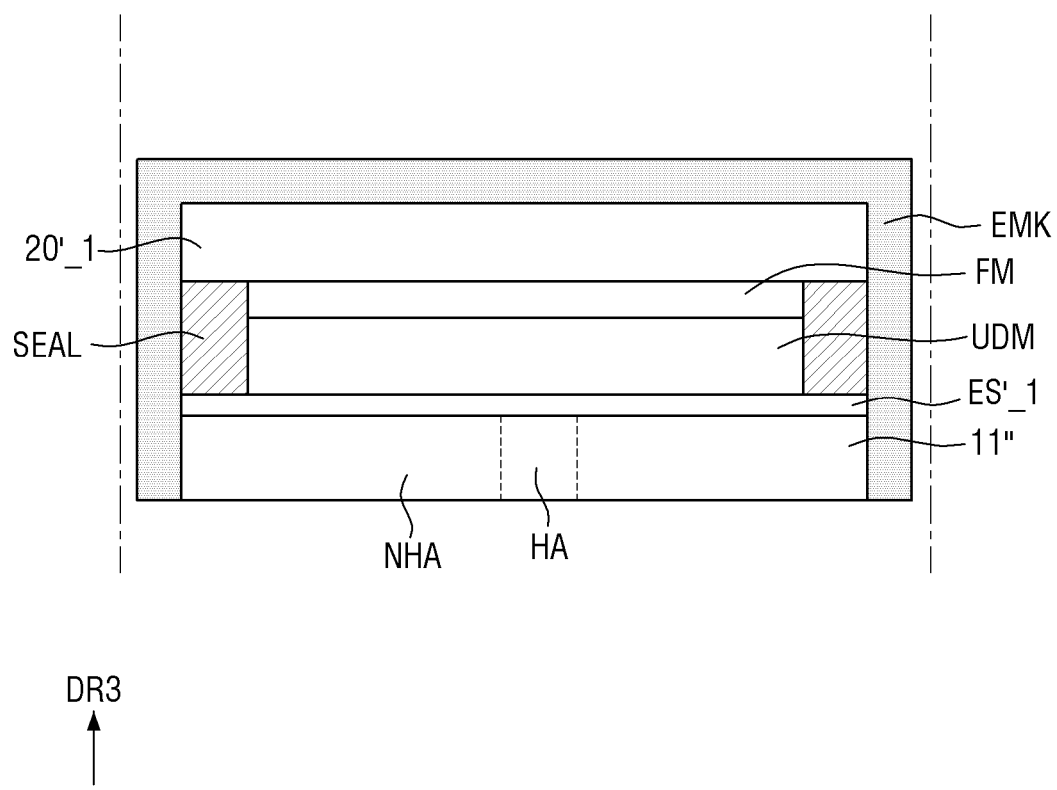
FIGS. 35 to 40 are schematic cross-sectional views illustrating processing steps of a method of fabricating a display device according to yet another embodiment of the disclosure.

Subsequently, referring to FIGS. 34 and 35, the remaining areas or other elements except for the second surface of the first surface 11" after the cell cutting may be masked with a wet etching mask EMK.

Figure 36:
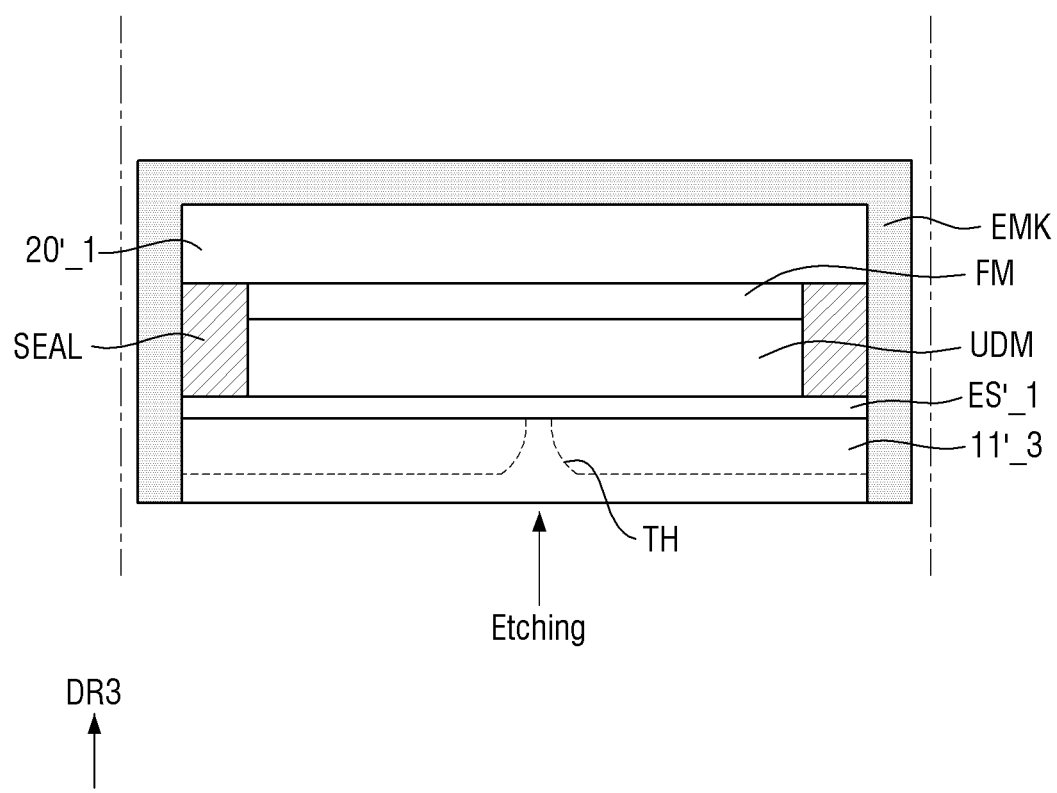

Subsequently, referring to FIG. 36, a substrate through-hole TH penetrating through the first surface from the second surface of the first substrate 11'_3 may be formed by etching at each of the modified areas HA (step S53).

Figure 37:
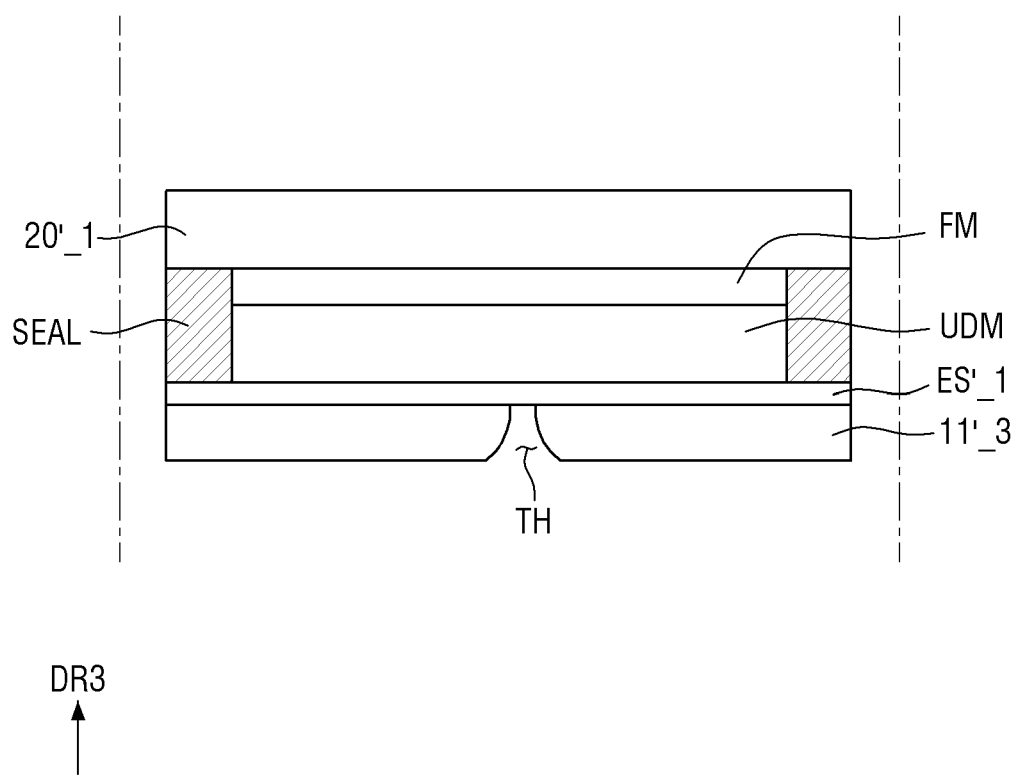
Figure 38:
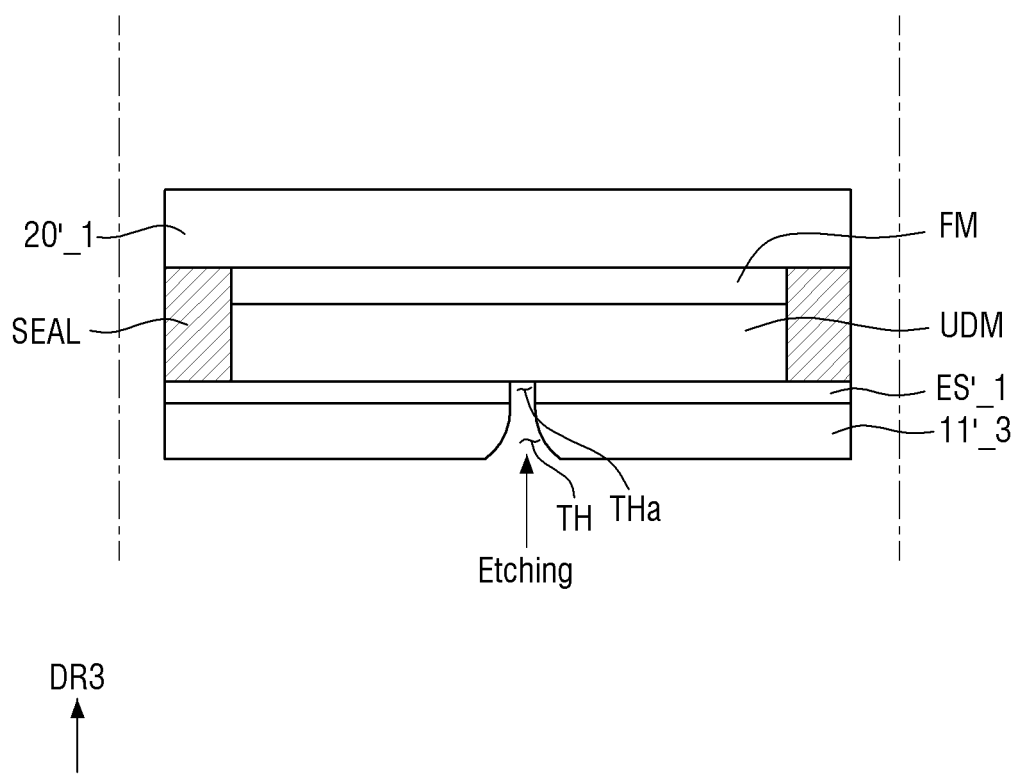

Subsequently, referring to FIG. 37, the wet etching mask EMK may be removed, and then referring to FIG. 38, a stopper through-hole THa may be formed (step S80).

Figure 39:
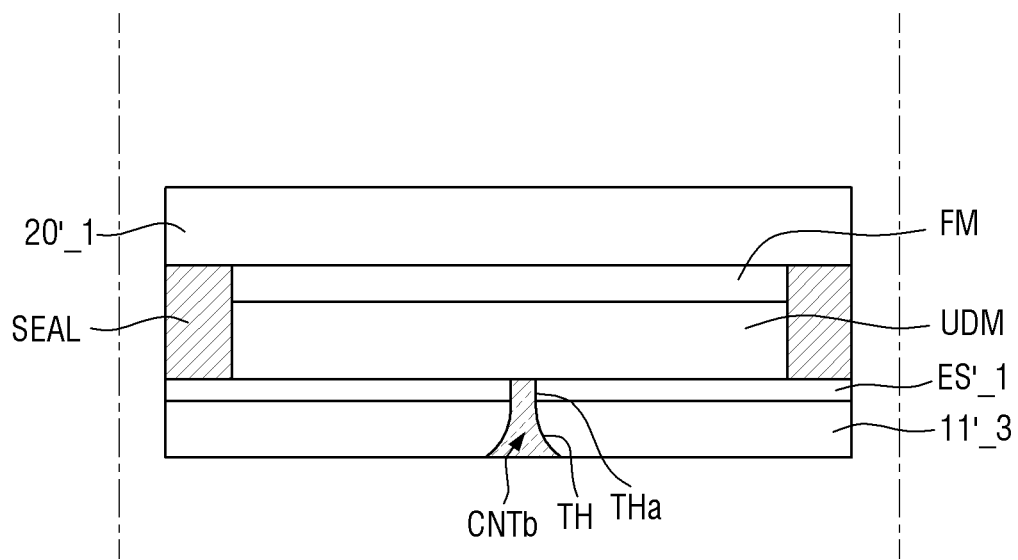

Subsequently, referring to FIG. 39, the substrate through-hole TH and the stopper through-hole THa may be filled with a substrate connection electrode CNTb (step S90).

Figure 40:
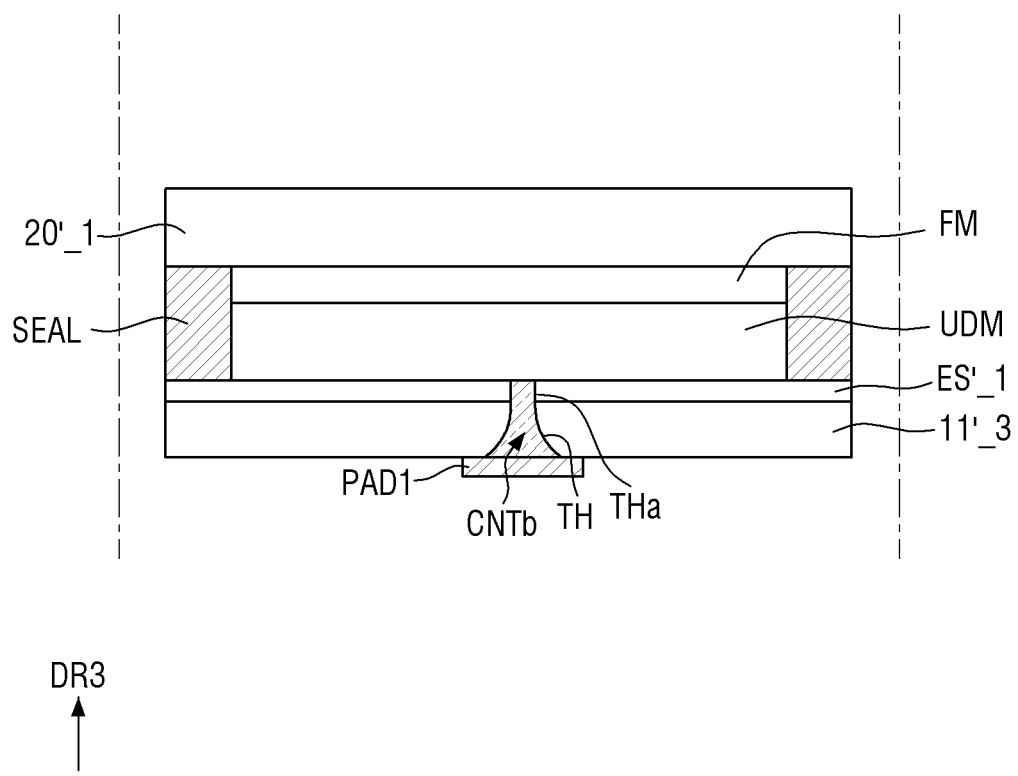

Subsequently, referring to FIG. 40, a first pad PAD1 may be formed on the second surface of the first substrate 11'_3 to overlap the substrate connection electrode CNTb.

The processes of cell cutting (S51), masking (S52), forming the substrate through-hole TH (S53), forming the stopper through-hole THa (S80), forming the substrate connection electrode CNTb (S90) and forming the first pad PAD1 (S100) may be identical to those of the method according to the above embodiment; and, therefore, the redundant description will be omitted.

Figure 41:
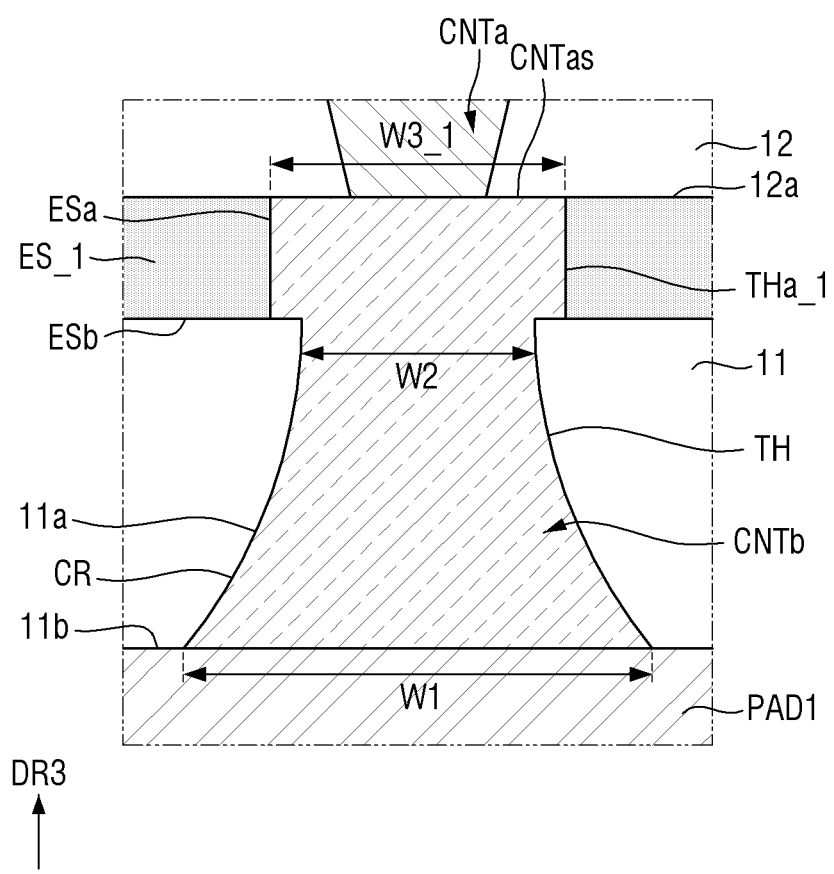
FIG. 41 is a schematic cross-sectional view of a display device according to yet another embodiment of the disclosure.

FIG. 41 is a schematic cross-sectional view of a display device according to yet another embodiment of the disclosure.

Referring to FIG. 41, in a stopper through-hole THa_1, the width of the extension line of a second surface ESb of an etching stopper ES_1 may be equal to the width of the extension line of a first surface of an etching stopper ES_1. An upper width of the stopper through-hole THa_1 may be equal to a lower width W3_1 of the stopper through-hole THa_1.

The width W3_1 of the extension line of the second surface ESb of the etching stopper ES_1 may be greater than the width W2 of the substrate through-hole TH. For example, the stopper through-hole THa_1 may overlap the substrate through-hole TH in the thickness direction, and may partially overlap the first surface of the first substrate 11.

If the stopper through-hole THa_1 is overetched during the process of forming it, the structure shown in FIG. 41 may be formed. The first surface of the first substrate 11 may be partially exposed by the etching stopper ES_1.

Figure 42:
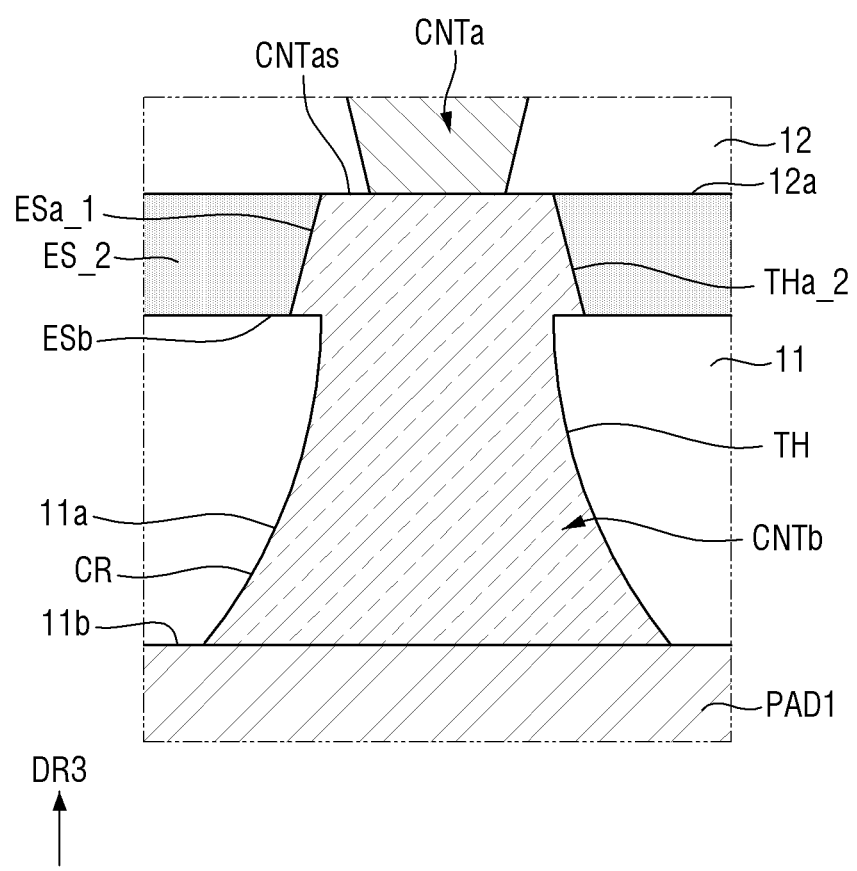
FIG. 42 is a schematic cross-sectional view of a display device according to yet another embodiment of the disclosure.

FIG. 42 is a schematic cross-sectional view of a display device according to yet another embodiment of the disclosure.

A stopper through-hole THa_2 of an etching stopper ES_2 according to the embodiment of FIG. 42 may be different from the etching stopper ES and the stopper through-hole THa of FIG. 8 in that the width of the stopper through-hole THa_2 from the extension line of the second surface ESb of the etching stopper ES_2 to the extension line of the first surface gradually decreases.

According to the embodiment of the disclosure, the cross-sectional shape of the inclination of a side surface ESa_1 of the etching stopper ES_2 in contact with the stopper through-hole THa_2 may have a straight shape inclined with respect to the third direction DR3. For example, the inclination angle of the side surface ESa_1 of the etching stopper ES_2 formed with the second surface ESb of the etching stopper ES_2 may be constant.

Figure 43:
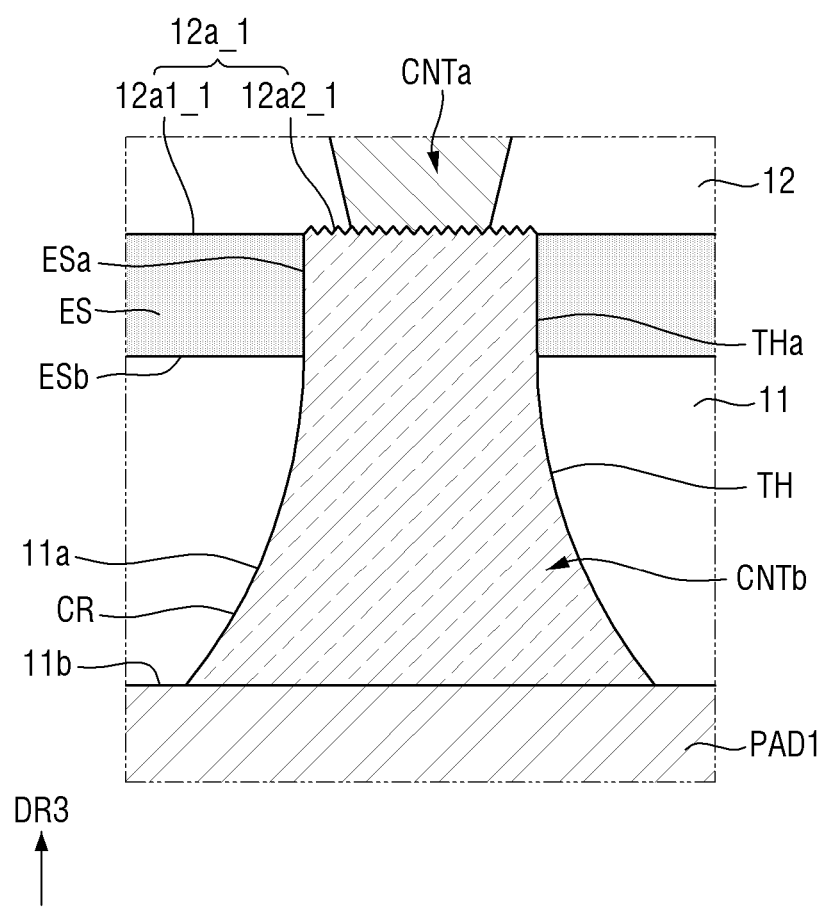
FIG. 43 is a schematic cross-sectional view of a display device according to yet another embodiment of the disclosure.

FIG. 43 is a schematic cross-sectional view of a display device according to yet another embodiment of the disclosure.

A buffer layer according to the embodiment of FIG. 43 is different from the buffer layer 12 according to the embodiment of FIG. 8 in that a first surface 12a_1 of the buffer layer 12 includes a first portion 12a1_1 and a second portion 12a2_1.

More specifically, the surface roughness of the first portion 12a1_1 may be smaller than the surface roughness of the second portion 12a2_1. The second portion 12a2_1 may be in contact with the substrate connection electrode CNTb, and the first portion 12a1_1 may not be in contact with the substrate connection electrode CNTb. The second portion 12a2_1 may be formed by partially etching a surface of the buffer layer 12 by the dry etching solution during the etching process.

The other elements may be identical to those described above with reference to FIG. 8; and, therefore, the redundant description will be omitted.

Figure 44:
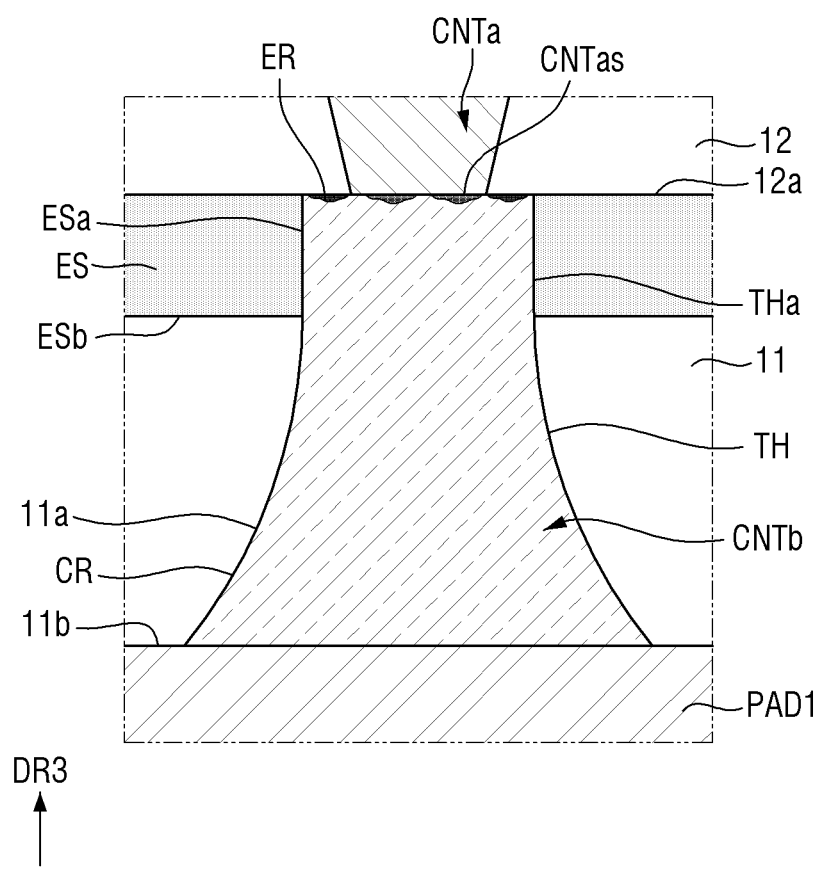
FIG. 44 is a schematic cross-sectional view of a display device according to yet another embodiment of the disclosure.

FIG. 44 is a schematic cross-sectional view of a display device according to yet another embodiment of the disclosure.

The embodiment of FIG. 44 is different from the embodiment of FIG. 8 in that an etching residue ER may remain on a first surface CNTas of a data connection electrode CNTa in a stopper through-hole THa, and on a first surface 12a of a buffer layer 12.

More specifically, the etching residue ER may remain on the first surface CNTas of the data connection electrode CNTa in the stopper through-hole THa, and on the first surface 12a of the buffer layer 12.

According to the embodiment of the disclosure, after the stopper through-hole THa is formed, the residue of the etching stopper ES may remain on the first surface CNTas of the data connection electrode CNTa and on the first surface 12a of the buffer layer 12, and the residue may not be completely removed. The etching residue ER may include the same material as the etching stopper ES. The etching residue ER may be in contact with the substrate connection electrode CNTb in the stopper through-hole THa. It is, however, to be noted that the structure formed by the materials of the etching residue ER may be different from the structure formed by the materials of the etching stopper ES. For example, during the process of irradiating a laser, the materials in the etching residue ER may be somewhat changed, e.g., carbonized. It is, however, to be understood that the disclosure is not limited thereto. The structure formed by the materials of the etching residue ER may be identical to the structure formed by the materials of the etching stopper ES.

Figure 45:
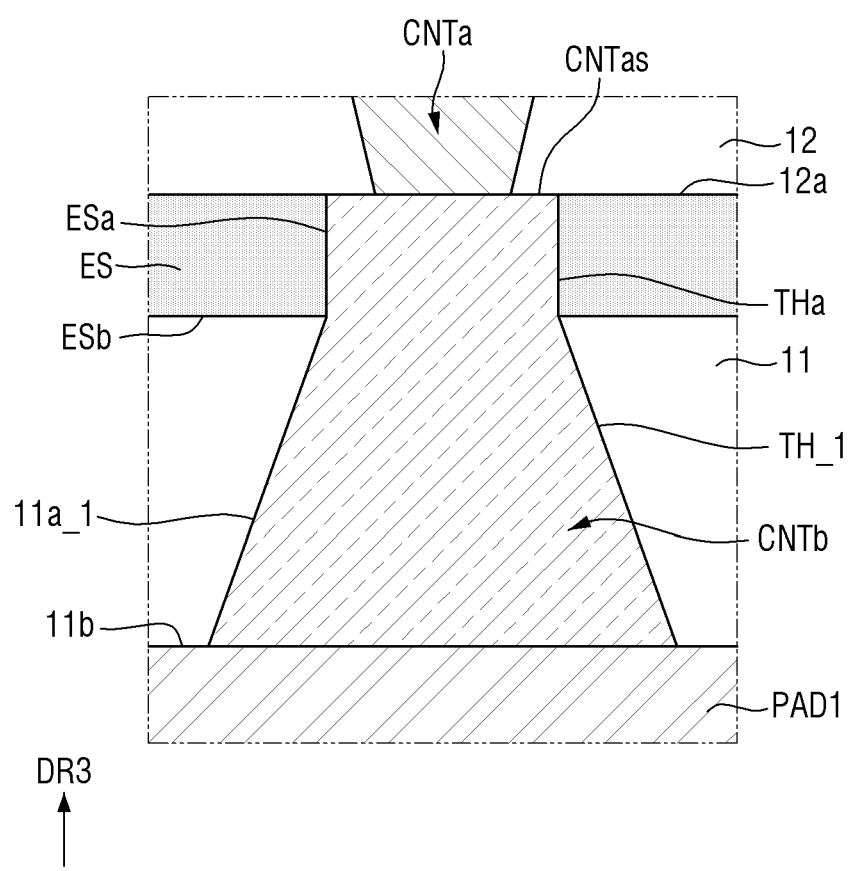
FIG. 45 is a schematic cross-sectional view of a display device according to yet another embodiment of the disclosure.

The other elements may be identical to those described above; and, therefore, the redundant description will be omitted FIG. 45 is a schematic cross-sectional view of a display device according to yet another embodiment of the disclosure.

A first substrate 11 and a substrate through-hole TH_1 according to the embodiment of FIG. 45 may be different from the first substrate 11 and the substrate through-hole TH according to the embodiment of FIG. 8 in that the first substrate 11 includes a substrate through-hole TH_1 and a cross-sectional shape of the inclination of the side surfaces 11a_1 of the first substrate 11 in contact with the substrate through-hole TH_1 has a straight line shape.

For example, the inclination angle of the side surface 11a_1 of the first substrate 11 may be constant.

According to the embodiment of the disclosure, the substrate through-hole TH_1 may be formed by adjusting an etching solution or an etching time.

The substrate through-hole TH_1 according to the embodiment may be formed by dry etching.

Figure 46:
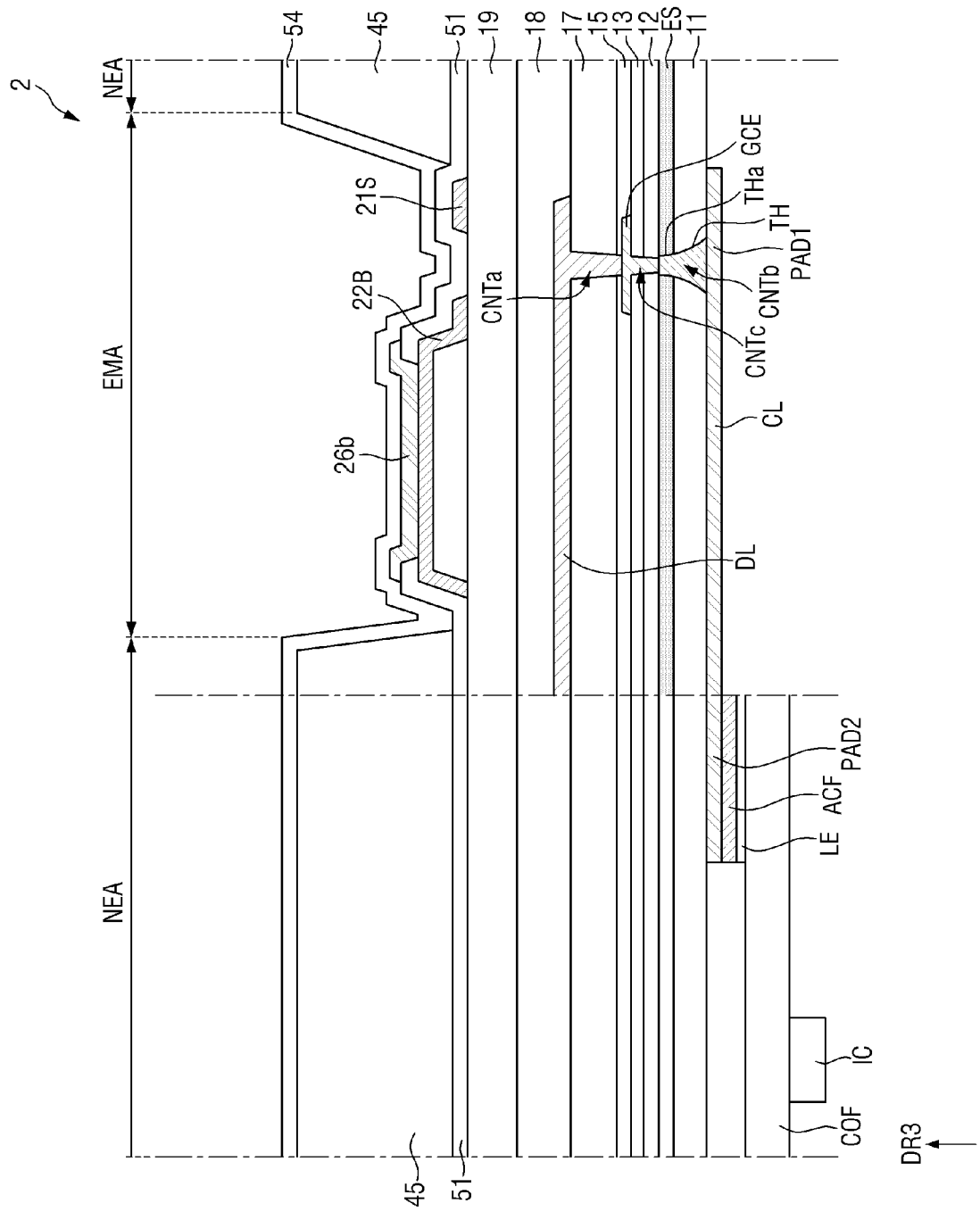
FIG. 46 is a schematic cross-sectional view of a display device according to yet another embodiment of the disclosure.

FIG. 46 is a schematic cross-sectional view of a display device according to yet another embodiment of the disclosure.

A display device according to the embodiment of FIG. 46 is different from the display device 1 of FIG. 8 in that it further includes a gate connection electrode GCE electrically connected to a data line DL, and another gate connection electrode CNTc connecting the gate connection electrode GCE with a substrate connection electrode CNTb.

The gate connection electrode GCE may be disposed on the first gate conductive layer described above with reference to FIG. 7. Another gate connection electrode CNTc may penetrate through a first gate insulating layer 13 and a buffer layer 12 in the thickness direction.

In some embodiments, the gate connection electrode GCE may be disposed on the second gate conductive layer. Another gate connection electrode CNTc may penetrate through a first protective layer 15, a first gate insulating layer 13 and a buffer layer 12 in the thickness direction.

According to this embodiment, the gate connection electrode GCE and another gate connection electrode CNTc may be further formed, so that the overall resistance of the current path from the data line DL to the first pad PAD1 may be lowered.

Figure 47:
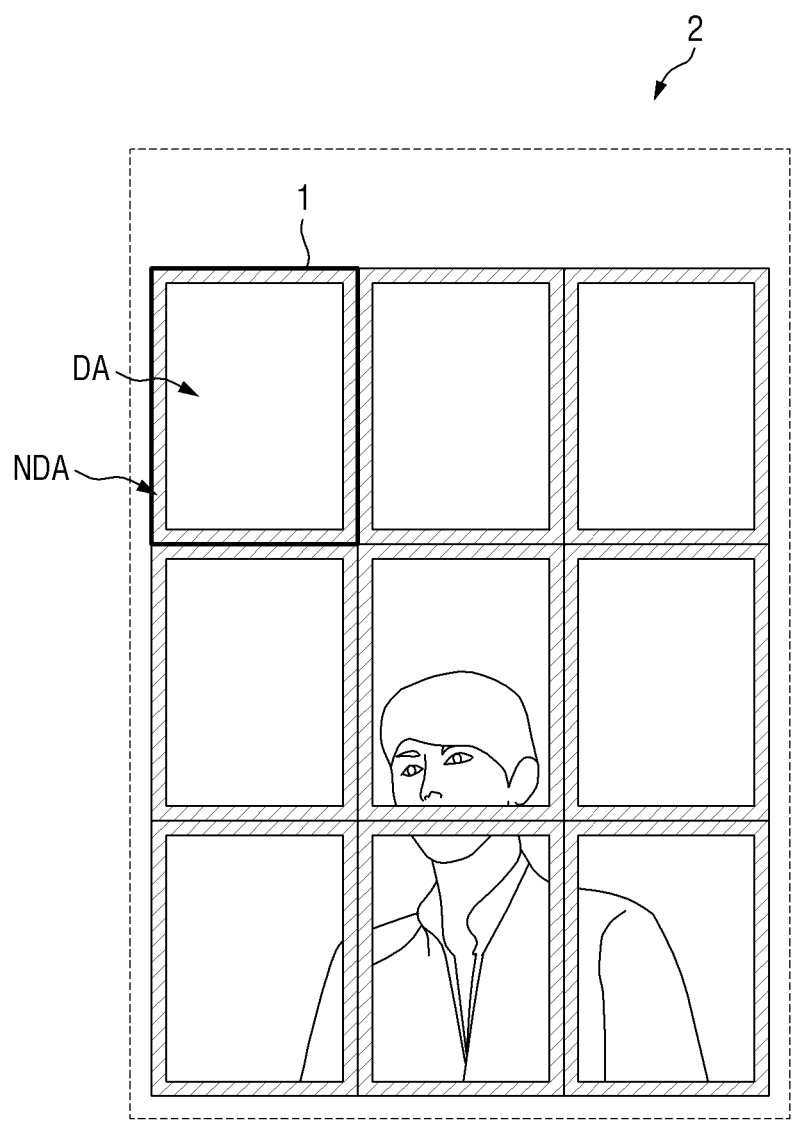
FIG. 47 is a schematic plan view of a display device according to yet another embodiment of the disclosure.

FIG. 47 is a schematic plan view of a display device according to yet another embodiment of the disclosure.

A display apparatus 2 according to the embodiment of FIG. 47 is a tiled display apparatus 2 including display devices 1 according to the above embodiment of the disclosure.

Since the display devices 1 included in the display apparatus 2 have been described above; and, therefore, the redundant description will be omitted.

The longer sides or the shorter sides of the display devices 1 may be extended to one another. Some of the display devices 1 may form a side of the display apparatus 2, some of the display devices 1 may be located at a corner of the display apparatus 2 to form two adjacent sides, and some of the display devices 1 may be located on the inner side of the display apparatus and surrounded by other display devices 1. The display devices 1 may have different bezel shapes depending on the locations, or may have the same bezel shape.

Figure 48:
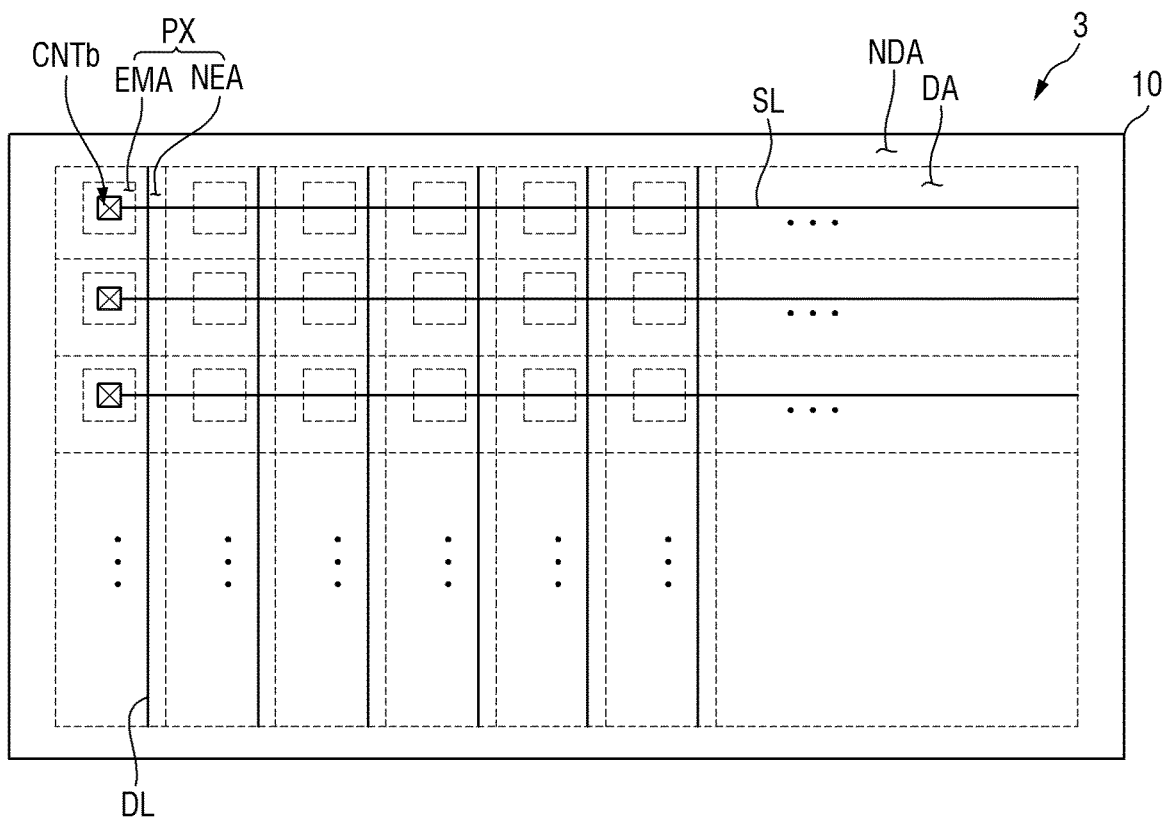
FIG. 48 is a schematic plan view of a display device according to yet another embodiment of the disclosure when viewed from the top.
Figure 49:
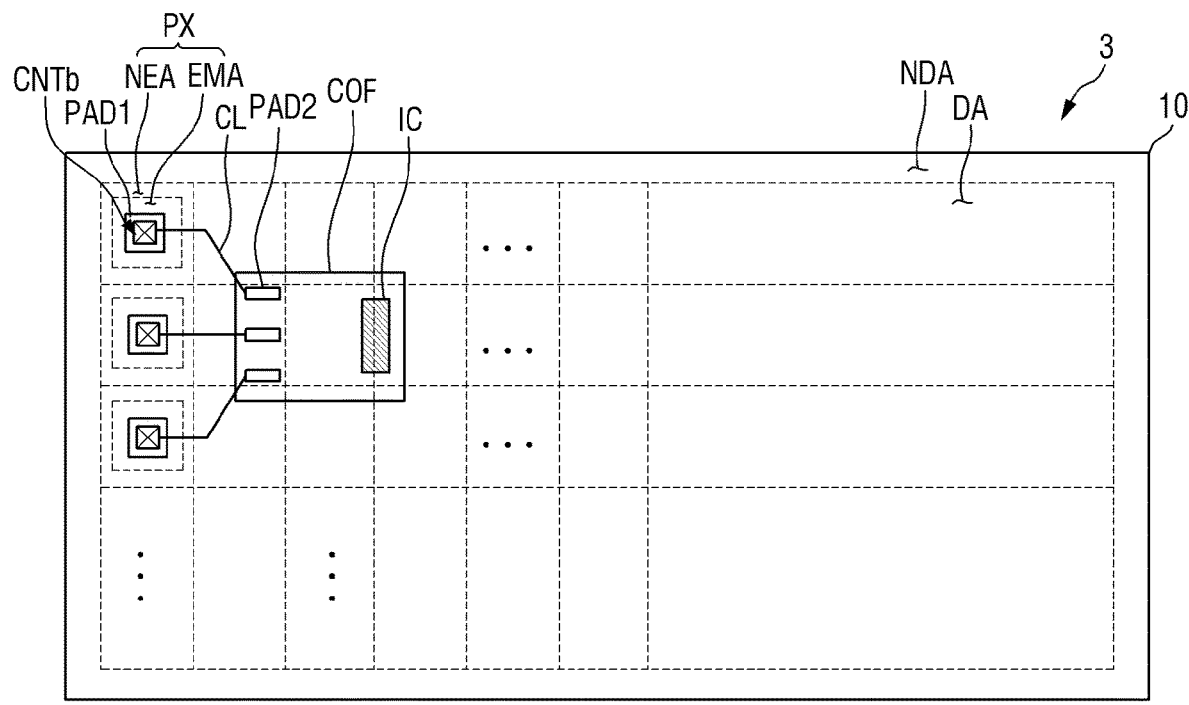
FIG. 49 is a schematic plan view of a display device according to yet another embodiment of the disclosure when viewed from the bottom.

FIG. 48 is a schematic plan view of a display device according to yet another embodiment of the disclosure when viewed from the top. FIG. 49 is a schematic plan view of a display device according to yet another embodiment of the disclosure when viewed from the bottom.

A display device 3 according to the embodiment of FIGS. 48 and 49 may be different from the display device 1 according to the above embodiment in that a substrate connection electrode CNTb may be electrically connected to a scan line SL. According to the embodiment of the disclosure, a scan driver SP described above with reference to FIG. 3 may be eliminated. According to this embodiment, substrate connection electrodes CNTb may be arranged along the first direction DR1.

A connection line CL may be disposed on the second surface of the first substrate. One end of the connection line CL may form the first pad PAD1, and the other end of the connection line CL may form the second pad PAD2. Although one end of the connection line CL may form the first pad PAD1, and the other end of the connection line CL may form the second pad PAD2 in FIGS. 48 and 49, it can be said that the connection line CL may be electrically connected to each of the first pad PAD1 and the second pad PAD2. The second pads PAD2 may be associated with the connection lines CL, respectively. There may be multiple second pads PAD2 disposed. The second pads PAD2 may be arranged along the second direction DR2. Some of the connection lines CL may be electrically connected to the first pads PAD1 and may include at least one bent portion extended downward in the first direction DR1.

For example, each of the connection lines CL may include an extension extended from one end of the connection line CL in the first direction DR1, and a fan-out wiring disposed between the bent portion and the second pad PAD2. Adjacent connection lines CL may become closer to each other in the fan-out wiring. One end of the fan-out wiring may be electrically connected to the extension of the connection line CL, and the other end of the fan-out wiring may be electrically connected to the second pad PAD2.

A chip-on-film COF may be disposed on adjacent second pads PAD2. The chip-on-film COF may be attached on adjacent second pads PAD2. The chip-on-films COF may be disposed on the second surface of the first substrate 11 of the display device 3 and may be disposed in the display area DA, so that it may be possible to avoid the dead space which may occur as the chip-on-films COF are disposed.

Although embodiments of the invention have been disclosed for illustrative purposes, those skilled in the art will appreciate that various modifications, additions and substitutions are possible, without departing from the scope and spirit of the invention as disclosed in the accompanying claims, including any equivalents.

What is claimed is:

1. A display device comprising:
   a first substrate having a display area and a non-display area adjacent to the display area, the first substrate comprising a substrate through-hole penetrating the first substrate in a thickness direction;
   an etching stopper disposed on a first surface of the first substrate, the etching stopper comprising a stopper through-hole that overlaps the substrate through-hole and penetrates the etching stopper in the thickness direction;
   a data line disposed on the etching stopper;
   a substrate connection electrode that fills the substrate through-hole and the stopper through-hole, the substrate connection electrode being disposed in the display area and electrically connected to the data line; and
   a first pad disposed on a second surface of the first substrate opposite to the first surface and overlapping the substrate connection electrode, wherein
   the first pad is electrically connected to the substrate connection electrode,
   the etching stopper comprises a first surface that is in contact with the first surface of the first substrate, and a second surface that is opposite to the first surface of the etching stopper, and the substrate connection electrode comprises:
  a first surace that is coplanar with the second surface of the etching stopper;
  a second surface that is coplanar with the second surface of the first substrate, the second surface of the substrate connection electrode having a first width;
  a side surface that is curved and that forms the substrate through-hole between the first surface of the first substrate and the second surface of the first substrate;
  a second width between the first surface of the first substrate and the second surface of the first substrate, the second width of the substrate connection electrode less than the first width of the substrate connection electrode; and
  a third width above the first surface of the first substrate, the third width of the substrate connection electrode greater than the second width of the substrate connection electrode.

2. The display device of claim 1, wherein
the first surface of the first substrate is in contact with the etching stopper, and
the substrate through-hole is surrounded by an extension line of the second surface of the first substrate, an extension line of the first surface of the first substrate, and side surfaces of the first substrate.

3. The display device of claim 2, wherein
the stopper through-hole is surrounded by an extension line of the first surface of the etching stopper, an extension line of the second surface of the etching stopper, and side surfaces of the etching stopper, and
an average slope of the side surfaces of the etching stopper is greater than an average slope of the side surfaces of the first substrate.

4. The display device of claim 3, wherein the stopper through-hole overlaps the first surface of the first substrate in the thickness direction.

5. The display device of claim 3, further comprising:
a buffer layer disposed on the second surface of the etching stopper and disposed between the etching stopper and the data line,
wherein a roughness of a surface of the buffer layer that contacts the substrate connection electrode is greater than a roughness of a surface of the buffer layer that does not contact the substrate connection electrode.

6. The display device of claim 3, further comprising:
a buffer layer disposed on the second surface of the etching stopper and disposed between the etching stopper and the data line; and
an etching residue disposed on a surface of the buffer layer that contacts the substrate connection electrode,
wherein the etching residue and the etching stopper comprise a same material.

7. The display device of claim 3, further comprising:
a buffer layer disposed between the etching stopper and the data line; and
a first gate insulating layer disposed between the buffer layer and the data line,
wherein the data line is electrically connected to the substrate connection electrode through a data connection electrode penetrating the first gate insulating layer and the buffer layer in the thickness direction.

8. The display device of claim 7, further comprising:
a connection line disposed on the second surface of the first substrate, wherein the connection line is electrically connected to the first pad, and comprises a chip-on-film disposed on the second surface of the first substrate and mounted with a driving chip; and
a second pad disposed on the second surface of the first substrate, wherein
the second pad is electrically connected to the connection line, and
the chip-on-film is electrically connected to the second pad.

9. The display device of claim 3, wherein
the display area comprises pixels, each of the pixels comprising an emission area and a non-emission area disposed adjacent to the emission area,
an outer bank is disposed on the data line and disposed in the non-emission area,
a light-emitting element is disposed in the emission area,
the emission area is adjacent to the outer bank, and
the substrate connection electrode overlaps the emission area.

10. The display device of claim 3, further comprising:
a buffer layer disposed between the etching stopper and the data line;
a first gate insulating layer disposed between the buffer layer and the data line;
a gate connection electrode disposed between the first gate insulating layer and the data line; and
a first protective layer disposed between the gate connection electrode and the data line, wherein
the data line is electrically connected to the gate connection electrode through a data connection electrode penetrating the first protective layer, and
the gate connection electrode is electrically connected to the substrate connection electrode through another gate connection electrode penetrating the first gate insulating layer and the buffer layer.

11. The display device of claim 1, wherein:
the substrate connection electrode further comprises a fourth width at the first surface of the substrate connection electrode, and
the fourth width of the substrate connection electrode is equal to the third width of the substrate connection electrode.

12. The display device of claim 1, wherein:
the substrate connection electrode further comprises:
  a fourth width at the first surface of the substrate connection electrode, and
  an inclined surface between the first surface of the etching stopper and the second surface of the etching stopper, and
the fourth width of the substrate connection electrode is less than the third width of the substrate connection electrode based on the inclined surface.

13. The display device of claim 1, wherein the etching stopper includes an organic material.

14. The display device of claim 1, wherein the etching stopper includes a material that limits etching by any one of potassium hydroxide, sodium hydroxide, and hydrofluoric acid.

* * * * *